(12) United States Patent
Kamikawa et al.

(10) Patent No.: US 12,087,577 B2
(45) Date of Patent: Sep. 10, 2024

(54) METHOD FOR DIVIDING A BAR OF ONE OR MORE DEVICES

(71) Applicant: The Regents of the University of California, Oakland, CA (US)

(72) Inventors: Takeshi Kamikawa, Santa Barbara, CA (US); Srinivas Gandrothula, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 473 days.

(21) Appl. No.: 17/048,383

(22) PCT Filed: May 17, 2019

(86) PCT No.: PCT/US2019/032936
§ 371 (c)(1),
(2) Date: Oct. 16, 2020

(87) PCT Pub. No.: WO2019/222669
PCT Pub. Date: Nov. 21, 2019

(65) Prior Publication Data
US 2021/0090885 A1    Mar. 25, 2021

Related U.S. Application Data

(60) Provisional application No. 62/672,913, filed on May 17, 2018.

(51) Int. Cl.
*H01L 21/02* (2006.01)

(52) U.S. Cl.
CPC .... *H01L 21/02389* (2013.01); *H01L 21/0242* (2013.01); *H01L 21/02436* (2013.01); *H01L 21/02573* (2013.01)

(58) Field of Classification Search
None
See application file for complete search history.

(56) References Cited

U.S. PATENT DOCUMENTS

| | | | |
|---|---|---|---|
| 6,177,292 B1 | 1/2001 | Hong et al. | |
| 9,236,710 B2 | 1/2016 | Tanisaka et al. | |
| 2006/0139932 A1* | 6/2006 | Park | F21V 29/89 362/294 |

(Continued)

FOREIGN PATENT DOCUMENTS

| | | |
|---|---|---|
| CN | 103959579 A | 7/2014 |
| CN | 110603651 B | 7/2023 |

(Continued)

OTHER PUBLICATIONS

PCT International Search Report & Written Opinion dated Aug. 2, 2019 for PCT Application No. PCT/US19/32936.

(Continued)

*Primary Examiner* — Asok K Sarkar
(74) *Attorney, Agent, or Firm* — GATES & COOPER LLP

(57) ABSTRACT

A method for dividing a bar of one or more devices. The bar is comprised of island-like III-nitride-based semiconductor layers grown on a substrate using a growth restrict mask; the island-like III-nitride-based semiconductor layers are removed from the substrate using an Epitaxial Lateral Overgrowth (ELO) method; and then the bar is divided into the one or more devices using a cleaving method.

22 Claims, 53 Drawing Sheets

(56) References Cited

U.S. PATENT DOCUMENTS

| | | |
|---|---|---|
| 2007/0217460 A1 | 9/2007 | Ishibashi et al. |
| 2008/0308906 A1 | 12/2008 | Osada et al. |
| 2009/0180505 A1* | 7/2009 | Kohda ................... B82Y 20/00 438/33 |
| 2011/0158275 A1 | 6/2011 | Yoshizumi et al. |
| 2013/0148681 A1 | 6/2013 | Hamaguchi et al. |
| 2014/0127885 A1* | 5/2014 | Grivna ................... H01L 21/78 438/464 |
| 2015/0179875 A1 | 6/2015 | Jang et al. |
| 2015/0318168 A1 | 11/2015 | Bayram et al. |
| 2020/0194615 A1 | 6/2020 | Kamikawa et al. |

FOREIGN PATENT DOCUMENTS

| | | |
|---|---|---|
| JP | 2013118250 A | 6/2013 |
| JP | 2013251304 A | 12/2013 |
| WO | 2018204916 | 11/2018 |
| WO | 2019055936 | 3/2019 |

OTHER PUBLICATIONS

Japanese Notice of Reasons for Refusal dated Mar. 28, 2023 for Japanese Application No. 2020-564550.
Extended European Search Report dated May 2, 2022 for EP Application No. 19804084.2.
Japanese Decision of Refusal dated Dec. 19, 2023 for Japanese Application No. 2020-564550.
Chinese Office Action dated Aug. 17, 2023 for Chinese Application No. 201980032981.9.
Chinese Second Office Action (with English translation) dated May 31, 2024 for Chinese Patent Application No. 201980032981.9.

* cited by examiner

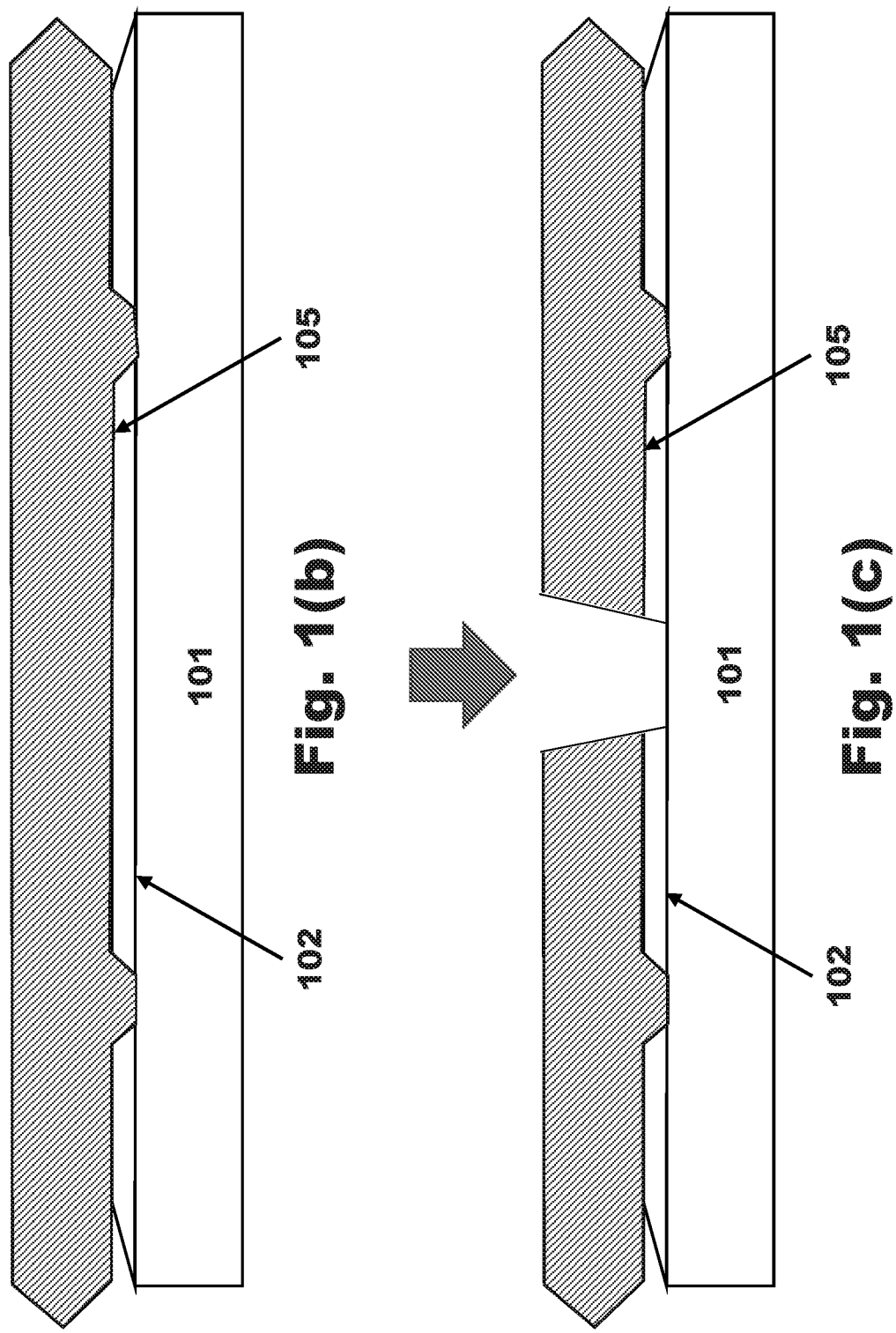

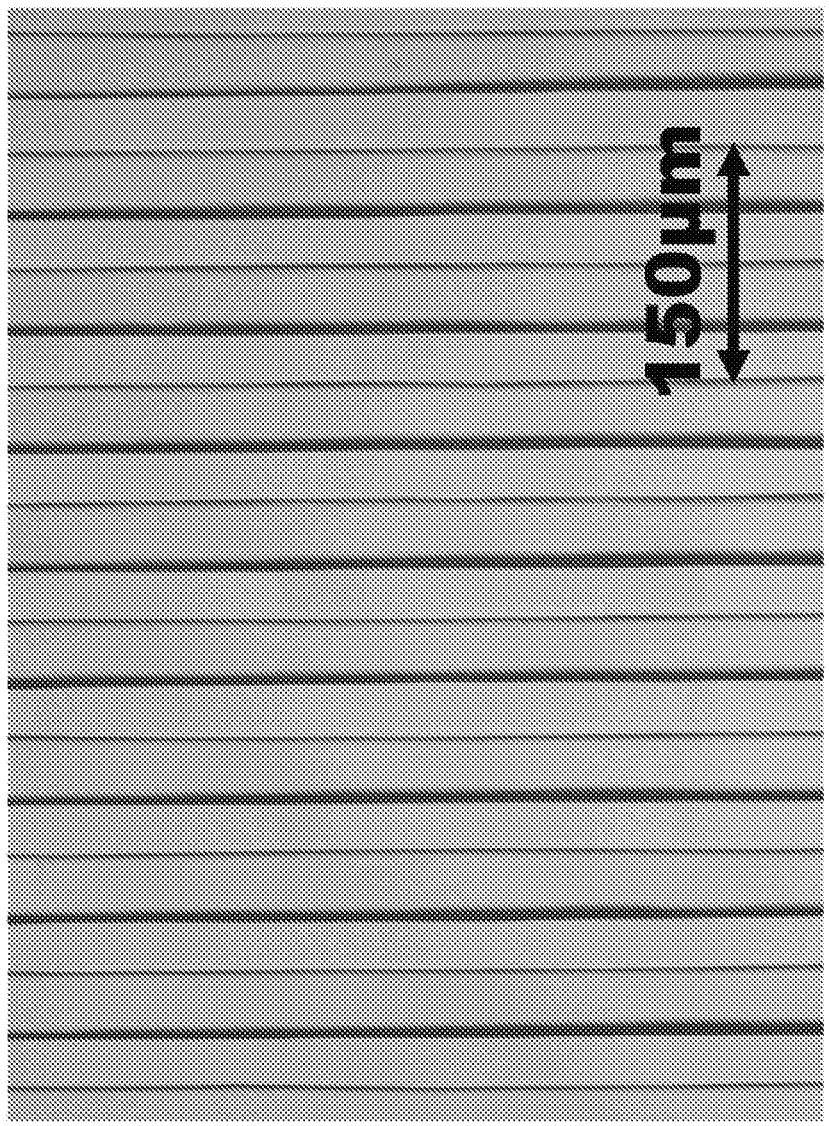

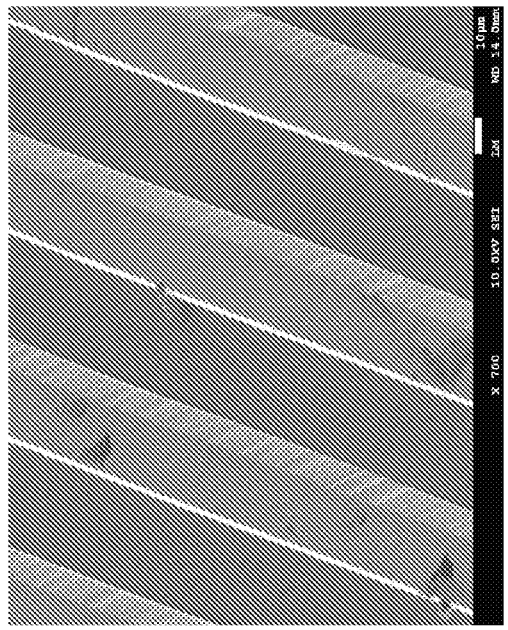
(2) 0.8 degrees
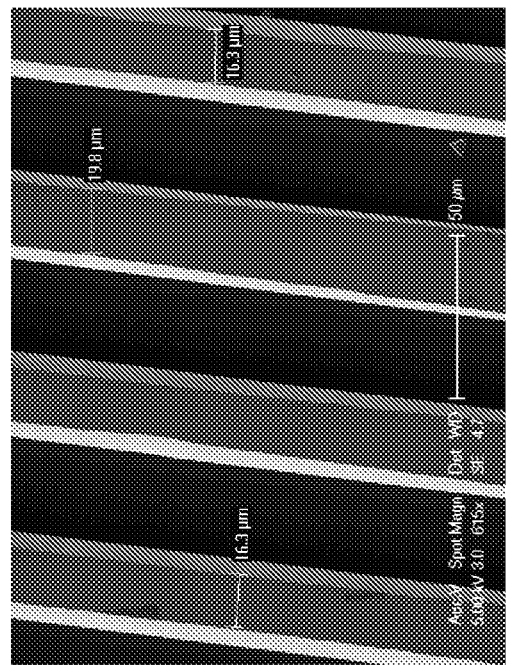
(1) 0.2 degrees
Fig. 3(e)

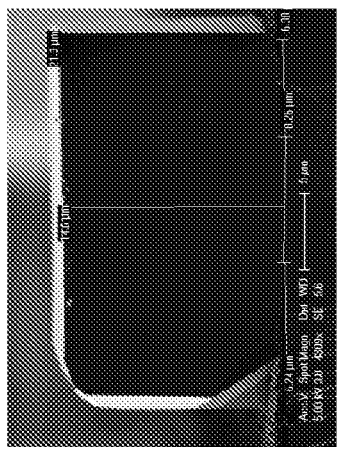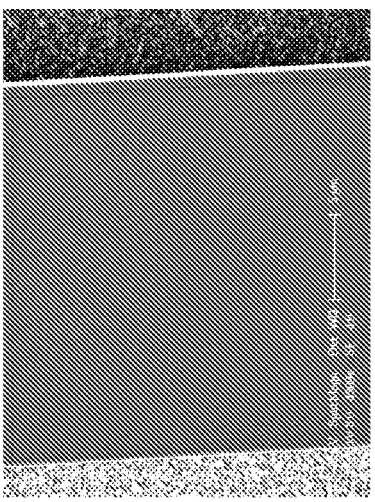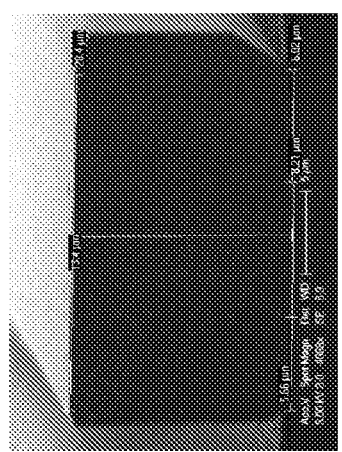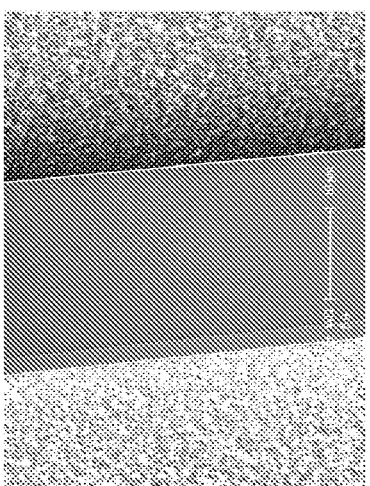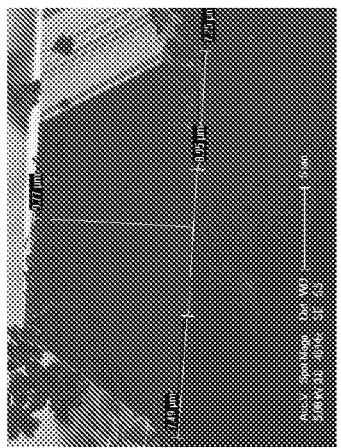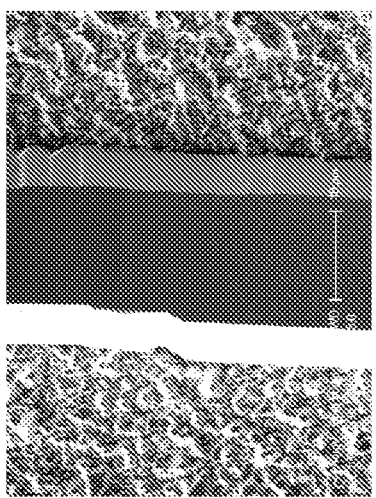
Fig. 3(f)

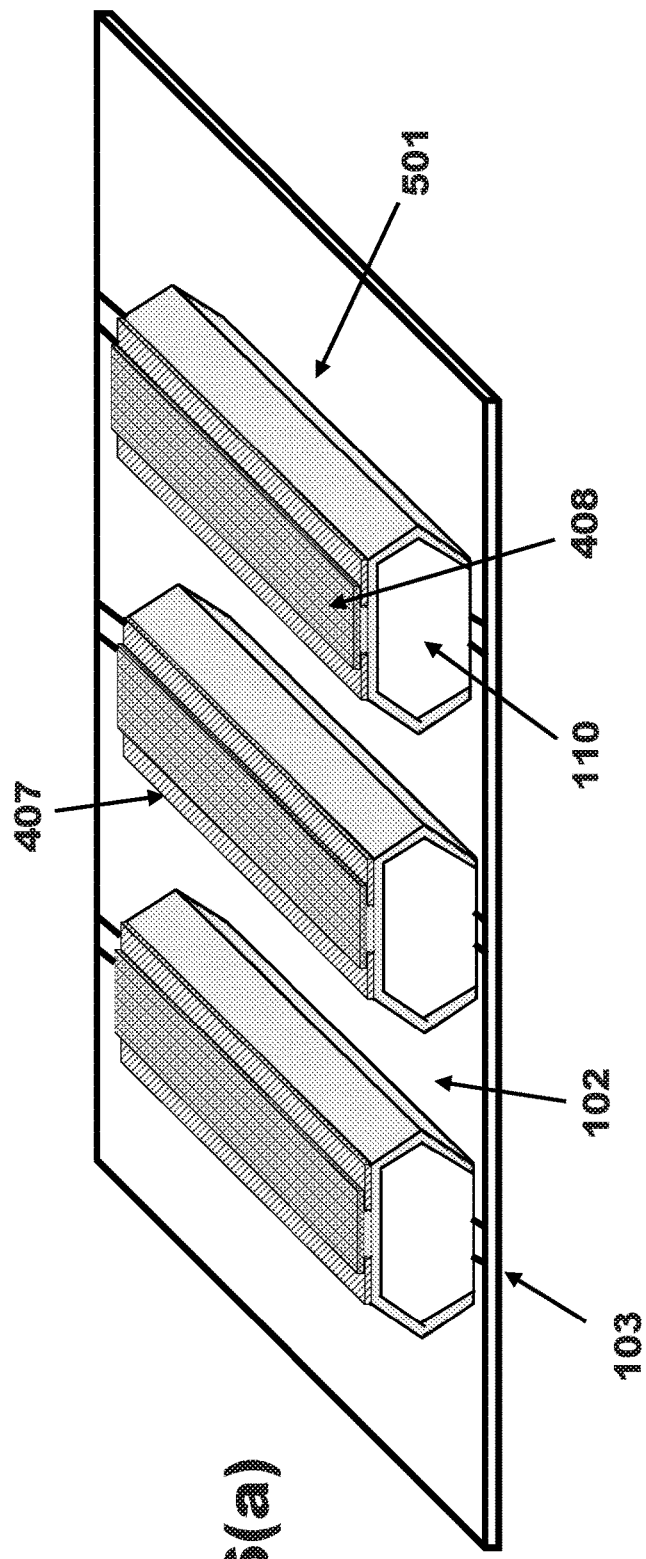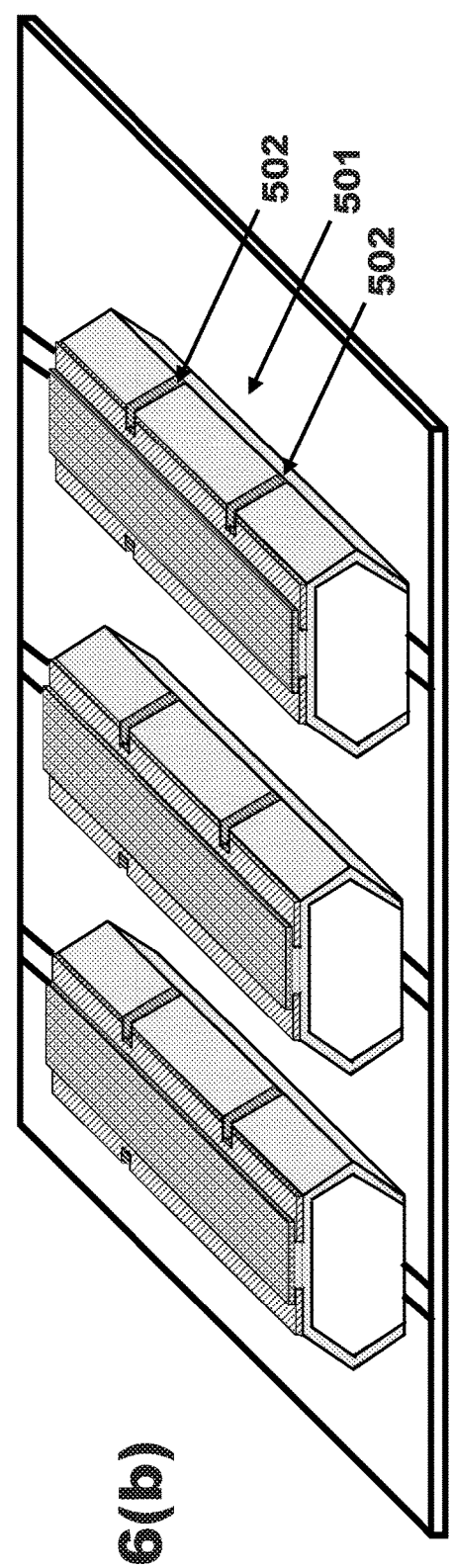
Fig. 6(a)
Fig. 6(b)

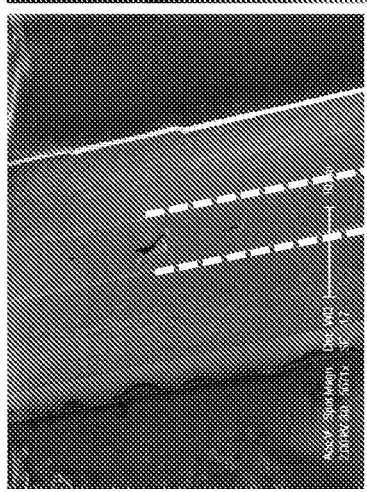 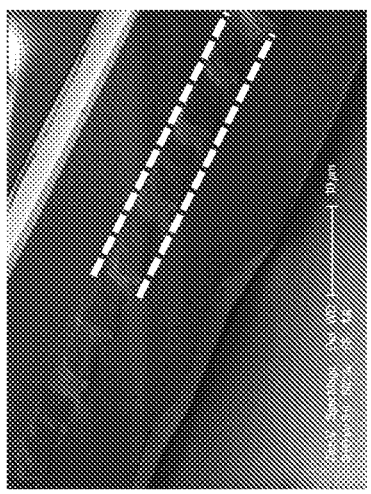 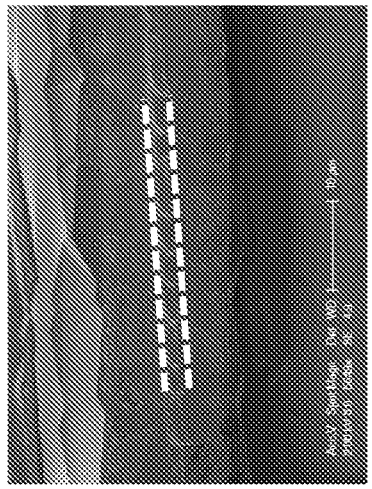
Fig. 7(a)
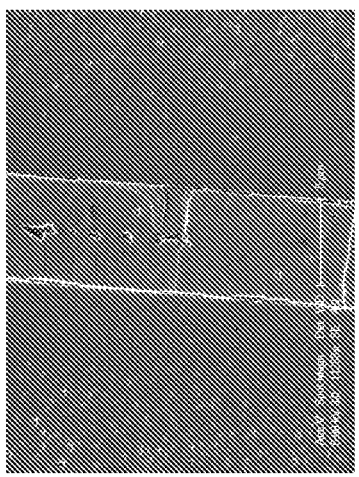 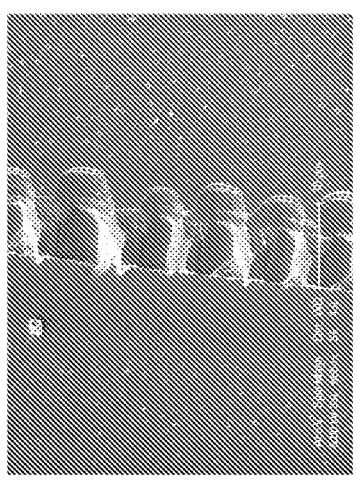 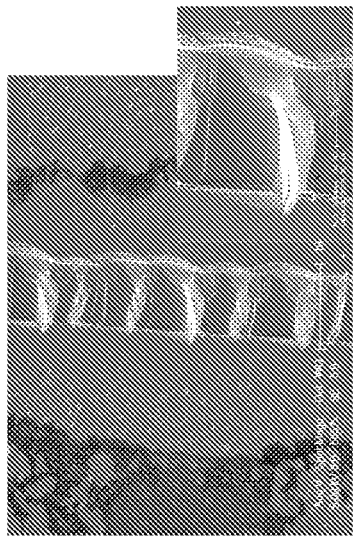
Fig. 7(b)

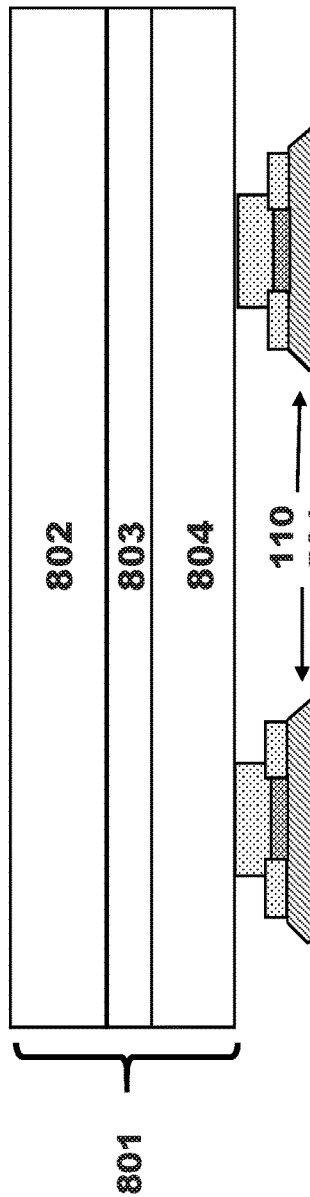
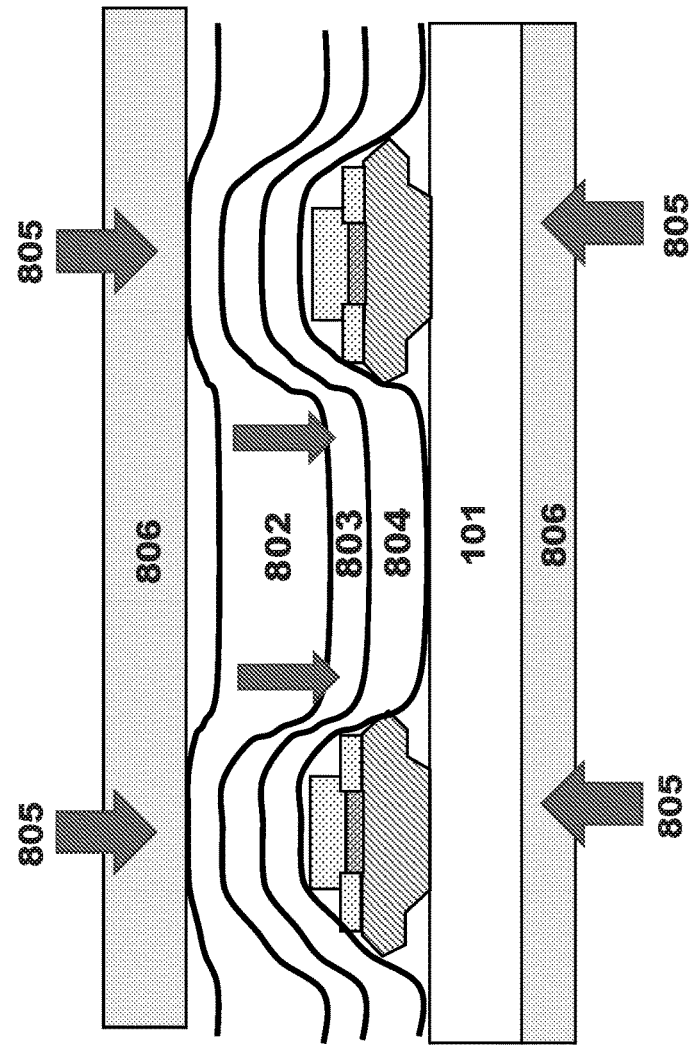
Fig. 8(a)
Fig. 8(b)

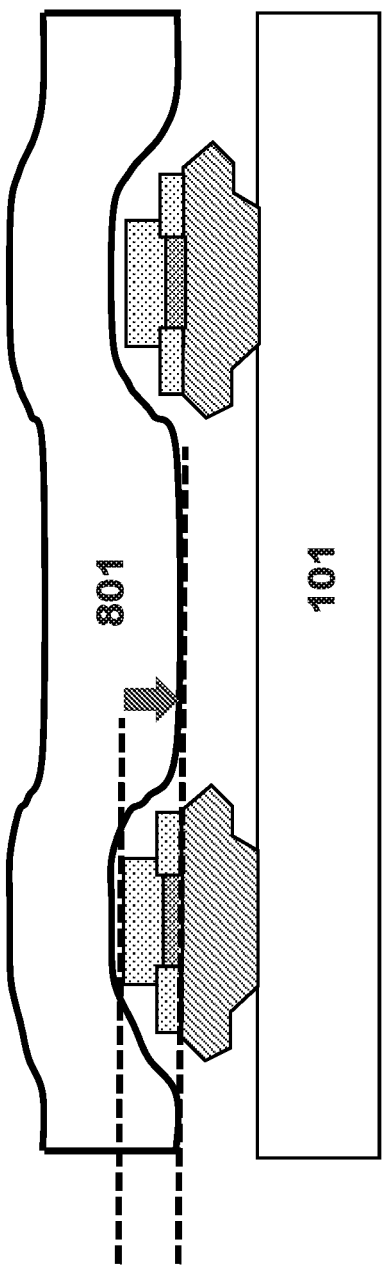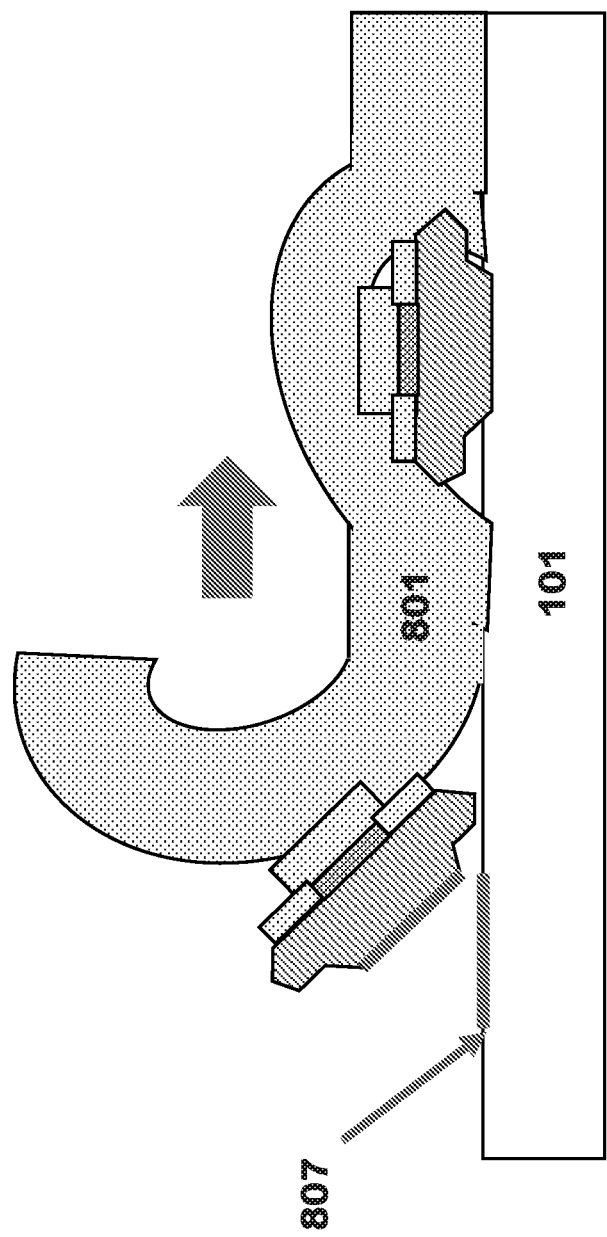

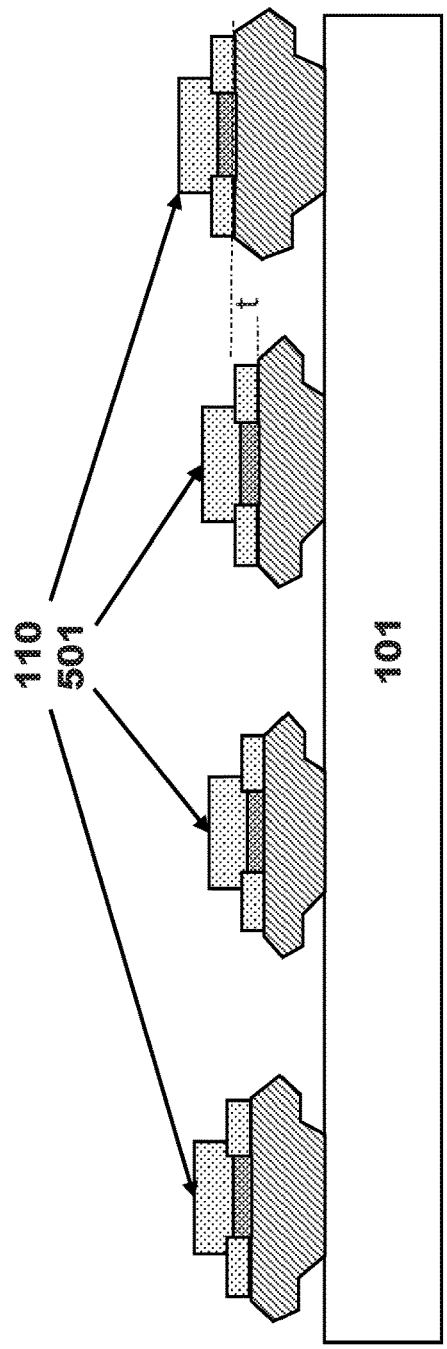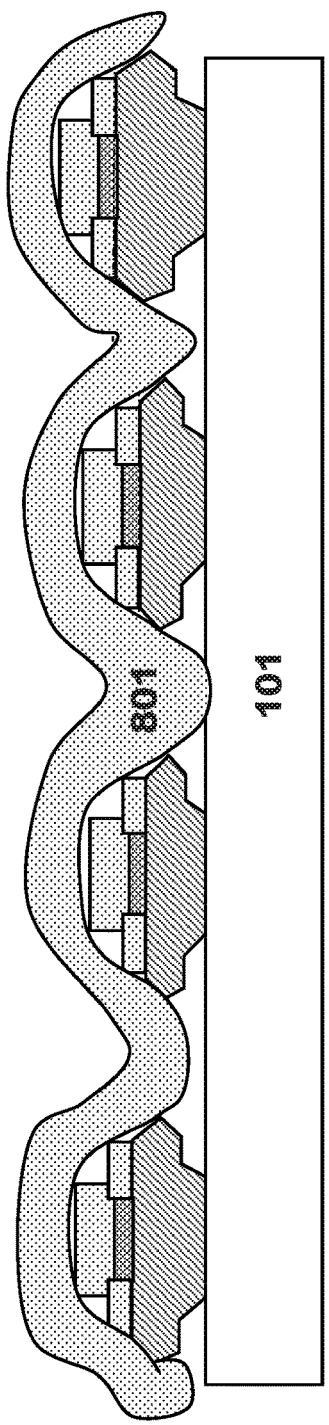
Fig. 8(f)
Fig. 8(g)

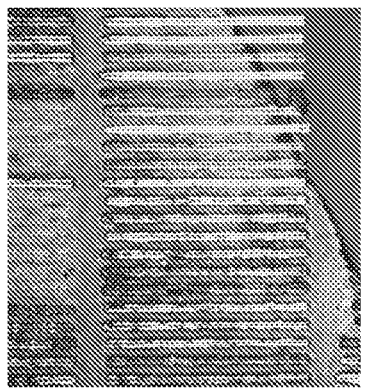
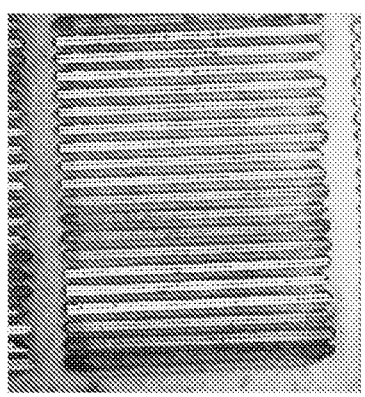
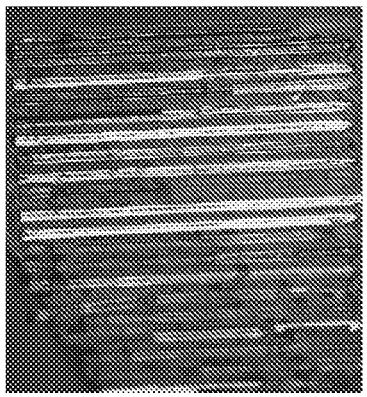
Fig. 9(a)
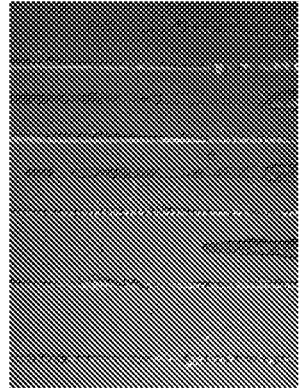
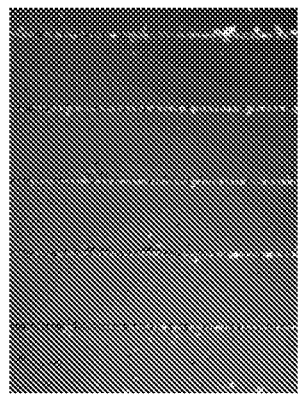
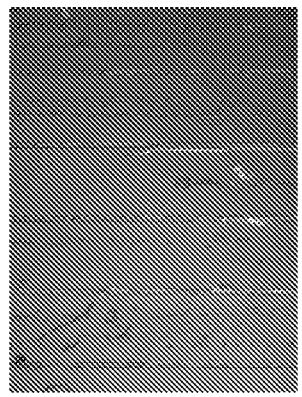
Fig. 9(b)

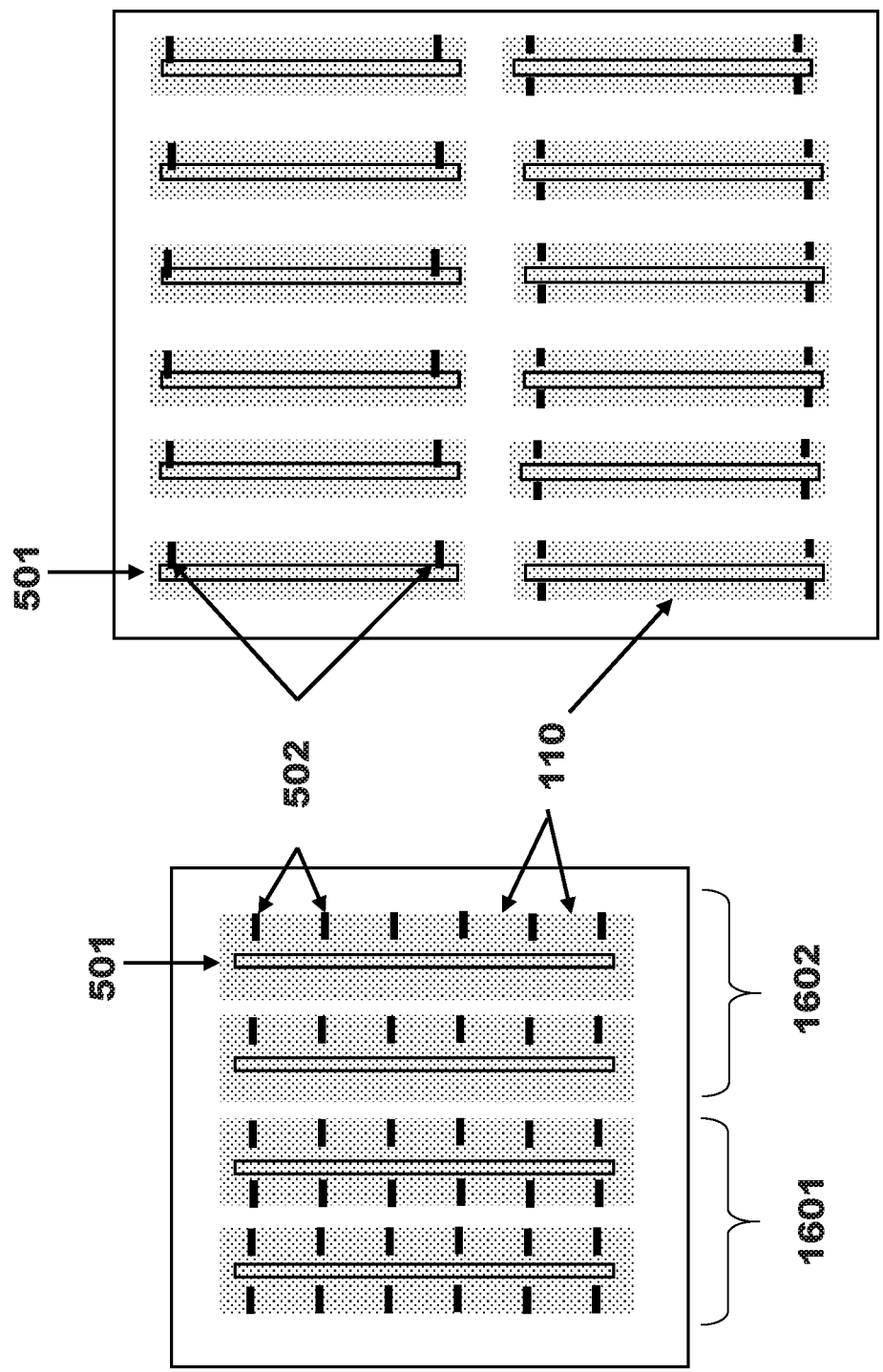

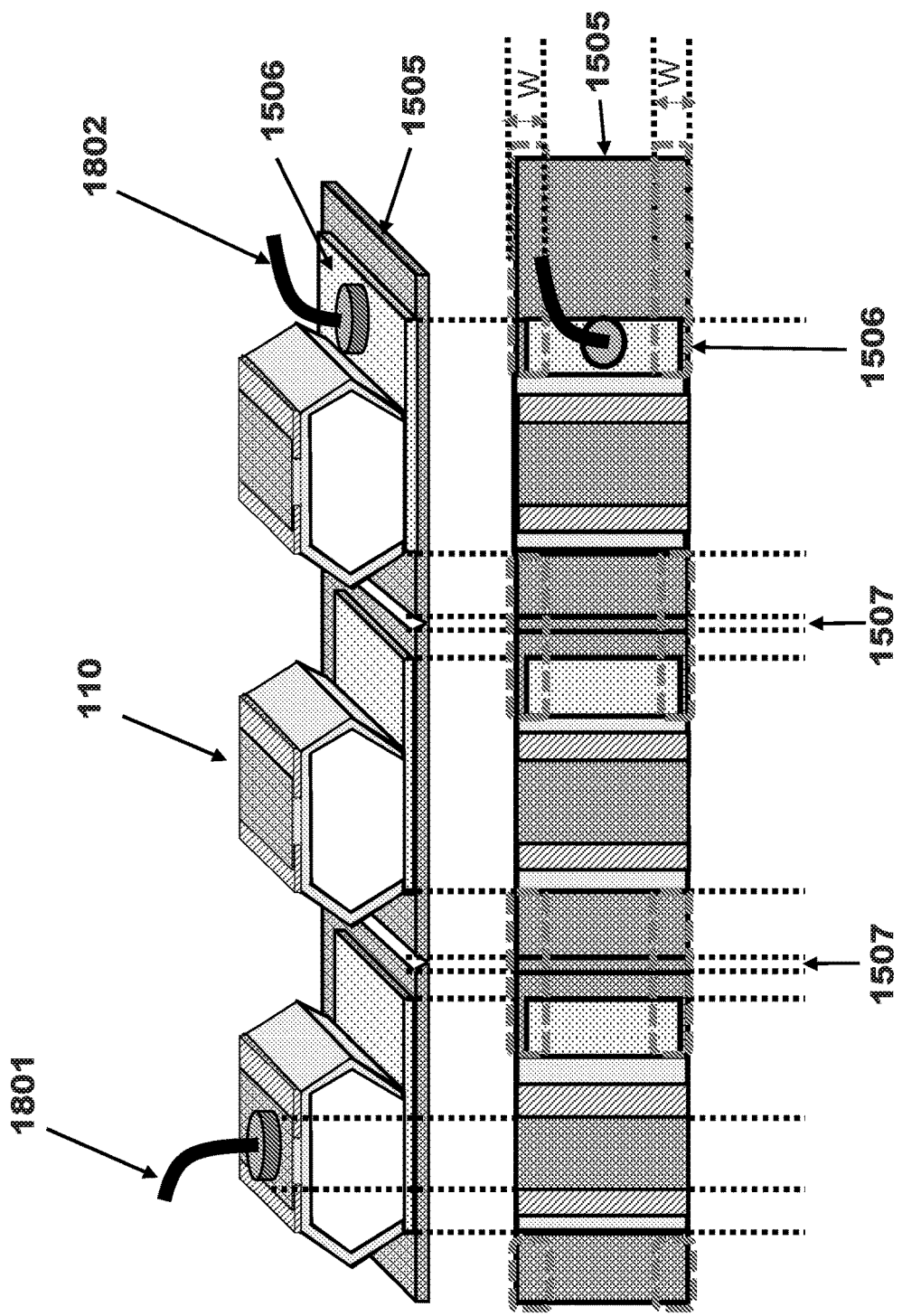

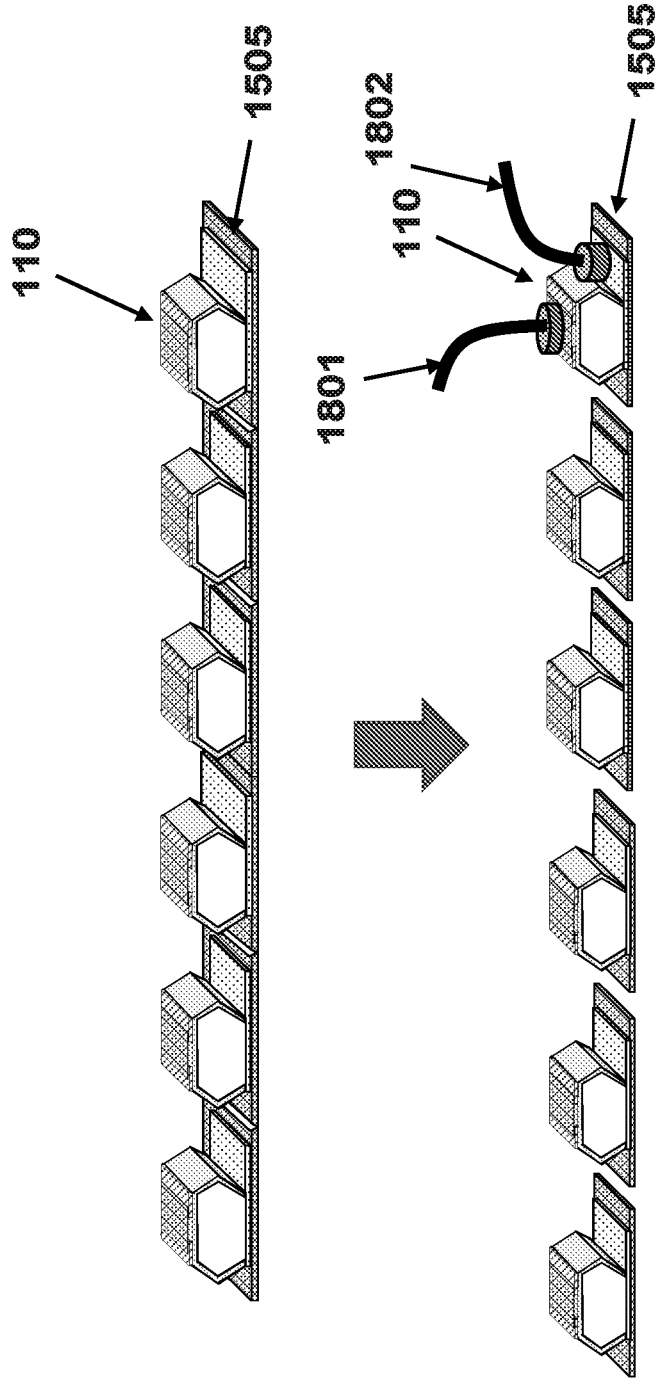

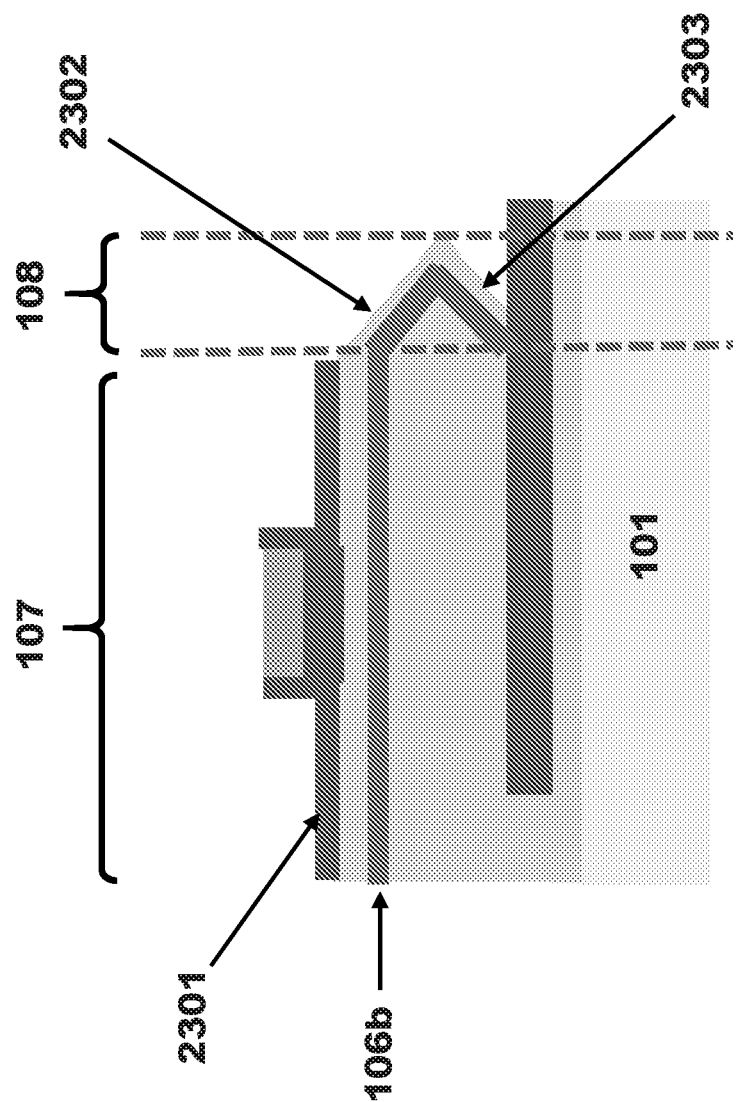

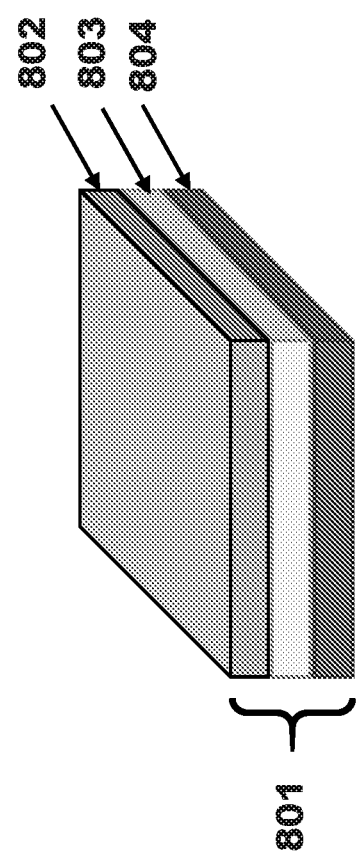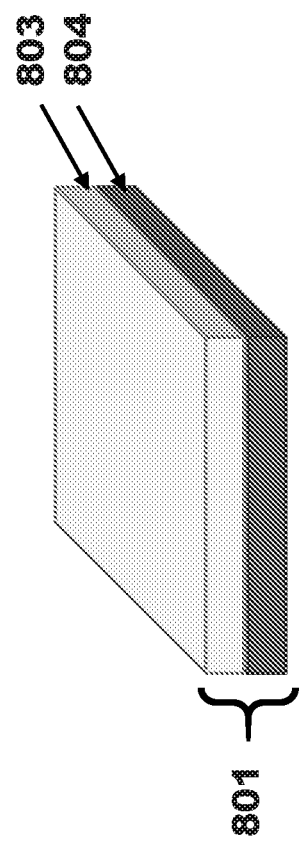
Fig. 24(a)
Fig. 24(b)

METHOD FOR DIVIDING A BAR OF ONE OR MORE DEVICES

CROSS REFERENCE TO RELATED APPLICATIONS

This application claims the benefit under 35 U.S.C. Section 119(e) of the following commonly-assigned application:

U.S. Provisional Application Ser. No. 62/672,913, filed on May 17, 2018, by Takeshi Kamikawa and Srinivas Gandrothula, entitled "METHOD FOR DIVIDING A BAR OF ONE OR MORE DEVICES";

which application is incorporated by reference herein.

This application is related to the following commonly-assigned applications:

PCT International Patent Application No. PCT/US18/31393, filed on May 7, 2018, by Takeshi Kamikawa, Srinivas Gandrothula, Hongjian Li and Daniel A. Cohen, entitled "METHOD OF REMOVING A SUBSTRATE", which application claims the benefit under 35 U.S.C. Section 119(e) of commonly-assigned U.S. Provisional Patent Application No. 62/502,205, filed on May 5, 2017, by Takeshi Kamikawa, Srinivas Gandrothula, Hongjian Li and Daniel A. Cohen, entitled "METHOD OF REMOVING A SUBSTRATE"; and PCT International Patent Application No. PCT/US18/51375, filed on Sep. 17, 2018, by Takeshi Kamikawa, Srinivas Gandrothula and Hongjian Li, entitled "METHOD OF REMOVING A SUBSTRATE WITH A CLEAVING TECHNIQUE", which application claims the benefit under 35 U.S.C. Section 119(e) of commonly-assigned U.S. Provisional Patent Application No. 62/559,378, filed on Sep. 15, 2017, by Takeshi Kamikawa, Srinivas Gandrothula and Hongjian Li, entitled "METHOD OF REMOVING A SUBSTRATE WITH A CLEAVING TECHNIQUE";

all of which applications are incorporated by reference herein.

BACKGROUND OF THE INVENTION

1. Field of the Invention

This invention relates to a method for dividing a bar of one or more devices.

2. Description of the Related Art

Nowadays, there are a lot of methods for dividing a wafer into the chips, such as cleaving, laser scribing, dry-etching, etc. The present invention focuses on the cleaving method as used for making laser facets.

Some device manufacturers have used a III-nitride-based substrate, such as a GaN substrate, to produce laser diodes (LDs) and light-emitting diodes (LEDs) for lighting, optical storage, etc. Generally, in order to fabricate these devices, a wafer needs to be divided into a plurality of chips. Here, the wafer is formed using semiconductor layers on a III-nitride-based substrate.

However, it is not easy to divide the wafer into the plurality of chips, even though using a wafer which is grown using a homo-epitaxial layer on the substrate. This is because the quality of the III-nitride-based substrate, such as a GaN substrate, is still not good enough to divide the wafer into chips by the cleavage of a crystal of the substrate. A number of defects, such as dislocations and stacking faults, and damage on the surface of substrate, such as depressed portions and pits, prevent the wafer from cleaving properly, for example, because a dividing line is not a straight line.

According to Phys. Status Solid C8 No. 7-8 2226-2228 (2011) by M. T. Hardy et. al., an AlGaN layer may be utilized, which has a higher Al composition over 10%, as a cleave assistance layer (CAL), wherein the CAL is 0.6 µm in thickness. In this case, strain was applied to the epitaxial layer on the substrate from the CAL, which caused stacking faults, dislocation at the active layer, etc. In the worst case, the strain caused a lot of cracks in the epitaxial layer.

Accordingly, there is a need in the art for an improved method for dividing epitaxial layers grown on a wafer or substrate into devices.

SUMMARY OF THE INVENTION

To overcome the limitations in the prior art described above, and to overcome other limitations that will become apparent upon reading and understanding this specification, the present invention discloses a method for dividing epitaxial layers grown on a wafer or substrate into devices using a cleaving method.

Specifically, this invention performs the following steps: island-like III-nitride-based semiconductor layers are grown on a substrate using a growth restrict mask and an Epitaxial Lateral Overgrowth (ELO) method; the island-like III-nitride-based semiconductor layers are removed from the substrate using a polymer film; and then the island-like III-nitride-based semiconductor layers are divided into devices using the cleaving method.

The island-like III-nitride semiconductor layers may be grown by metal organic chemical vapor deposition (MOCVD), hydride vapor phase epitaxy (HVPE), etc., and dimensioned such that one or more of the island-like III-nitride semiconductor layers form a bar (known as a semiconductor bar or a bar of the device). By doing this, the cleaving method is not affected by fluctuations of the substrate, such as pits, defects, and surface damage. Consequently, a high yield can be obtained with an atomically smooth surface at a dividing plane.

Moreover, the present invention can use hetero-substrates to grow the island-like III-nitride semiconductor layers that form the bar. For example, a GaN template grown on a hetero-substrate, such as sapphire, Si, GaAs, SiC, etc., can be used in the present invention.

In the prior art, when a hetero-substrate was used, an atomically smooth cleavage facet could not be obtained due to the differences in the cleavage plane of the crystal between the hetero-substrate and the epitaxial layers. This was a critical issue in fabricating a laser diode device, which requires an atomically smooth facet for lasing. Consequently, laser diode devices using a hetero-substrate have not been produced commercially yet.

Employing the present invention, however, even when using a hetero-substrate, laser diode devices can be obtained with atomically smooth facets suitable for resonance. Moreover, because the facet is formed after removing the epitaxial layers from the hetero-substrate, the type of substrate does not affect the cleaving method. This advantage of using hetero-substrates will have a very large impact on the mass production of devices.

For example, a substrate of lower cost and larger size than a free-standing GaN substrate can be used, such as sapphire or silicon. This leads to lower cost devices. In addition, sapphire, GaAs and other substrates are well known as low thermal conductivity materials, so that devices using such substrates also have low thermal conductivity. Using the present invention, however, since the device is removed from the hetero-substrate, it no longer has low thermal conductivity.

Furthermore, using an ELO method can drastically reduce dislocation density and stacking faults density, which become critical issues when using hetero-substrates.

Therefore, this invention can solve many kinds of problems incurred with the use of hetero-substrates, at the same time. For example, in a laser diode device, the cleaving facet can be used as facet for resonator. In other devices, such as LEDs, etc., this method for dividing the bar of a device is not affected by the type of substrate and the fluctuations in the quality of the substrate. Instead, this method can divide devices in a precise and an easy manner.

BRIEF DESCRIPTION OF THE DRAWINGS

Referring now to the drawings in which like reference numbers represent corresponding parts throughout:

FIGS. 1(b) and 1(c) illustrate how island-like III-nitride-based semiconductor layers can be divided after they coalesce, according to one embodiment of the present invention.

FIGS. 3(a), 3(b), 3(c), 3(d), 3(e) and 3(f) are scanning electron microscope (SEM) images of island-like III-nitride-based semiconductor layers, according to one embodiment of the present invention.

FIG. 6(a) and FIG. 6(b) also illustrate how a dividing support region is formed at periodic lengths along a bar of the device, according to one embodiment of the present invention.

FIGS. 7(a) and 7(b) show SEM images of the backside of a bar of a device after being removed and the surface of the substrate after removing the bar of the device, for the (1–100) just, (20–21), and (20–2–1) planes, respectively.

FIGS. 8(a), 8(h), 8(c), 8(d), 8(e). 8(f) and 8(g) illustrate a procedure for removing a bar of a device, according to one embodiment of the present invention.

FIGS. 9(a) and 9(h) are SEM images of a bar of a device from different substrate planes.

FIGS. 16(a) and 16(b) illustrate how multiple bars laterally and longitudinally disposed are both cleaved and broken into separate devices at dividing support regions, according to one embodiment of the present invention.

FIGS. 18(a), 18(b) and 18(c) illustrate how wire bonds are attached to devices, and a heat sink plate is divided at trenches, according to one embodiment of the present invention.

FIGS. 19(a) and 19(b) illustrate how a heat sink plate is divided to separate devices, according to one embodiment of the present invention.

FIGS. 23(a) and 23(b) illustrate the etching of layers in layer bending regions, according to one embodiment of the present invention.

FIGS. 24(a) and 24(b) illustrate the structure of a polymer film, according to one embodiment of the present invention.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Overview

The present invention describes a method for dividing a bar of a device and manufacturing a semiconductor device according to the following steps. In one example, the semiconductor device comprises a III-nitride laser device.

Figure 1A:
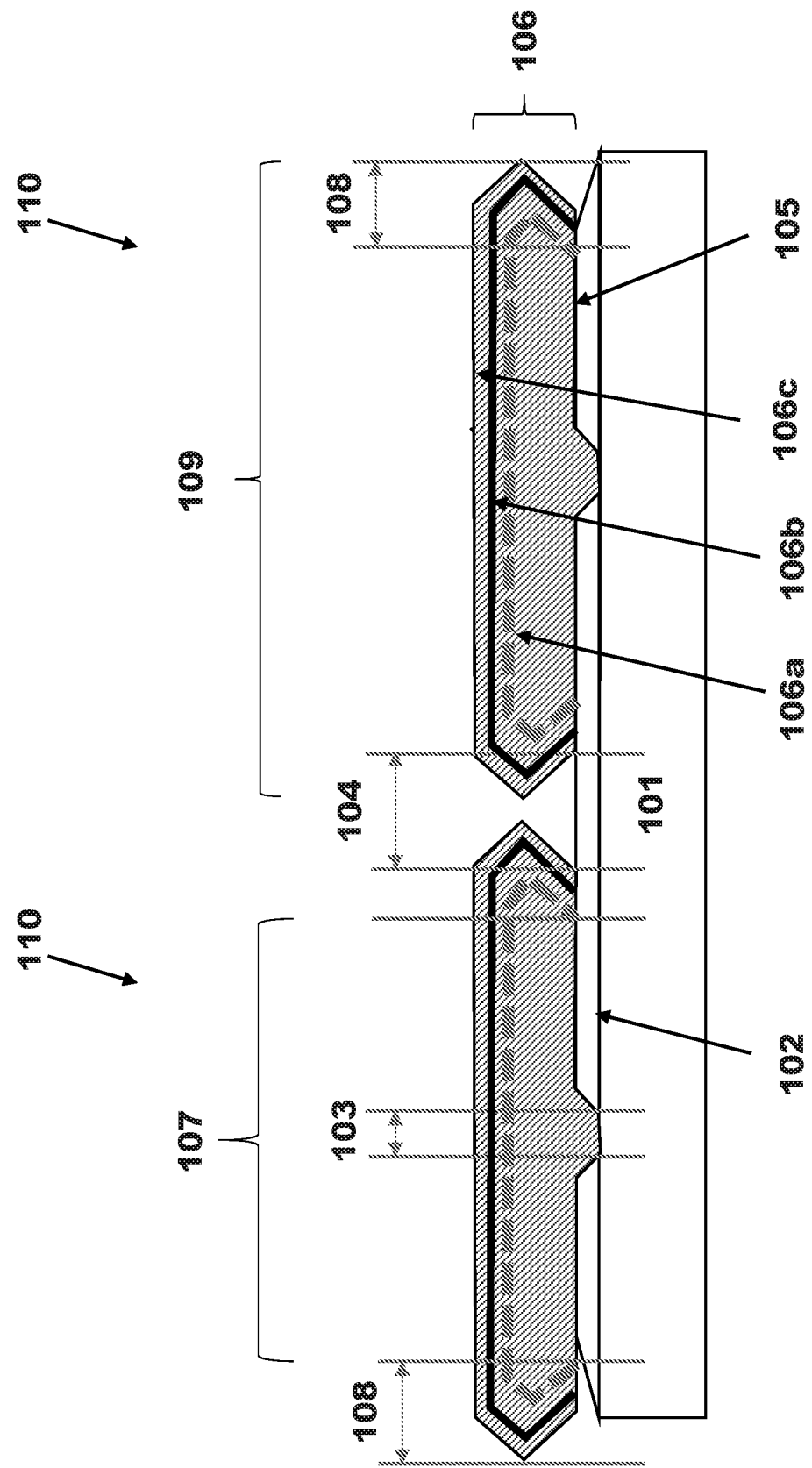
FIG. 1(a) is a schematic of a substrate, growth restrict mask and epitaxial layers, according to one embodiment of the present invention.

FIG. 1(a) illustrates the method, which comprises providing a III-nitride based substrate 101, such as a bulk GaN substrate 101.

A growth restrict mask 102 is formed on or above the GaN-based substrate 101. Specifically, the growth restrict mask 102 is disposed directly in contact with the substrate 101, or is disposed indirectly through an intermediate layer grown by metalorganic chemical vapor deposition (MOM)), etc., made of a III-nitride based semiconductor deposited on the substrate 101.

The growth restrict mask 102 can be formed from an insulator film, for example, an $SiO_2$ film deposited upon the base substrate 101, for example, by a plasma chemical vapor deposition (CVD) method, sputter, ion beam deposition BD), etc., wherein the $SiO_2$ film is then patterned by photolithography using a predetermined photo mask and etching to include opening areas 103, as well as no-growth regions 104 (which may or may not be patterned).

Epitaxial III-nitride layers 105, such as GaN-based layers 105, are grown by ELO on the GaN substrate 101 and the growth restrict mask 102. The growth of the ELO GaN-based layers 105 occurs first in the opening areas 103, on the GaN-based substrate 101, and then laterally from the opening areas 103 over the growth restrict mask 102. The growth of the ELO GaN-based layers 105 is stopped or interrupted before the ELO GaN-based layers 105 at adjacent opening areas 103 can coalesce on top of the growth restrict mask 102. This interrupted growth results in the no-growth regions 104 between adjacent ELO GaN-based layers 105.

Additional III-nitride semiconductor device layers 106 are deposited on or above the ELO GaN-based layers 105, and may include an active region 106a, an electron blocking layer (EBL) 106b, and a cladding layer 106c, as well as other layers. The thickness of the ELO GaN-based layers 105 is important, because it determines the width of one or more flat surface regions 107 and layer bending regions 108 at the edges thereof adjacent the no-growth regions 104. The width of the flat surface region 107 is preferably at least 5 µm, and more preferably is 10 µm or more, and most preferably is 20 µm or more.

The ELO GaN-based layers 105 and the additional III-nitride based semiconductor device layers 106 separated by no-growth regions 104 are referred to as island-like III-nitride based semiconductor layers 109. The distance between the island-like III-nitride-based semiconductor layers 109 is the width of a no-growth region 104. The distance between the island-like III-nitride-based semiconductor layers 109 adjacent to each other is generally 20 µm or less, and preferably 5 µm or less, but is not limited to these values.

Each of the island-like-III-nitride semiconductor layers 109 may be processed into a separate device 110. The device 110, which may be a light-emitting diode (LED), laser diode (LD), Schottky barrier diode (SBD), or metal-oxide-semiconductor field-effect-transistor (MOSFET), is processed on the flat surface region 107 and/or the opening areas 103. Moreover, the shape of the device 110 generally comprises a bar.

There are many methods of removing the bar of the device 110 from the substrate 101. For example, the present invention can utilize the ELO method for removing the bar of the device 110. Generally, the ELO method is utilized to reduce the defect density in the island-like III-nitride semiconductor layers 109 on a hetero-substrate.

In the present invention, the bonding strength between the substrate 101 and the ELO GaN-based layers 105 is weakened by the growth restrict mask 102. In this case, the bonding area between the substrate 101 and the ELO GaN-based layers 105 is opening area 103, wherein the width of the opening area 103 is narrower than the ELO GaN-based layers 105. Consequently, the bonding area is reduced by the growth restrict mask 102, so that this method is preferable for removing the epitaxial layers 105, 106, 109.

In one embodiment, as shown in FIGS. 1(b) and 1(c), the ELO GaN-based layers 105 are allowed to coalesce to each other, as shown in FIG. 1(b). After the ELO GaN-based layers 105 coalesce, and subsequent III-nitride semiconductor device layers 106 are deposited, the island-like III-nitride semiconductor layers 109 can be divided using a dry-etching method, as shown in FIG. 1(c).

The fabrication steps for this invention are described in more detail below:

Step 1: Forming a growth restrict mask 102 with a plurality of striped opening areas 103 directly or indirectly upon a substrate 101, Wherein the substrate 101 is a III-nitride-based semiconductor or a hetero-substrate.

Step 2: Growing a plurality of epitaxial layers 105, 106 and 109 upon the substrate 101 using the growth restrict mask 102, such that the growth extends in a direction parallel to the striped opening areas 103 of the growth restrict mask 102, wherein the ELO GaN-based layers 105 do not coalesce.

Step 3: Fabricating the device 110 at the flat surface region 107 by conventional methods, wherein a ridge structure, p-electrode, n-electrode, pads, etc., are disposed on the island-like III-nitride semiconductor layers 109 at pre-determined positions.

Step 4: Forming a structure for cleaving at the flat surface region 107 and one or more side facets of the device 110.

Step 5. Dissolving the growth restrict mask 102 by wet etching.

Step 6: Removing the bar of the device 110 from the substrate 101.
  Step 6.1: Attaching a polymer film to the bar of the device 110.
  Step 6.2: Applying pressure to the polymer film and the substrate 101.
  Step 6.3: Reducing the temperature of the film and the substrate 101 while the pressure is applied.
  Step 6.4: Utilizing the difference in thermal coefficients between the film and the substrate 101 for removing the bar of the device 110.

Step 7: Fabricating an n-electrode at a separate area of the device 110.

Step 8: Breaking the bars into devices 110.

Step 9: Mounting each device 110 on a heat sink plate, such as SiC, AlN, etc.

Step 10: Coating the facets of the device 110 (which is a laser diode).

Step 11: Dividing the heat sink plate.

Step 12: Screening the devices 110.

Step 13: Mounting the devices 110 on/into the packages.

These steps are explained in more detail below.

Step 1: Forming a Growth Restrict Mask

In one embodiment, the GaN-based layers 105 are grown by ELO on a III-nitride substrate 101, such as an m-plane GaN substrate 101, patterned with a growth restrict mask 102 comprised of $SiO_2$, Wherein the GaN-based layers 105 do not coalesce on top of the $SiO_2$.

The growth restrict mask 102 is comprised of striped opening areas 103, wherein the $SiO_2$ stripes of the growth restrict mask 102 between the opening areas 103 have a width of 20 µm and an interval of 150 µm, and the opening areas 103 are oriented along a <0001> axis. If semipolar (20–21) or (20–2–1) planes are used, the opening areas 103 are oriented in a direction parallel to [−1014] or [10–14], respectively. Other planes may be use as well, with the opening areas 103 oriented in other directions.

When using a III-nitride substrate 101, the present invention can obtain high quality ill-nitride semiconductor layers 105, 106, 109, and avoid bowing or curvature of the substrate 101 during epitaxial growth due to homo-epitaxial growth. As a result, the present invention can also easily obtain devices 110 with reduced detect density, such as dislocation and stacking faults.

Figure 2:
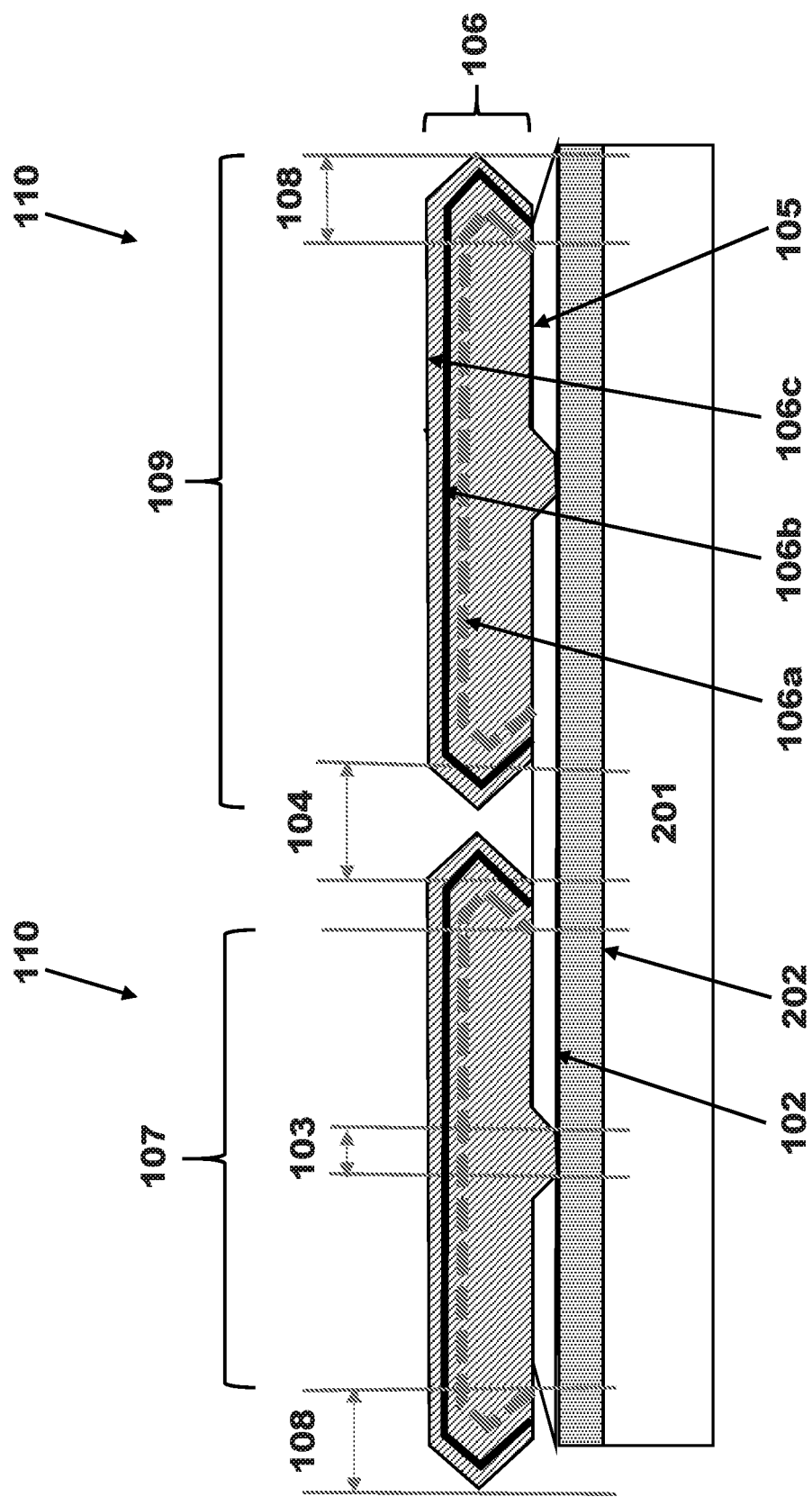
FIG. 2 is a schematic of a hetero-substrate, growth ask and epitaxial layers, according to one embodiment of the present invention.

Moreover, as shown in FIG. 2, these techniques can be used with a hetero-substrate 201, such as sapphire, SiC, LiAlO$_2$, Si, etc., as long as it enables growth of the ELO GaN-based layers 105 through the growth restrict mask 102. In one embodiment, a III-nitride template 202, such as a GaN underlayer, may be deposited on the hetero-substrate 201 before the growth restrict mask 102 or the ELO GaN-based layers 105.

Step 2: Growing a Plurality of Epitaxial Layers on the Substrate Using the Growth Restrict Mask At step 2, the III-nitride semiconductor device layers 106 are grown on the ELO GaN-based layers 105 in the flat region 107 by conventional methods. In one embodiment, MOCVD is used for the epitaxial growth of the island-like III-nitride-based semiconductor layers 109, including the ELO GaN-based layers 105 and the III-nitride semiconductor device layers 106. The island-like III-nitride-based semiconductor layers 109 are separated from each other, because the MOCVD growth is stopped before the ELO GaN-based layers 105 coalesce.

Trimethylgallium (TMGa), trimethylindium (TMIn) and triethylaluminum (TMAI) are used as III elements sources, Ammonia (NH$_3$) is used as the raw gas to supply nitrogen. Hydrogen (H$_2$) and nitrogen (N$_2$) are used as a carrier gas of the III elements sources. It is important to include hydrogen in the carrier gas to obtain a smooth surface epi-layer.

Saline and Bis(cyclopentadienyl)magnesium (Cp$_2$Mg) is used as n-type and p-type dopants. The pressure setting typically is 50 to 760 Torr. III-nitride-based semiconductor layers are generally grown at temperature ranges from 700 to 1250° C.

For example, the growth parameters include the following: TMG is 12 sccm, NH$_3$ is 8 slm, carrier gas is 3 slm, SiH$_4$ is 1.0 sccm, and the V/III ratio is about 7700.

ELO Limited Area Epitaxy (LAE) III-Nitride Layers

In the prior art, a number of pyramidal hillocks have been observed on the surface of in-plane III-nitride films following growth. See, for example, US Patent Application Publication No. 2017/0092810. Furthermore, a wavy surface and depressed portion have appeared on the growth surface, which made the surface roughness worse. This is a very severe problem when a laser diode device structure is fabricated on the surface. For that reason, it is better to grow the epitaxial layers 105, 106, 109 on a nonpolar and semipolar substrate 101, which is well known to be difficult.

For example, according to some papers, a smooth surface can be obtained by controlling an off-angle (>1 degree) of the substrate's growth surface, as well as by using an N$_2$ carrier gas condition. These are very limiting conditions for mass production, however, because of the high production cost. Moreover, GaN substrates have a large fluctuation of off-angles to the origin from their fabrication methods. For example, if the substrate has a large in-plane distribution of off-angles, it has a different surface morphology at these points in the wafer. In this case, the yield is reduced by the large in-plane distribution of the off-angles. Therefore, it is necessary that the technique does not depend on the off-angle in-plane distribution.

The present invention solves these problem as set forth below.

1. The growth area is limited by the area of the growth restrict mask 102 from the edges of the substrate 101.

2. The substrate 101 is a nonpolar or semipolar ill-nitride substrate 101 that has off-angle orientations ranging from −16 degrees to +30 degrees from the m-plane towards the c-plane. Alternatively, a hetero-substrate 201 with a III-nitride-based semiconductor layer 202 deposited thereon may be used, wherein the layer 202 has an off-angle orientation ranging from +16 degrees to −30 degrees from the m-plane towards the c-plane.

3. The island-like III-nitride-based semiconductor layers 109 have a long side that is the perpendicular to an a-axis of the III-nitride-based semiconductor crystal.

4. During MOCVD growth, a hydrogen atmosphere can be used.

5. The island-like III-nitride-based semiconductor layers 109 do not coalesce with each other.

Using at least #1, #2 and #3 above, a bar of the device 110 with a smooth surface is obtained. It is more preferable that every one of #1, #2, #3, #4 and #5 is conducted.

As shown in FIGS. 3(a)-3(f), the present invention can obtain island-like III-nitride-based semiconductor layers 109 that have a smooth top surface without pyramidal hillocks and depressed portions, with various planes and various off-angles. The results are explained as following.

Figure 3B:
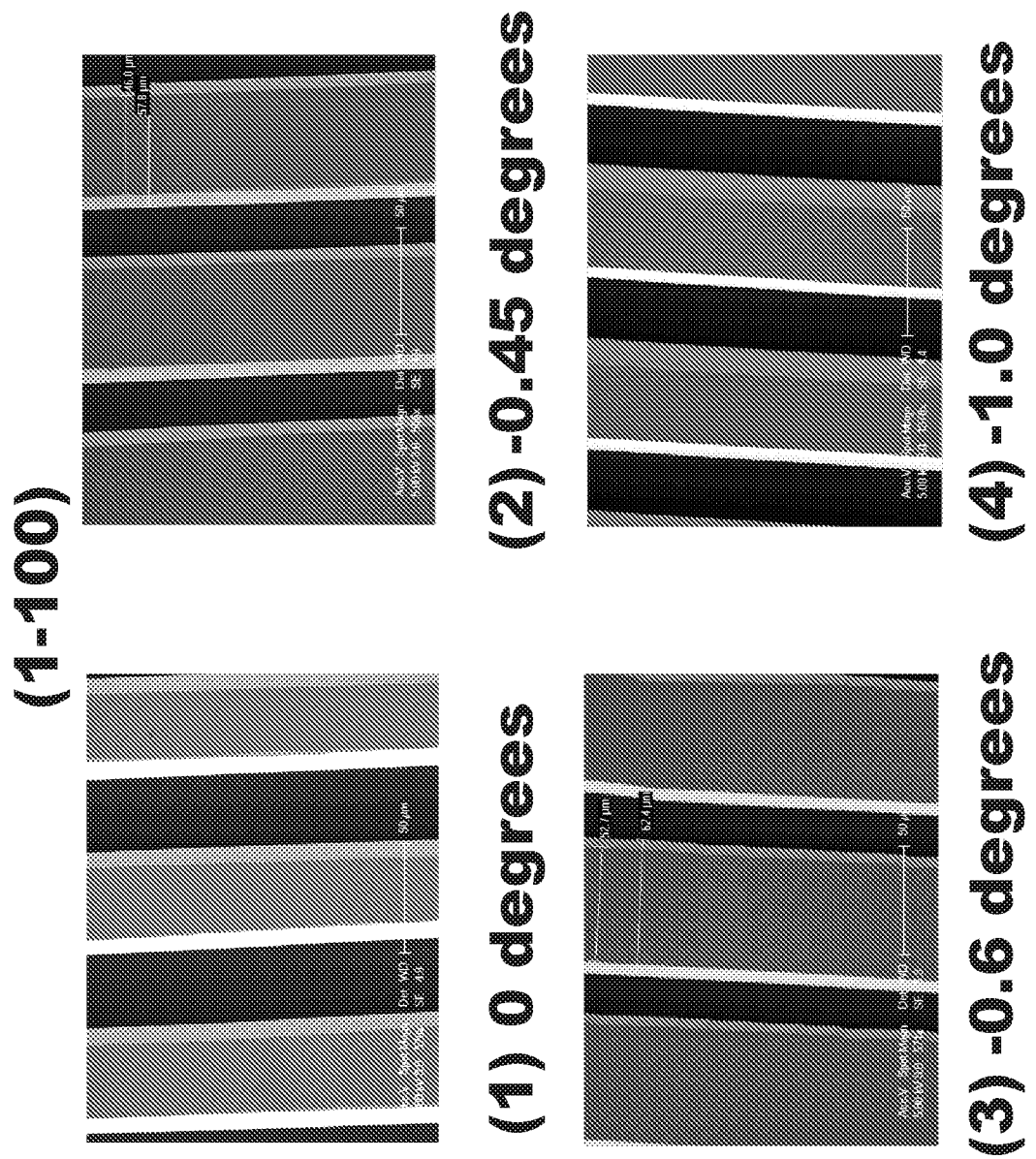
Figure 3C:
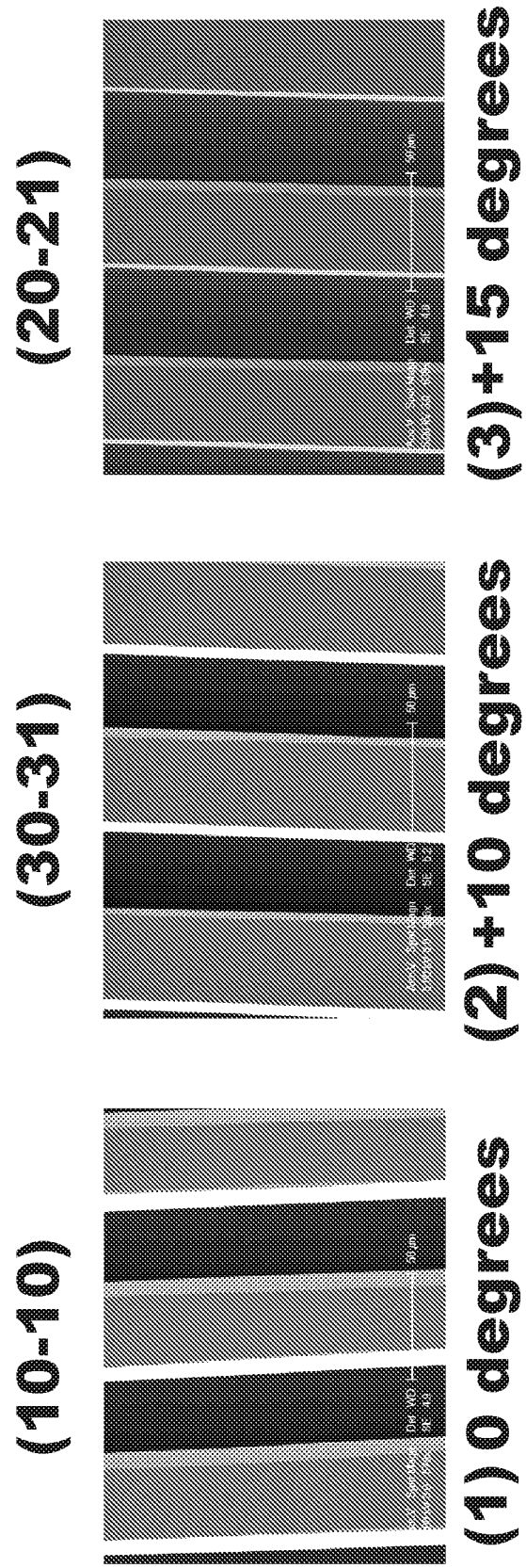
Figure 3D:
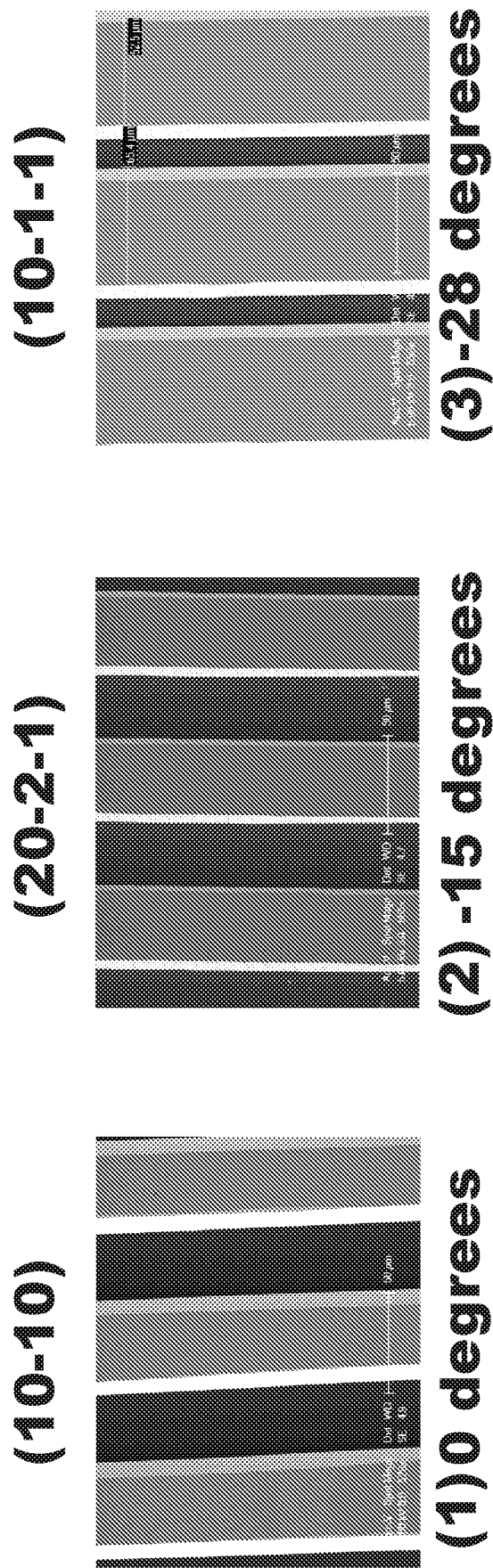

FIG. 3(a) shows a microscope image of the island-like III-nitride-based semiconductor layers 109 on an m-plane. FIG. 3(b) shows images of the island-like III-nitride-based semiconductor layers 109 with different axis-cut orientations of the m-plane; including (1) 0 degrees, (2) −0.45 degrees, (3) −0.6 degrees, and (4) −1.0 degrees. FIG. 3(c) shows images of the island-like III-nitride-based semiconductor layers 109 with different off-angles from the in-plane towards the +c-plane, including (1) the (10–10) plane at 0 degrees, (2) the (30–31) plane at +10 degrees, and (3) the (20–21) plane at +15 degrees. FIG. 3(d) shows images of the island-like III-nitride-based semiconductor layers 109 with different off-angles from the in-plane towards the −c-plane, including (1) the (10–10) plane at 0 degrees, (2) the (20–2–1) plane at −15 degrees, and (3) the (10–1–1) plane at −28 degrees. FIG. 3(e) shows images of the island-like ill-nitride-based semiconductor layers 109 with different miscut orientation from the c-plane towards the m-plane, including (1) a 0.2 degree mis-cut, and (2) a 0.8 degree mis-cut. FIG. 3(f) shows images of the island-like III-nitride-based semiconductor layers 109 with an AlGaN layer on various planes, including (1–100), (20–21), (20–2–1), (1–100), (20–21) and (20–2–1), wherein the Al composition of the AlGaN layer is 3%-5%. As shown in FIG. 3(f), using the AlGaN layer, a smooth surface can be obtained for the island-like III-nitride-based semiconductor layers 109.

Those results have been obtained by the following growth conditions.

In one embodiment, the growth pressure ranges from 60 to 760 Torr, although the growth pressure preferably ranges from 100 to 300 Torr to obtain a wide width for the island-like III-nitride-based semiconductor layers 109; the growth temperature ranges from 900 to 1200° C. degrees; the V/III ratio ranges from 1000-30,000 and more preferably 3000-10000; the TMG is from 2-20 sccm; NH$_3$ ranges from 3 to 10 slm; and the carrier gas is only hydrogen gas, or both hydrogen and nitrogen gases. To obtain a smooth surface, the growth conditions of each plane needs to be optimized by conventional methods.

After growing for about 2-8 hours, the ELO GaN-based layers 105 had a thickness of about 8-50 μm and a bar width of about 20-150 μm, wherein the bar width comprises the width of the island-like III-nitride-based semiconductor layers 109.

Step 3: Fabricating the Device

Figure 4:
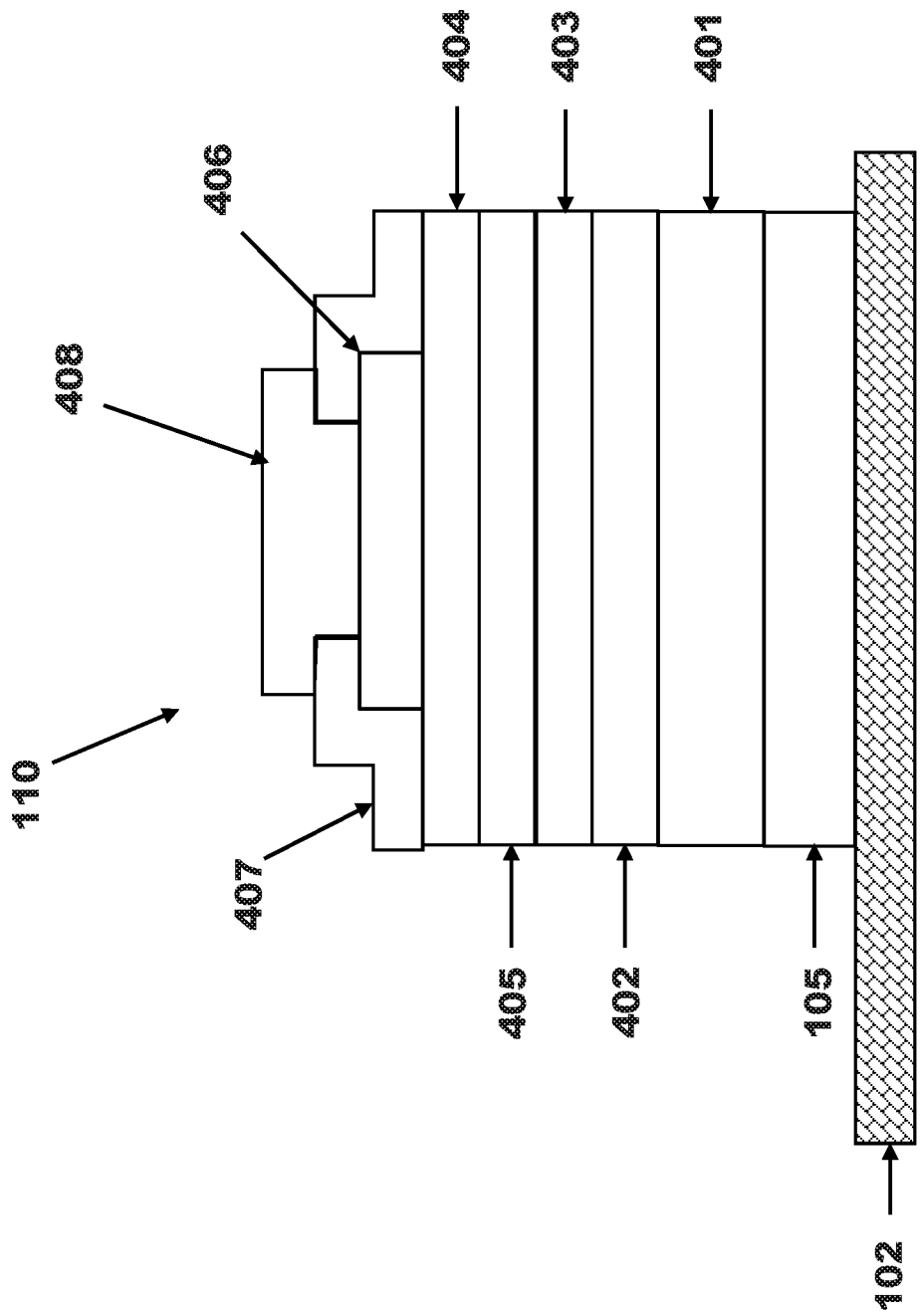
FIG. 4 is a cross-sectional view of a laser diode device formed from the island-like III-nitride-based semiconductor layers, according to one embodiment of the present invention.

At step 3, the device 110 is fabricated at the flat surface region 107 by conventional methods, wherein a ridge structure, p-electrode, n-electrode, pads, etc., are disposed on the island-like III-nitride semiconductor layers 109 at pre-determined positions. The device 110 may comprise a laser diode device 110, as shown in FIG. 4.

The laser diode device 110 is comprised of the following ill-nitride semiconductor device layers 106, laid one on top of another, in the order mentioned, grown on the ELO GaN-based layers 105 deposited on the growth restrict mask 102: an n-$Al_{0.06}$GaN clad layer 401, an n-GaN guiding layer 402, an InGaN/GaN multiple quantum well (MQW) active layer 403, an AlGaN EBL layer 404, a p-GaN waveguide layer 405, an ITO cladding layer 406, an $SiO_2$ current limiting layer 407, and a p-electrode 408.

An optical resonator is comprised of a ridge stripe structure, wherein the ridge stripe structure is comprised of the ITO cladding layer 406, the $SiO_2$ current limiting layer 407, and the p-electrode 408. The optical resonator provides optical confinement in a horizontal direction. The width of the ridge stripe structure is on the order of 1.0 to 30 μm and typically is 10 μm.

Conventional methods, such as photolithography and dry etching, can be used to fabricate the ridge stripe structure. The ridge depth (from the surface to the ridge bottom) is in the p-GaN waveguide layer 405. The ridge depth is pre-determined before dry etching is performed, based on simulation or previous experimental data.

In one embodiment, the p-electrode 408 may be comprised of one or more of the following materials: Pd, Ni, Ti, Pt, Mo, W, Ag, Au, etc. For example, the p-electrode 408 may comprise Pd—Ni—Au (with thicknesses of 3-30-300 nm). These materials may be deposited by electron beam evaporation, sputter, thermal heat evaporation, etc. In addition, the p-electrode 408 is typically deposited on the ITO cladding layer 406.

Step 4: Forming a Structure for Cleaving at the Flat Sur/Ice Region and Side Facets As shown in FIGS. 5(a), 5(b), 5(c) and 5(d), the aim of this step is to prepare to divide a bar 501 of the device 110 before the bar 501 of the device 110 is removed from the substrate 101. A dividing support region 502 is formed at periodic lengths, wherein each period is determined by the device 110 length. For example, in the case of a laser diode device 110, one period is set to be 300-1200 μm.

Figure 5A:
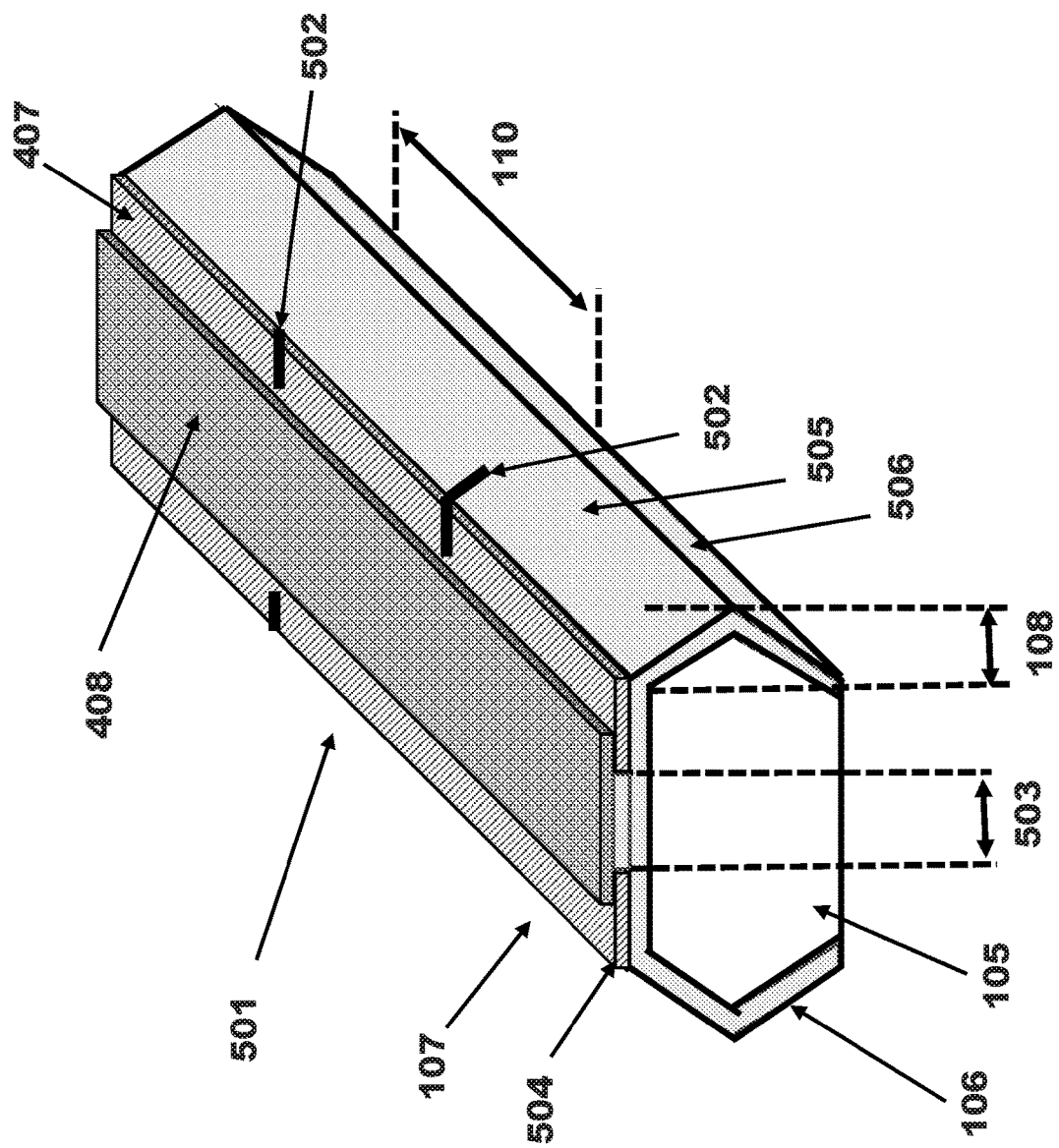
FIGS. 5(a), 5(b), 5(c) and 5(d) illustrate how a dividing support region is formed at periodic lengths along a bar of the device, according to one embodiment of the present invention.
Figure 5B:
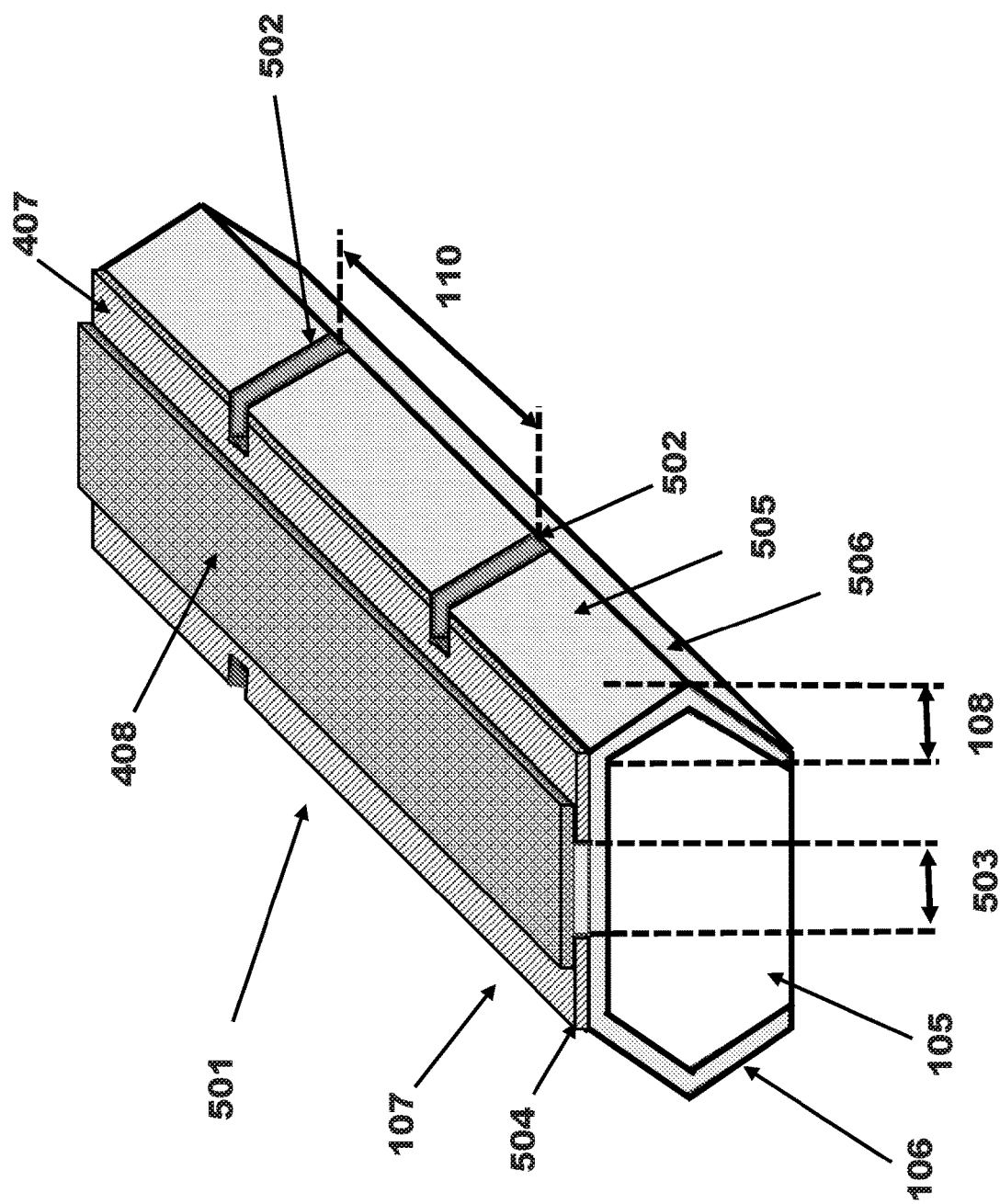

The dividing support region 502 is a line scribed by a diamond tipped scriber or laser scriber, as shown in FIG. 5(a); or a trench formed by dry-etching such as RIE (Reactive Ion Etching) or ICP (Inductively Coupled Plasma), as shown in FIG. 5(b);

but is not limited to those methods. The dividing support region 502 may be formed on both sides of the bar 501 or on one side of the bar 501. The depth of the dividing support region 502 is preferably 1 μm or more.

Both cases can divide the bar 501 into separate devices 110 at the dividing support region 502, because the dividing support region 502 is weaker than any other part. The dividing support region 502 avoids breaking the bar 501 at unintentional positions, so that it can precisely determine the device 110 length.

The dividing support region 502 is created at the flat surface region 107 in a manner that avoids a current injection region 503, which is in the ridge structure, and the p-electrode 408, and the layer bending region 108, although it may encompass at least a portion of the $SiO_2$ current limiting layer 407.

As shown in FIGS. 5(a) and 5(b), the dividing support region 502 is formed at a first facet 504, and optionally, a second facet 505, which are easy to process because they are flattened areas. A third facet 506 may be avoided.

Figure 5C:
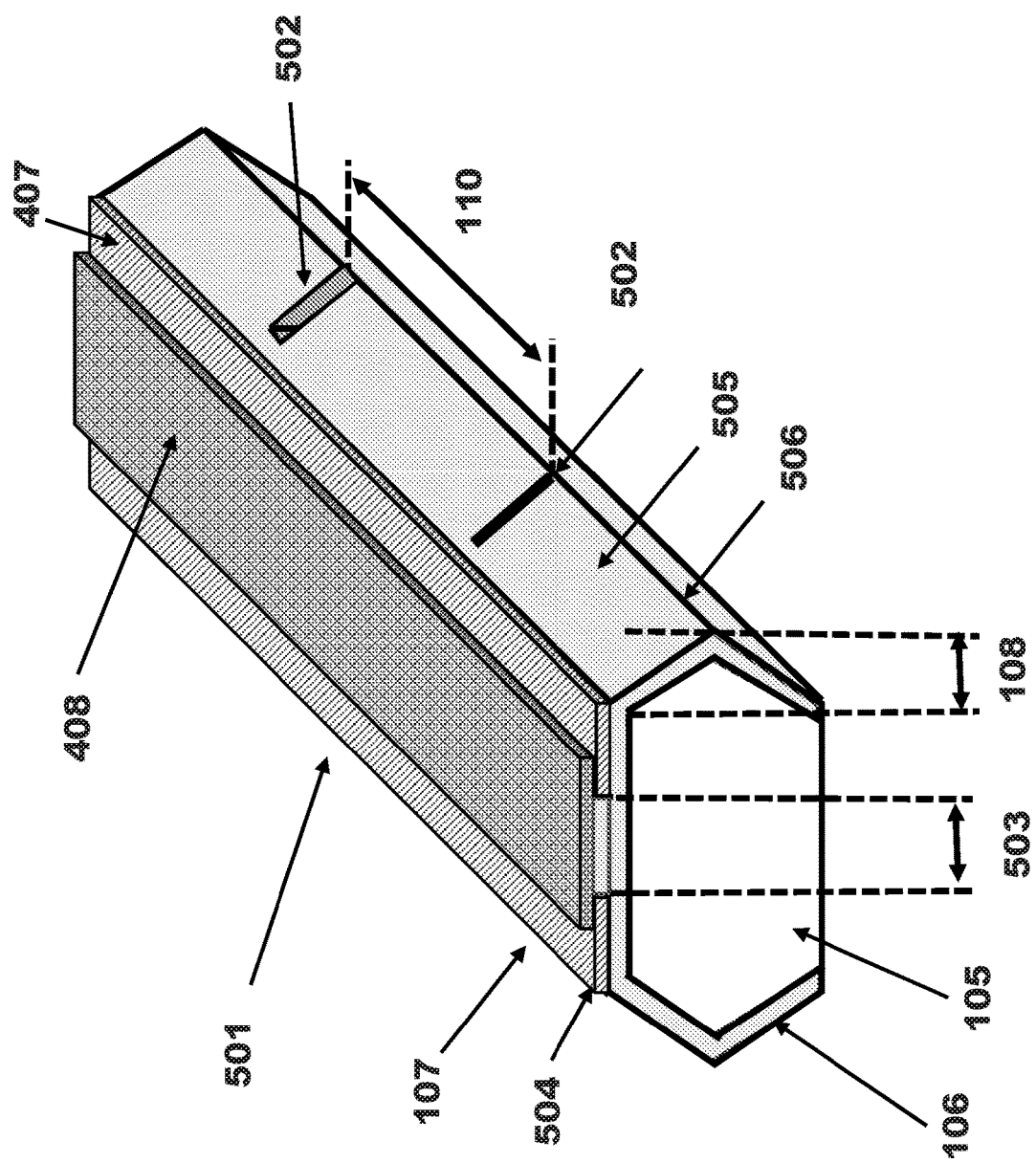

As shown in FIG. 5(c), it may be preferable that the dividing support region 502 is formed only at the second facet 505, in which case, it must use the small width of the island-like III-nitride-based semiconductor layers 109. In this case, it can divide the bar 501 of the device 110 precisely.

Figure 5D:
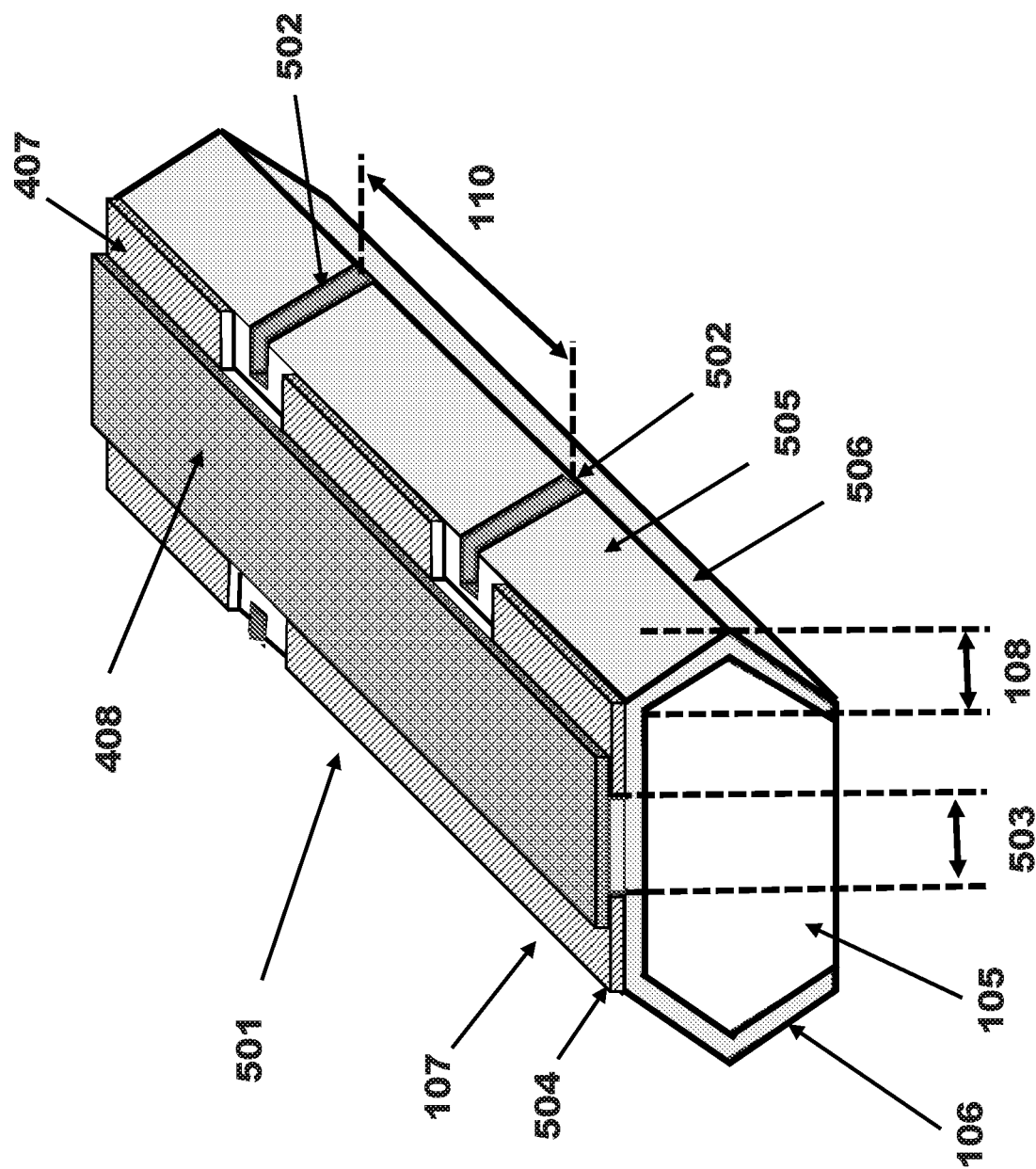

Moreover, as shown in FIG. 5(d), the p-electrode 408, dielectric layer 407, and p-pad for wire bonding and so on, can avoid the dividing support region 502. By doing this, FIG. 6(a) is changed like FIG. 6(b).

As shown in the SEM images of FIGS. 7(a) and 7(b), the back side of the bar 501, after being removed, has two different portions: one is a separate area that is between the two dashed white lines; another is a wing region that is outside of the separate area. The two different portions have different surface morphologies, which might be an opportunity to prevent the cleave line from going straight. Besides, there are some fluctuation within the wing region due to the interaction between the mask and the back-side surface of the island-like III-nitride semiconductor layers.

Therefore, it is preferable that the dividing support region 502 be formed on the first facet 504 and/or second facet 505, as shown in FIGS. 5(b), 5(c) and 5(d). By doing this, the shape of the dividing support region 502 is formed uniformly. It is much preferable that the blade for breaking the bar 501 contact the back-side of the bar 501. By doing this, the cleaving starts from the dividing support region 502 at the top surface of the bar 501.

Step 5: Dissolving the Growth Restrict Mask by Wet Etching

The method may further comprise a step of removing, by dissolving using a wet etchant, at least a portion of, or preferably almost all of, or most preferably all of, the growth restrict mask 102.

The growth restrict mask 102 is removed using a chemical solution, such as hydrofluoric acid (HF) or buffered HF (BHF). This allows the devices 110 to be easily removed from the substrate 101. This process would better be conducted before removing the III-nitride epi-layers 105, 106, 109 from substrate 101. It also would better be conducted before processing the device 110 in Step 3.

Step 6: Removing the Bar of the Device from the Substrate

From here, the procedure of removing the bar 501 is explained using FIGS. 8(a), 8(b), 8(c), 8(d), 8(e), 8(f) and 8(g).

Step 6.1 comprises attaching a polymer film 801 to the bar 501 of the device 110, as shown in FIG. 8(a). In this embodiment, the polymer film 801 is comprised of a base film 802, an adhesive 803 and a backing film 804.

Step 6.2 comprises applying pressure 805 to the polymer film 801 and the substrate 101 using plates 806, as shown in FIG. 8(h). The aim of applying pressure 805 is to put the polymer film 801 in-between the bars 501 of the devices 110. The polymer film 801 is softer than the bars 501 of the devices 110, so the polymer layer 801 can easily surround the bars 501 of the devices 110. Preferably, the polymer layer 801 is heated in order to soften it, which makes it easy for the polymer film 801 to cover the bars 501 of the devices 110.

Step 6.3 comprises reducing the temperature of the polymer film 801 and the substrate 101, while maintaining the applied pressure 805. It is not necessary to apply pressure 805 during the changing of the temperature.

Step 6.4 comprises utilizing the differences in thermal coefficients between the polymer film 801 and the substrate 101 for removing the bars 501 of the devices 110.

Figure 8C:
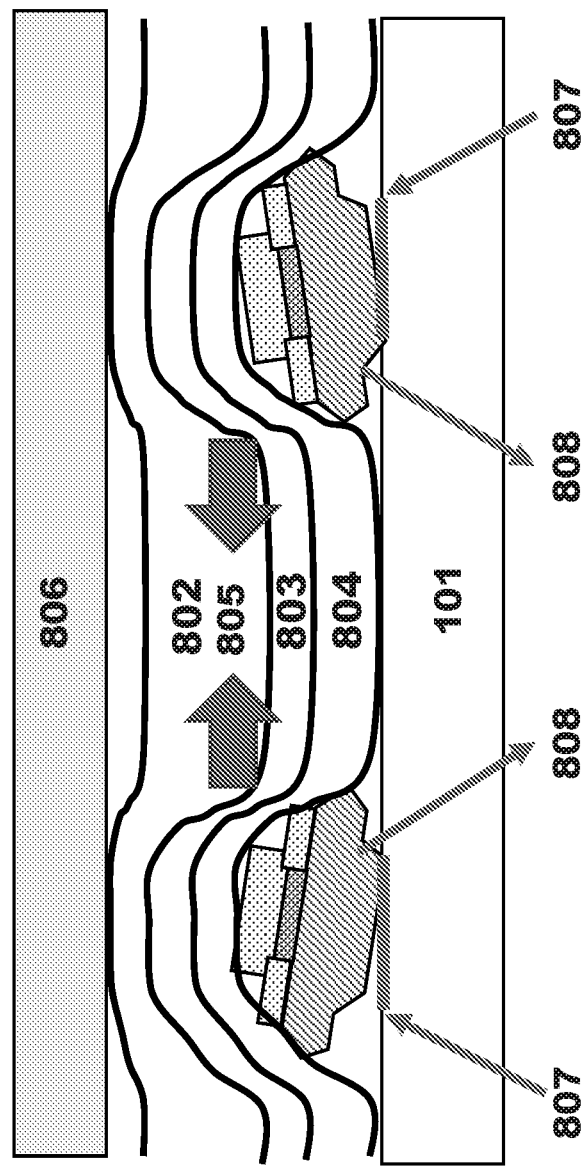

As shown in FIG. 8(c), the polymer film 801 shrinks as the temperature decreases. As a result, the bottom of the polymer film 801 is lower than the top of the bars 501 of the devices 110, as shown in FIG. 8(d).

As shown in FIG. 8(c), the polymer film 801 can apply the pressure 805 in the horizontal direction at side facets of the bars 501 of the devices 110, exposing cleaving points 807 and tilting the bars 501 of the devices 110 downward obliquely 808. This pressure 805 applied from the side facets allows the bars 501 of the devices 110 to be effectively removed from the substrate 101. During low temperature, the polymer film 801 maintains the applied pressure 805 from the top of the polymer film 801 to the bars 501 of the devices 110.

Various methods may be used to reduce the temperature. For example, the substrate 101 and the polymer film 801 can be placed into liquid $N_2$ (for example, at 77° K) at the same time while applying pressure 805. The temperature of the substrate 101 and the polymer film 801 can also be controlled with a piezoelectric transducer. Moreover, the plate 806 that applies the pressure 805 to the polymer film 801 can be cooled to a low temperature before and/or during contact with the polymer film 801. By doing this, the polymer film 801 is cooled and can apply pressure 805 to the bars 501 of the devices 110 due to a large thermal expansion coefficient.

When reducing the temperature, the substrate 101 and the polymer film 801 may be wetted by atmospheric moisture. In this case, the temperature reduction can be conducted in a dry air atmosphere or a dry $N_2$ atmosphere, which avoids the substrate 101 and the polymer film 801 getting wet.

Thereafter, the temperature increases, for example, to room temperature, and the pressure 805 is no longer applied to the polymer film 801. At that time, the bars 501 of the devices 110 have already been removed from the substrate 101, and the polymer film 801 is then separated from the substrate 101. As shown in FIG. 8(e), when using a polymer film 801, especially a polymer film 801 having adhesive 803, the bars 501 of the devices 110 can be removed using the polymer film 801 in an easy and quick manner.

As shown in FIG. 8(f), there may be an occasion having a different height t among the bars 501 of the devices 110, depending on a growth condition. In this case, the removal method with the polymer film 801 is good at removing the different height bars 501 of the devices 110, because these films 801 are flexible and soft, as shown in FIG. 8(g).

The Method of Removing the Bar

Utilizing the different thermal expansion coefficients between the polymer film 801 and the semiconductor material of the devices 110, pressure in the horizontal direction pressure is applied uniformly to the whole substrate 101. The bars 501 of devices 110 can be removed from the substrate 101 without breaking the bars 501 of the devices 110. This has been proven by the high yields achieved in removing the bars 501.

As shown in the SEM images of FIGS. 9(a), 9(b), 10(a), 10(b), 10(c), 10(d) and 10(e), this method can remove the bar 501 of the device 110 from many different substrate 101 planes, such as (1–100) just, (20–21), (20–2–1), and (0001). In these examples, the length of the bar 501 is about 1.2 mm. Moreover, even though the (20–21) and (20–2–1) planes are not cleaved facets of the bulk GaN substrate 101, this method can remove the bar 501 without breaking the bar 501 in an easy manner. In other words, the advantage of this method is that the bar 501 can be removed from different substrate 101 planes with the same method, because this method does not depend on the substrate 101 plane. More preferably, it can utilize the cleavage of the m-plane on the GaN crystal when removing the bar 501. In the case where the substrate 101 is not an m-plane substrate 101, such as (20–21), (20–2–1) or (0001), the surface of the separate area after the removal contained m-plane as part of its surface, and the bar 501 can be removed by the lesser pressure.

Figure 11B:
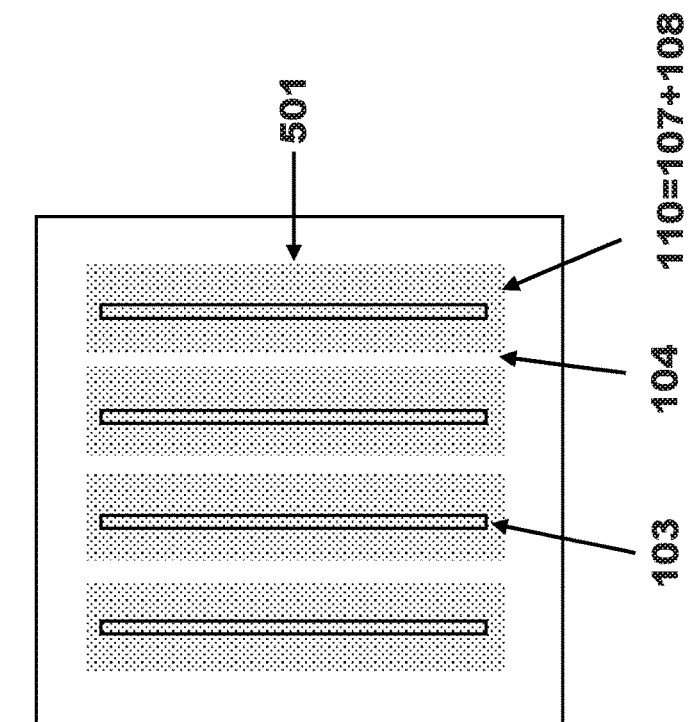
FIGS. 11(a) and 11(b) illustrate a growth restrict mask used for multiple bars of multiple devices, according to one embodiment of the present invention.
Figure 11A:
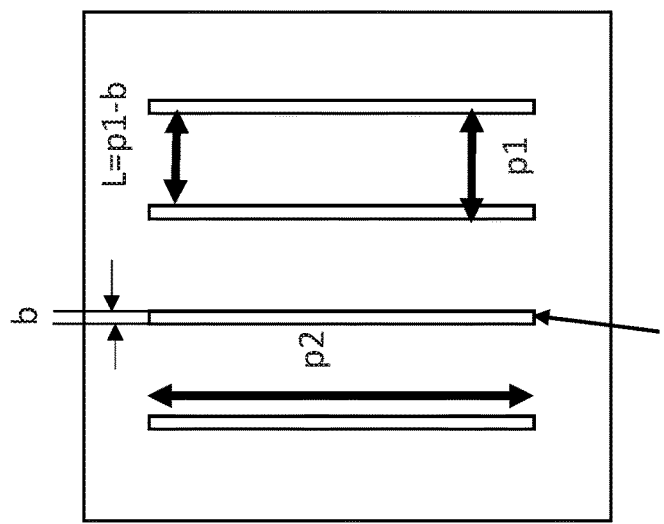

The bar 501 of the device 110 is a rectangular shape with long sides and short sides, as shown in FIGS. 11(a) and 11(b). Pressure is applied to the bar 501 of the device 110 having such a shape from a vertical direction and in a horizontal direction against the long side of the bar 501, as shown in FIG. 8(c). By doing this, an effective impact can be given to the cleaving point 807, which removes the bars 501 of the devices 110 from the substrate 101. The growth restrict mask 102 is preferably eliminated from the substrate 101 by wet etching, etc., before attaching the polymer film 801 to the bars 501 of the devices 110. Eliminating the growth restrict mask 102 makes a space to apply pressure at the cleaving point 807 underneath the bars 501 of the devices 110, which can tilt the bars 501 of the devices 110 obliquely downward 808 as shown in FIG. 8(c).

This method using the polymer film 801 can apply the pressure 805 to the bars 501 of the devices 110 uniformly across a large area and in the proper amount. Selecting the kind of polymer film 801 and/or the temperature, and the ramp-up and/or ramp-down rate of the temperature, can control the amount of pressure 805 applied to the bars 501 of the devices 110. In addition, this invention is not limited by the ramp-up and/or ramp-down rate of the temperature, and a thermosetting resin film may be used to remove the bars 501 of the devices 110 when raising the temperature. Again, this results in a high yield for removing the bars 501.

In mass production, it is occasionally difficult to remove every bar 501 of a device 110 on a substrate 101, especially one with a wide area. Sometimes, there is an occasion where some bars 501 of the devices 110 remain on the substrate 101 after the removal of one or more bars 501 of the devices 110. In the prior art method described above, it is hard to repeat a removal process due to a metal bonding process between a wafer and a support metal.

On the other hand, this removal method of using the polymer film 801 and the substrate 101 with the ELO GaN-based layers 105 can be repeated many times. When some bars 501 of the devices 110 remain on the substrate 101, repeating this method allows the remaining bars 501 of the devices 110 to be removed from the substrate 101 completely.

Since this removal method does not include a catastrophic process, such as metal bonding, it can be a repeatable process. By repeating this removal method, almost all of the bars 501 of the devices 110 can be removed from the substrate 101, including substrates 101 such as 2 inch, 4 inch or other wafer sizes.

Cleaving at a Separate Area of the m-Plane

The cleaving method utilizing the m-plane facet is explained here. FIGS. 7(a) and 7(b) show SEM images of the backside of a bar of a device 110 after being removed and the surface of the substrate 101 after removing the bar 501 of the device 110, for the (1–100) just, (20–21), and (20–2–1) planes, respectively. It can be seen that the backside of the bar 501 for the (1–100) just plane is relatively smooth surface, as shown in FIG. 7(a) and enlarged in FIG. 7(b), as is the surface of the substrate 101 after removing the bar 501 for the (1–100)-plane, as compared to the other planes.

Figure 12:
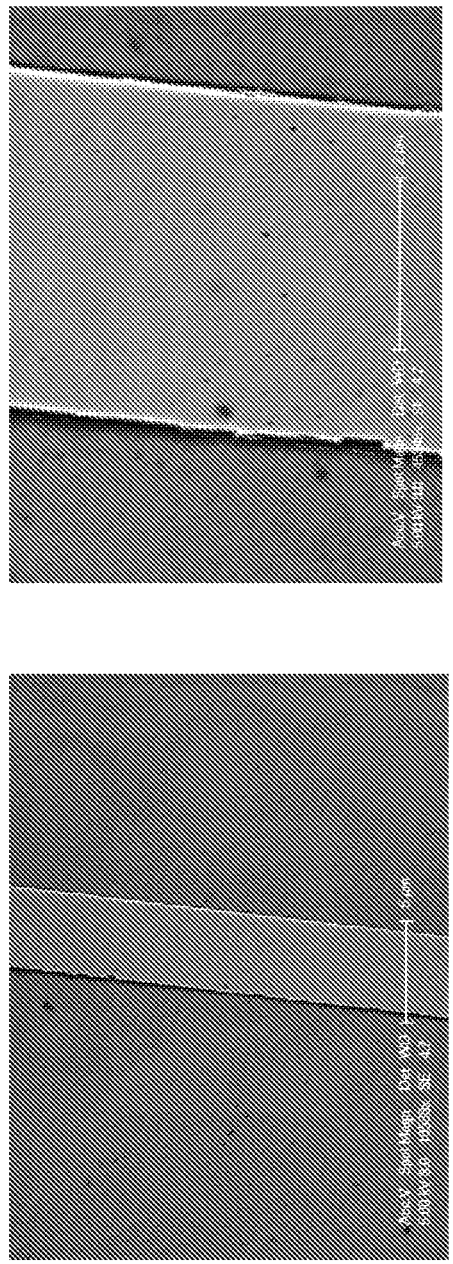
FIG. 12 shows SEM images of a very smooth surface for a (1–100) plane without a mis-cut orientation after a bar of a device is removed.
Figure 13:
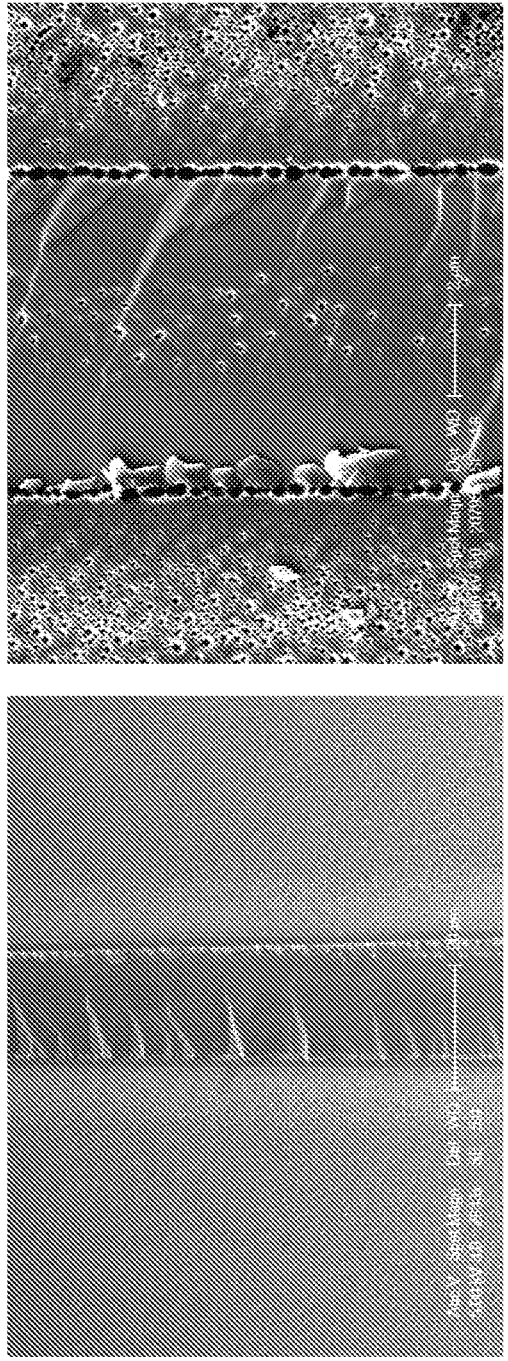
FIG. 13 shows SEM images of a surface of a substrate after removing a bar of a device for a (0001) plane with a mis-cut orientation of 0.7 degrees towards the m-plane.

As shown in the images of FIG. 12, it is possible to obtain a very smooth surface for the (1-100) plane without a mis-cut orientation after the bar 501 of the device 110 is removed, wherein the surface is smooth enough to be used as a facet for a VCSEL. As shown in the images of FIG. 13, the surface of the substrate 101 after removing the bar 501 of the device 110 is pitted for the (0001) plane with a mis-cut orientation of 0.7 degrees towards the m-plane.

As shown in FIGS. 7(a) and 7(h), the backside of the bar 501 of the device 110 for the semipolar (20-21) and (20-2-1) planes had periodic concavity and convexity. In these results, the interface at the cleaving point was an m-plane facet. The cleaving interface was measured using a Laser Scanning Confocal Microscope (LSCA).

Figure 14:
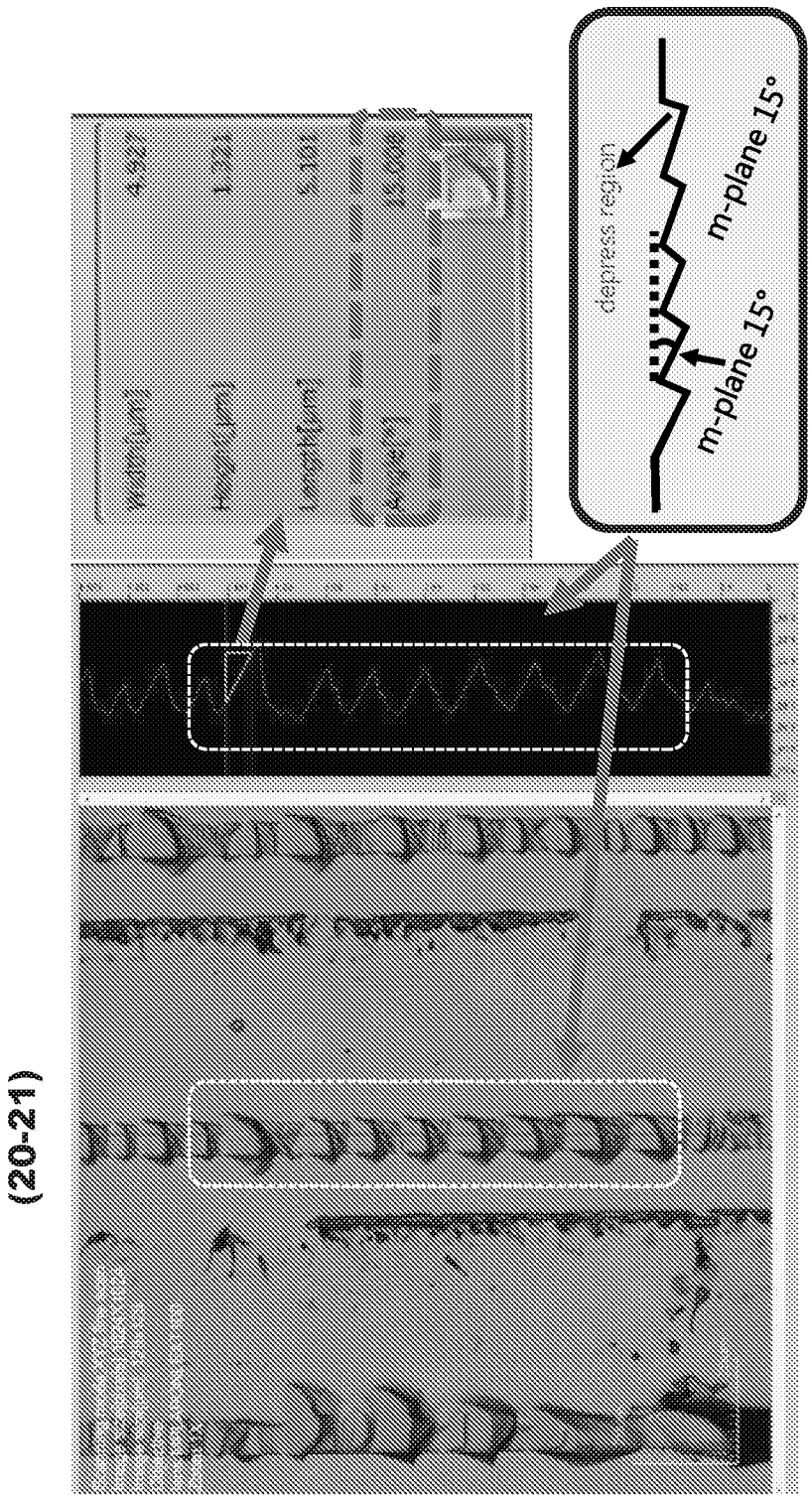
FIG. 14 shows SEM images and material properties for a surface of a (20–21) free standing GaN substrate after removing a bar of a device.

The images of FIG. 14, which include measurements by the SLCM, shows the surface of the (20-21) free standing GaN substrate 101 after removing the bar 501 of the device 110. The surface of the depressed region is tilted 15 degrees from the surface of the (20-21) substrate 101, wherein the surface of the (20-21) substrate 101 is tilted 15 degrees from the m-plane. Therefore, the surface of the depressed region is an m-plane. The m-plane of bulk GaN is well known as a facet with high cleavage, and utilizing the cleavage of m-plane for removing the bar 501 is very important and useful. The method of removing the bar 501 can effectively utilize the cleavage of the m-plane, even though the semipolar (20-21) substrate 101 does not have the in-plane as a main surface.

As shown in FIG. 14, it is preferable that the bar 501, which comprises semipolar III-nitride-based semiconductor layers, has a periodic concavity and convexity shape after being removed from the substrate 101. By being separated in this way, the bar 501 can avoid excess and non-uniform pressure. Consequently, the bar 501 can be divided from the substrate 101 without being broken into a short size. It is much preferable that the backside of the bar 501 comprised of semipolar III-nitride-based semiconductor layers has m-plane at least as part of the back surface. The method could be adopted for different semipolar planes in the same way, which is industrially important.

Cleaving at a Separate Area of the c-Plane

Figure 10D:
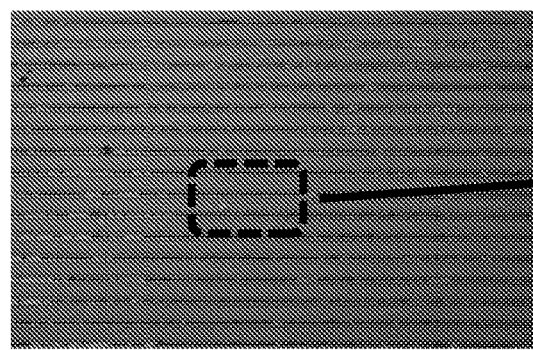
FIGS. 10(a), 10(b), 10(c), 10(d) and 10(e) are SEM images of a bar of a device from a c-plane (0001) substrate plane.
Figure 10E:
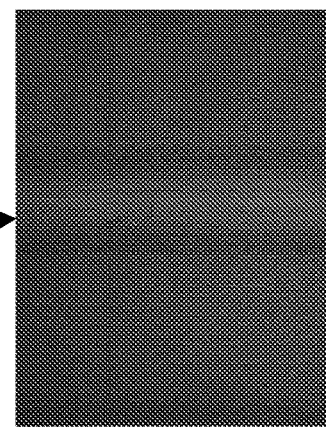
Figure 10C:
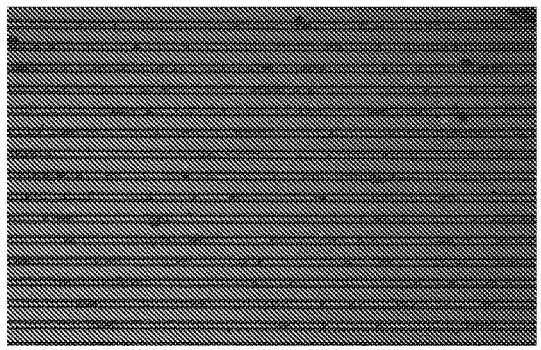
Figure 10A:
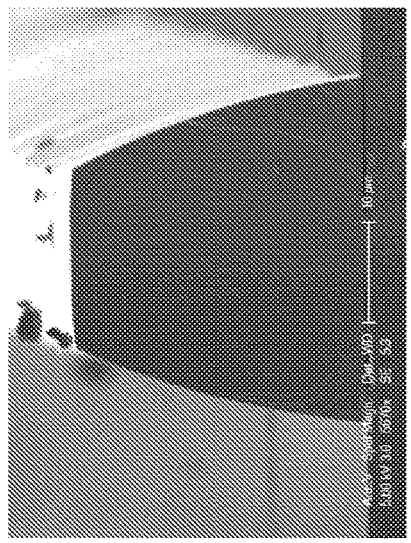

The present invention also attempted this removal method on a c-plane GaN substrate 101, as shown in FIG. 10(a).

Figure 10B:
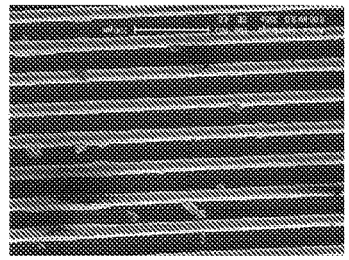

As shown in FIGS. 10(b) and 10(c), the growth restrict mask 102 and opening areas 103 are designed as shown in FIG. 11(a) without a separating region. The length of the long side of the opening area 103 is set to be 15 mm.

The image of FIG. 10(d), which is enlarged in FIG. 10(e), shows the surface of the substrate 101 after removing the bar 501 of the device 110. The c-plane is one of the cleavage planes in bulk GaN, so the separate area on the back side of the bar 501 was very smooth. This shows that this removing method can also be used with a c-plane GaN substrate 101.

Step 7: Fabricating an n-Electrode at the Separate Area of the Device

Steps 7, 8, 9 and 10 are illustrated by FIGS. 15(a)-15(f), 16(a)-16(h) and 17.

Figure 15A:
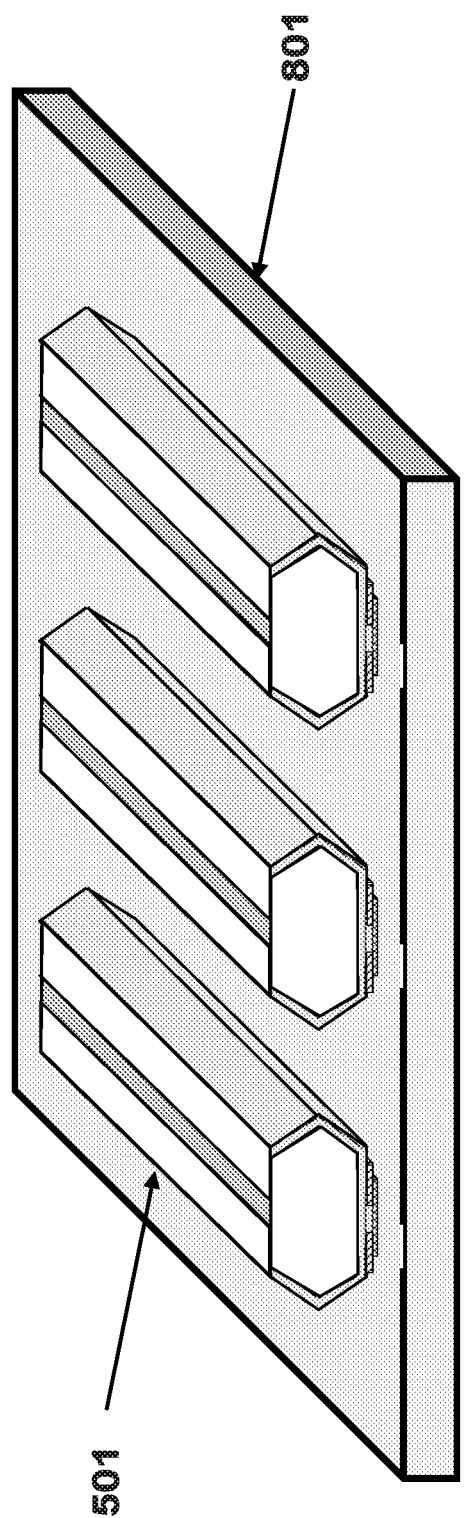
FIGS. 15(a), 15(b), 15(c), 15(d), 15(e) and 15(f) illustrate a procedure for dividing a bar of a device after the bar has been removed from a substrate using a polymer tape, according to one embodiment of the present invention.

After removing the bar 501 from the substrate 101, the bar 501 remains attached to the polymer film 801, which is shown with the bar 501 positioned in an upside-down manner on the film 801, as shown in FIG. 15(a).

Figure 15B:
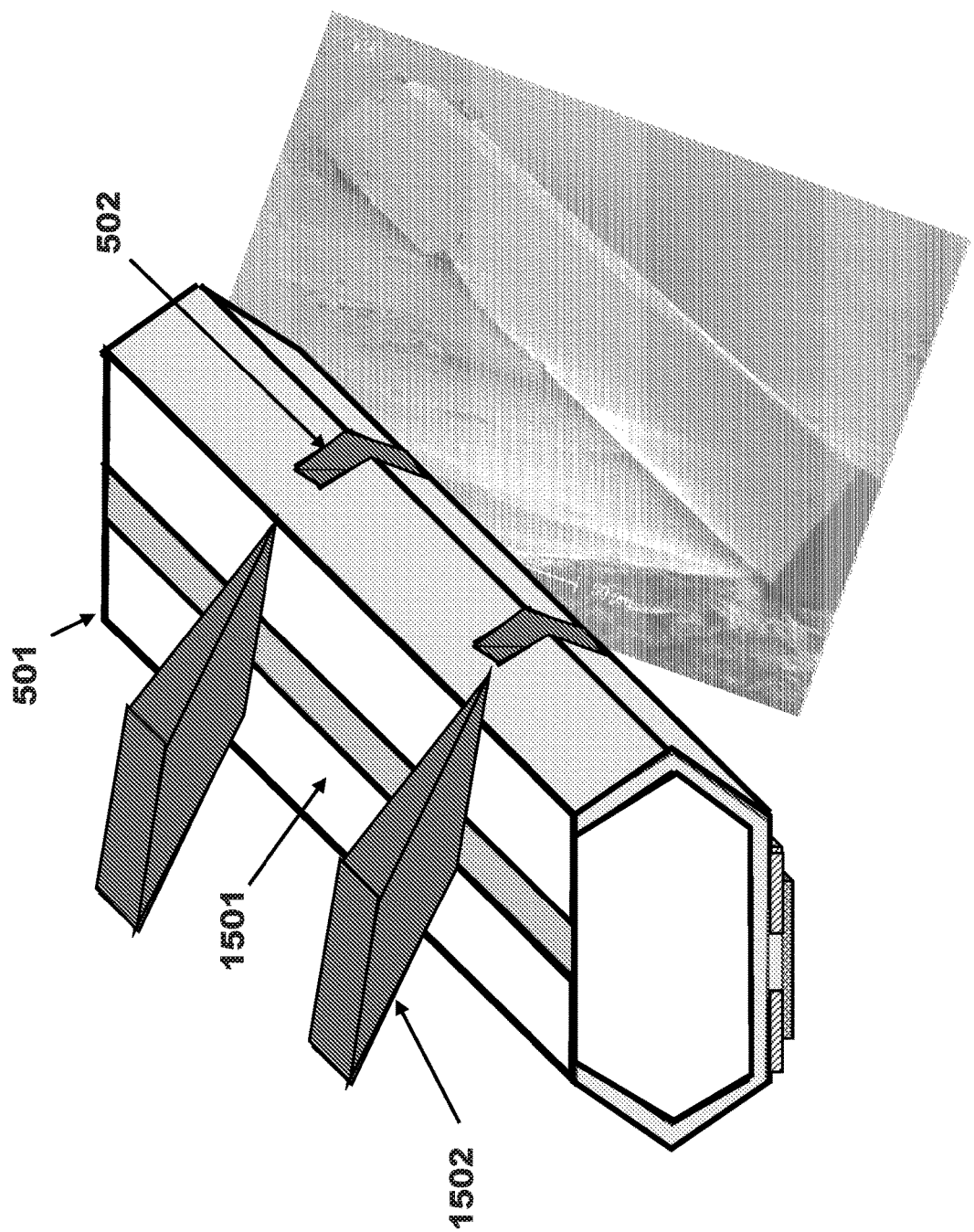

FIG. 15(b) shows the back side of the bar 501, both as a schematic and an SEM image, which has a separate area 1501 between the dividing support regions 502. The separate area 1501 contacts the substrate 101, or the underlying layer directly, but is not on the growth restrict mask 102. Cleaving blades 1502 are used at the dividing support regions 502.

Figure 15C:
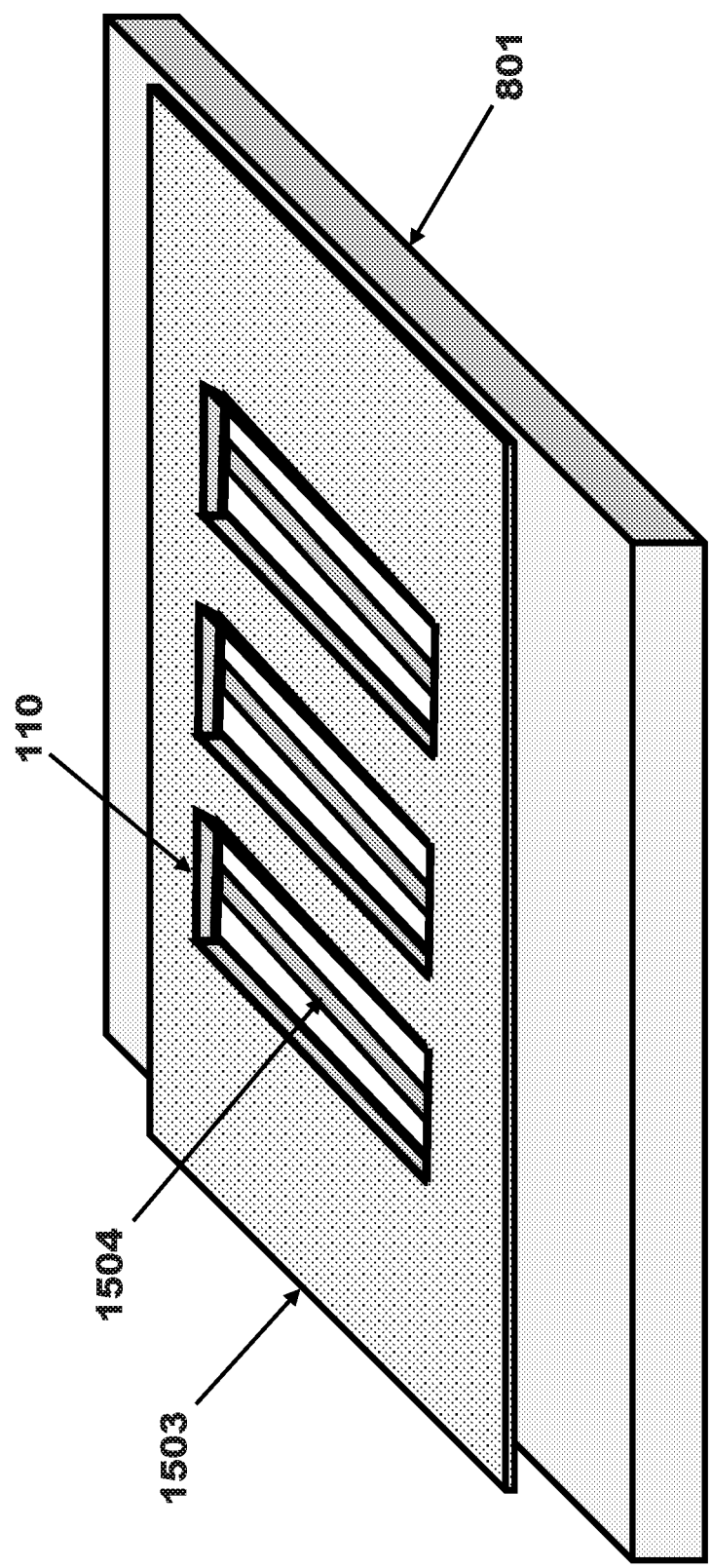

Then, as shown in FIG. 15(c), a metal mask 1503 can be used to dispose an n-electrode 1504 on the back side of the device 110.

In the case of forming the n-electrode 1504 of back side of the bar 501 after removing the bar 501 from the substrate 101, the n-electrode 1504 is preferably formed on the separate area 1501, This separate area 1501 is kept in a good surface condition for the n-electrode 1504 to obtain low contact resistivity. The present invention keeps this area 1501 clean until removing the island-like III-nitride semiconductor layers 109.

The n-electrode 1504 also can be disposed on the top surface of the bar 501, which is the same surface made for a p-electrode 408.

Typically, the n-electrode 1504 is comprised of the following materials: Ti, Hf, Cr, Al, Mo, W, Au. For example, the n-electrode may be comprised of Ti—Al—Pt—Au (with a thickness of 30-100-30-500 nm), but is not limited to those materials. The deposition of these materials may be performed by electron beam evaporation, sputter, thermal heat evaporation, etc.

Step 8: Breaking the Bar into Separate Devices

Figure 15D:
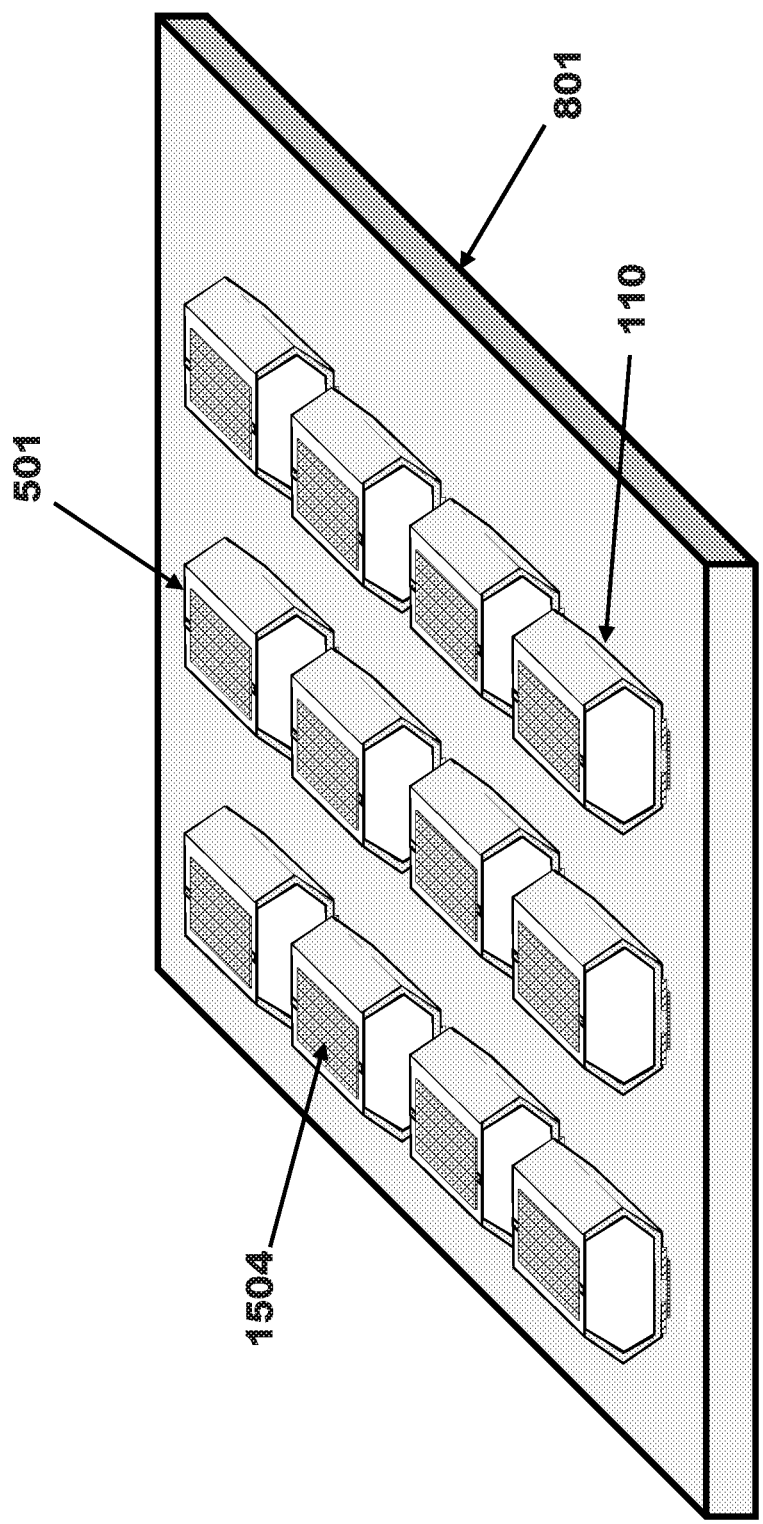

After disposing the n-electrode 1504, each bar 501 is divided into a plurality of devices 110, as shown in FIG. 15(d), The dividing support region 502 helps divide the bar 501 into the devices 110, as shown in FIG. 15(b). A breaking method can be used, as well as other conventional methods, but it is not limited to these methods. It is preferable that the cleaving blade 1502 contact a side of the bar 501 which is not formed by the dividing support region 502, at the position of the dividing support region 502.

As shown in FIG. 16(a), it is possible that multiple bars 501 laterally disposed are both cleaved and broken into separate devices 110 at dividing support regions 502. Moreover, as shown in FIG. 16(b), it is also possible that multiple bars 501 both laterally and longitudinally disposed are cleaved at dividing support regions 502. Further, the dividing support regions 502 may be disposed on both sides 1601 or one side 1602 of the bars 501.

Step 9: Mounting the Device on a Heat Sin, Plate

Figure 15E:
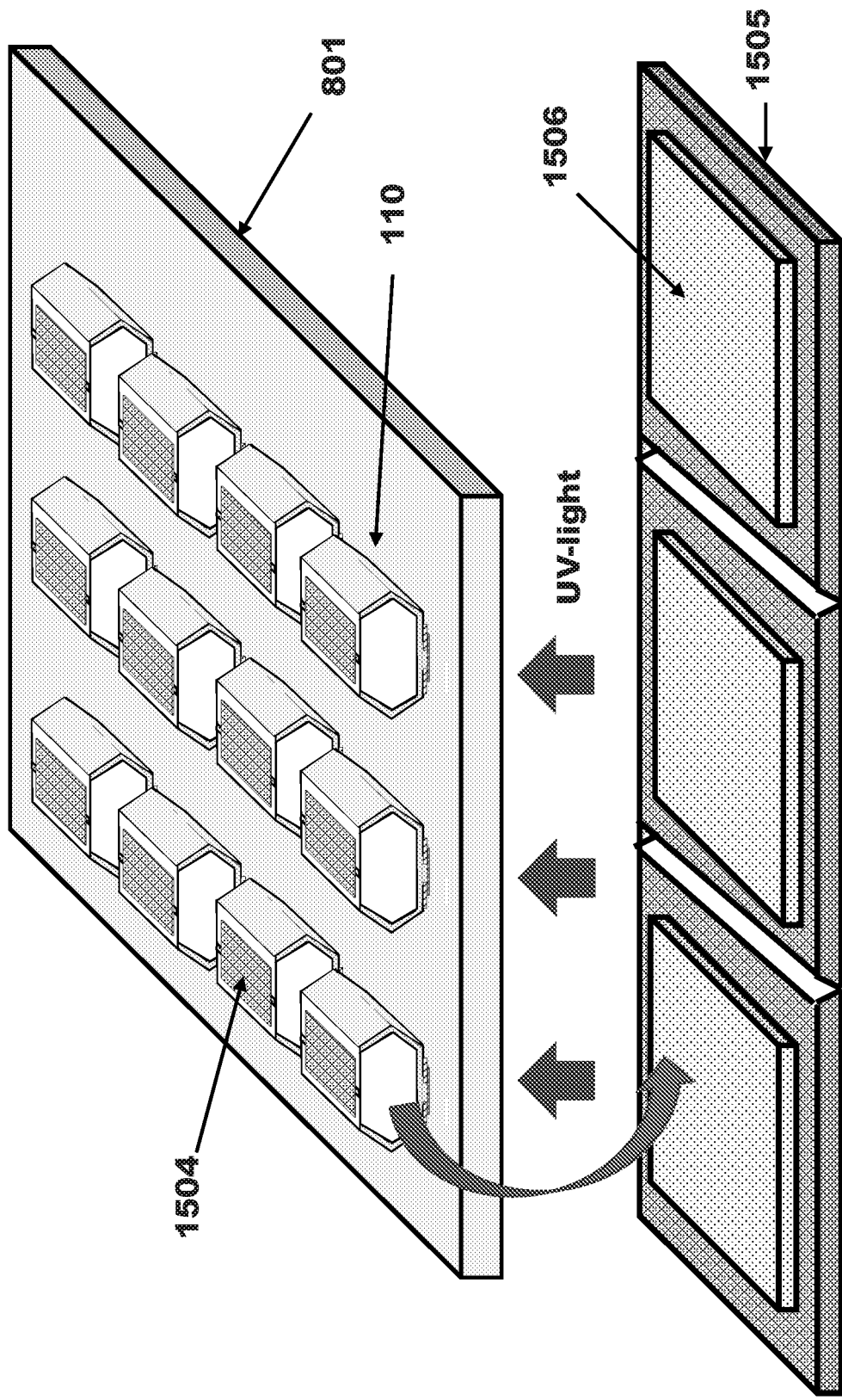

After Step 8, the divided bar 501 is still on the polymer film 801. In one embodiment, the polymer film 801 is an ultraviolet (UV) light-sensitive dicing tape that is exposed to UV light, which can reduce the adhesive strength of the film 801, as shown in FIG. 15(e), This makes it easy to remove the devices 110 from the film 801.

Figure 15F:
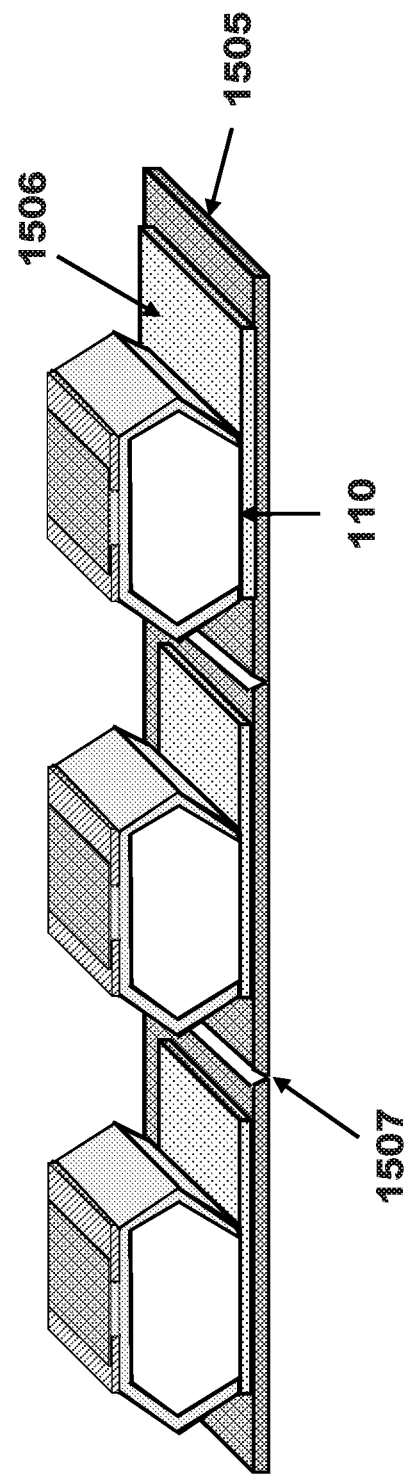

In this step, a heat sink plate 1505 comprised of AlN is prepared. An Au—Sn solder 1506 is disposed on the heat sink plate 1505, the heat sink plate 1505 is heated over the melting temperature of the solder 1506, and the devices 110 on the polymer film 801 are bonded to the heat sink plate 1505 using the Au—Sn solder 1506. The devices 110 can be mounted on the heat sink plate 1505 in two ways: (1) n-electrode 1504 side down or (2) p-electrode 408 side down. FIG. 15(f) shows the devices 110 mounted to the heat sink plate 1505 using the solder 1506 with the n-electrode 1504 side down. Trenches 1507 in the heat sink plate 1505 separate the devices 110, wherein the trenches 1507 are used to divide the heat sink plate 1505, as described in more detail below.

Step 10: Coating the Device

The next step of device processing comprises coating the facets 504 of the device 110. While a laser diode device 110 is lasing, the light in the device 110 that penetrates through the facets 504 of the device 110 to the outside of the device 110 is absorbed by non-radiative recombination centers at the facets 504, so that the facet temperature increases continuously. Consequently, the temperature increase can lead to catastrophic optical damage (COD) of the facet 504.

A facet 504 coating can reduce the non-radiative recombination center. Preventing the COD, it is necessary to coat the facet using dielectric layers, such as AlN, AlON $Al_2O_3$, SiN, SiON, $SiO_2$, $ZrO_2$, $TiO_2$, $Ta_2O_5$ and the like. Generally, the coating film is a multilayer structure comprised of the above materials. The structure and thickness of the layers is determined by a predetermined reflectivity.

Figure 17:
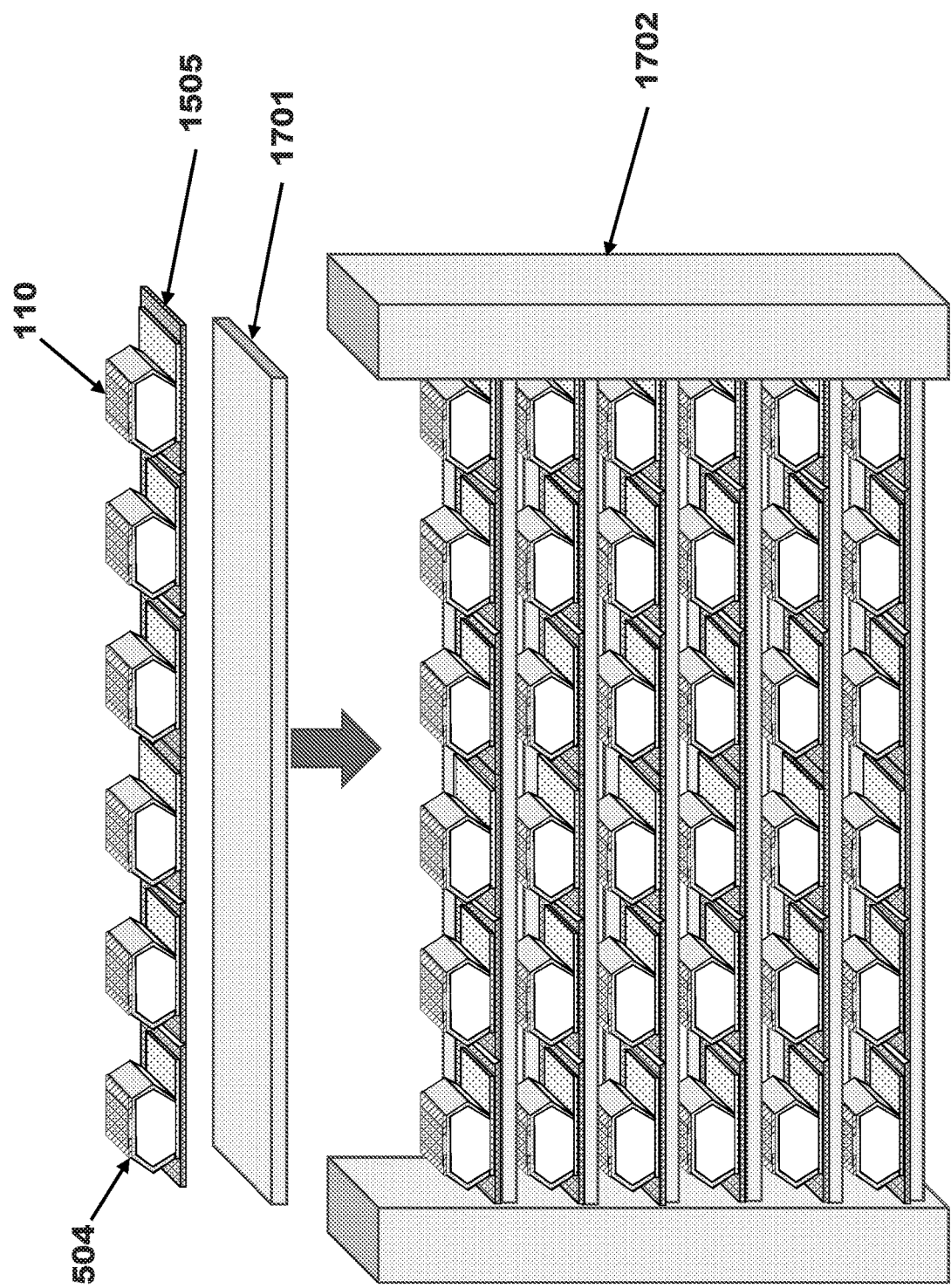
FIG. 17 illustrates a coating process for facets of devices, according to one embodiment of the present invention.

In the present invention, the bar 501 of device 110 may have been divided in Step 8 to obtain cleaved facets 504 for multiple devices 110. As a result, the method of coating the facets 504 needs to be performed on multiple devices 110 at the same time, in an easy manner. In one embodiment, the devices 110 are mounted in a horizontally offset manner on the heat sink plate 1505, e.g., towards one side of the heat sink plate 1505, as shown in FIG. 15(f). Then, as shown in FIG. 17, the devices 110 and the heat sink plate 1505 are placed on a spacer plate 1701, and a plurality of spacer plates 1701 are stored in a coating holder 1702.

Note that it is not always necessary to use a spacer plate 1701, and the heat sink plate 1505 could be used alone. Alternatively, the heat sink plate 1505 could be mounted on another bar or plate, that is then placed on the spacer plate 1701.

By doing this, the facets 504 of a number of devices 110 can be coated simultaneously. In one embodiment, the facet 504 coating is conducted at least two times—once for the front facet 504 of the devices 110 and once for the rear facet 504 of the devices 110. The length of the heat sink plate 1505 may be dimensioned to be about the cavity length of the laser diode device 110, which makes it quick and easy to perform the facet 504 coating twice.

Once the spacer plate 1701 is set in the coating holder 1702, both facets 504 of the devices 110 can be coated without setting the spacer plate 1701 in the coating holder 1702 again. In one embodiment, a first coating is performed on a front facet 504 which emits the laser light, and a second coating is performed on the rear facet 504 which reflects the laser light. The coating holder 1702 is reversed before the second coating in the facility that deposits the coating film. This reduces the lead time of the process substantially.

Step 11: Dividing the Heat Sink Plate

Figure 18C:
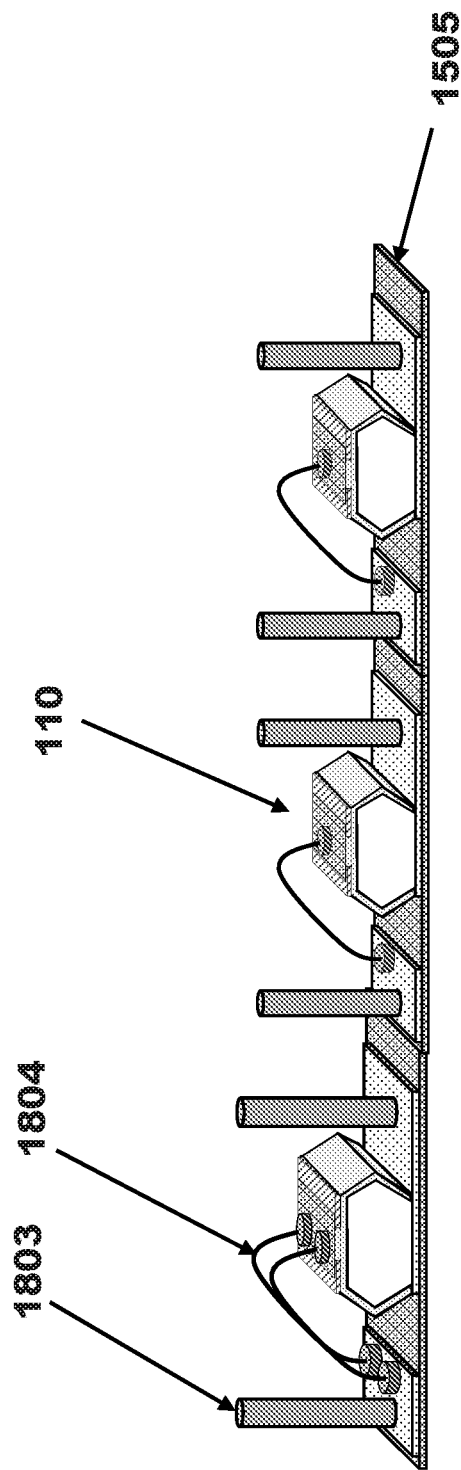

As shown in FIG. 18(a), wire bonds 1801 and 1802 are attached to the devices 110, and then the heat sink plate 1505 is divided at the trenches 1507, for example, between one or more of the devices 110. FIG. 18(b) is a top view of FIG. 18(a) that shows the relative placements and positions of the devices 110, trenches 1507 and bonds 1801, 1802. FIG. 18(c) shows the use of separated probes 1803 and wire bonds 1804 with the devices 110.

FIGS. 19(a) and 19(b) further show how the heat sink plate 1505 is divided to separate the devices 110, which may occur before or after the attachment of the wire bonds 1801, 1802. By doing this, it is easy to separate the devices 110 after the coating process has been completed.

Step 12: Screening the Device

This step distinguishes between defective and non-defective devices 110. First, various characteristics of the devices 110 are checked under a given condition; such as output power, voltage, current, resistivity, FFP (Far Field Pattern), slope-efficiency and the like. At this point, the devices 110 have already been mounted on the heat sink plate 1505, so it is easy to check these characteristics.

Figure 20A:
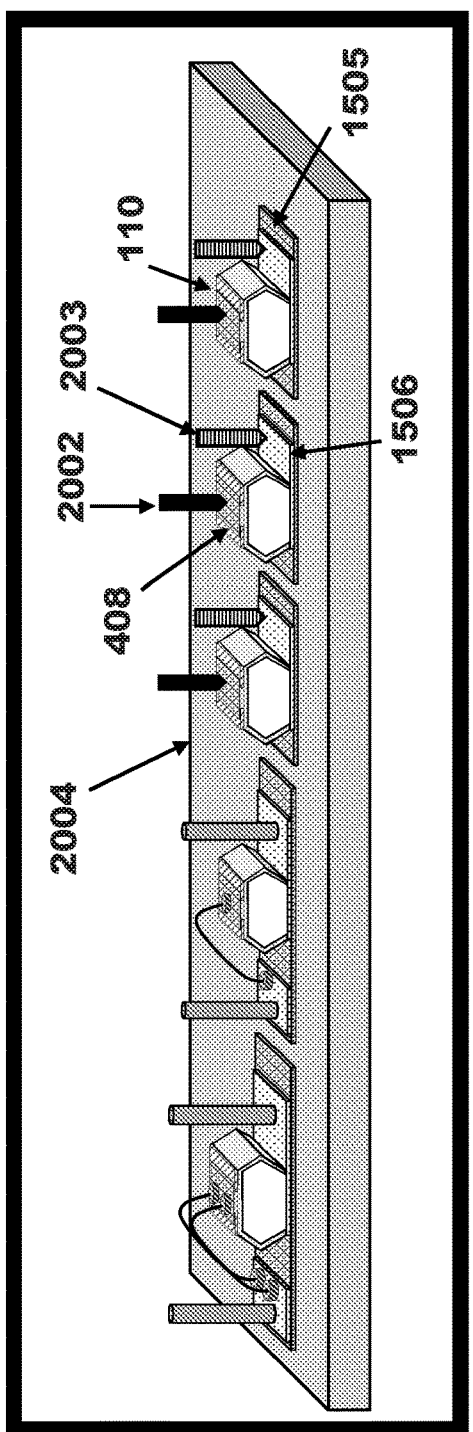
FIGS. 20(a) and 20(b) illustrate a testing apparatus for devices, according to one embodiment of the present invention.
Figure 20B:
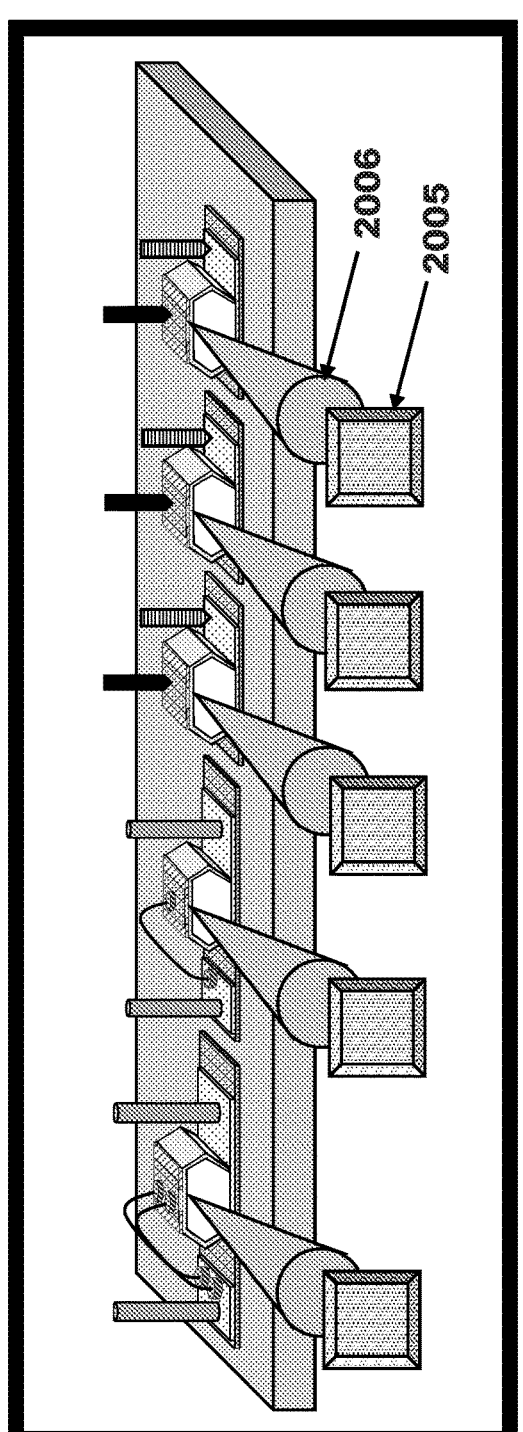

A testing apparatus 2001 is shown in FIGS. 20(a) and 20(b), wherein the p-electrode 408 and the solder 1506, which has an electrical continuity to the n-electrode 1504, are contacted by probes 2002, 2003. Then, non-defective devices can be selected and screened by an aging test (life time test).

In one embodiment, it is preferable that testing apparatus 2001 comprise a box or other container, so that an aging test may be conducted with the devices 110 sealed in a dry air or nitrogen atmosphere. Moreover, a heat stage 2004 may be used to maintain the temperature of the devices 110 during the screening test, for example, 60 degrees, 80 degrees and so on. Photodetectors 2005 may be used to measure light output power 2006, which identifies non-defective devices 110 that have a constant output power, or which identifies defective devices 110.

In particularly, in the case of a III-nitride base semiconductor laser diode device 110, it is known that when a laser diode is oscillated in a moisture-containing atmosphere, it deteriorates. This deterioration is caused by moisture and siloxane in the air, so the III-nitride-based semiconductor laser diode device 110 needs to be sealed in dry air during the aging test.

Figure 21:
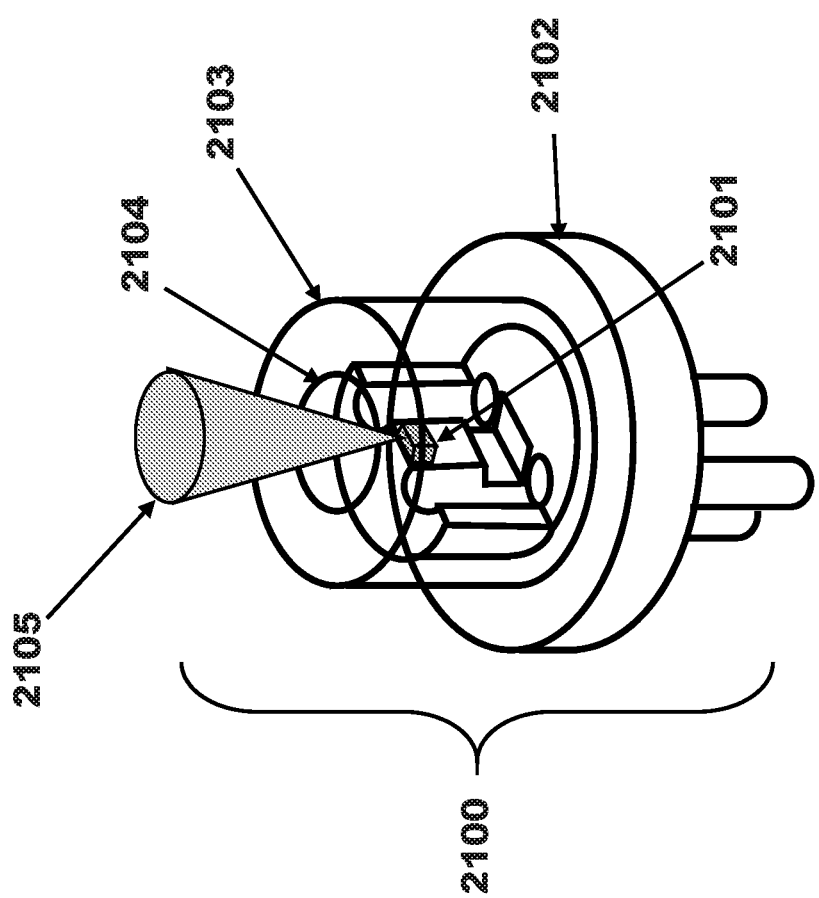
FIG. 21 illustrates a TO-can package for a laser diode device, according to one embodiment of the present invention.

Consequently, as shown in FIG. 21, when a III-nitride-based laser diode 2100 is shipped from a manufacturer, the chip 2101 itself is mounted on a stem 2102 and sealed in a dry air atmosphere using a TO-can package 2103, wherein the package 2103 includes a window 2104 for light emission.

Generally speaking, the screening or ageing tests are conducted before shipping, in order to screen out defective devices 110. For example, the screening condition is conducted according to the specifications of the laser diode device 110, such as a high temperature and a high power.

Moreover, an aging test may be conducted with the device 110 mounted on/into the package 2100, with the package 2100 sealed in dry air and/or dry nitrogen before screening. This fact makes the flexibility of packaging and mounting of the laser device restrictive.

In the prior art, if defective production happens, the defective products are discarded in the whole TO-CAN package 2100, which is a great loss for production. This makes it difficult to reduce the production costs of laser diode devices 110. There is a need to detect defective devices 110 at an earlier step.

In the present invention, coating the facets 504 of the device 110 using a heat sink plate 1505, on which can be mounted a plurality of the devices 110 in a low horizontal position and then, after the coating process, dividing the heat sink plate 1505 and the devices 110 using the trenches 1507, allows the devices 110, with the sub-mount of the heat sink plate 1505, to be checked in the screening test in a dry air or nitrogen atmosphere.

When doing the screening test, the devices 110 already has two contacts, namely the p-electrode 408 and the solder 1506 on the heat sink plate 1505, or in the case of flip-chip bonding, the n-electrode 1504 and the solder 1506 on the heat sink plate 1505. Moreover, the present invention can select defective products using the screening test, when the device 110 is only comprised of the chip and the sub-mount. Therefore, in the case of discarding the defective products, the present invention can reduce the loss more than the prior art, which has great value.

In the case of screening of high power laser diode devices 110, it may be preferable that the heat sink plate 1505 has two parts of solder 1506 disposed without electrical continuity. One part of solder 1506 is connected to the p-electrode 408 with a wire (not shown), and another part of solder 1506 is connected to the n-electrode 1504 with a wire (not shown). Moreover, it may be preferable that the p-electrode 408 and n-electrode 1504 are connected by two or more wires to the solder parts 1506, for example, as shown in FIG. 18(c), which shows the p-electrode 408 connected by two or more wires 1804 to the solder 1506. In this way, the probes 1803 for applying current to the device 110 can avoid contacting the p-electrode 408 (or n-electrode 1504) directly, which, in the case of screening of a high-power laser diodes, is critical. Specifically, the probes 1803 could break the contacted parts, in particular, in the case of applying a high current density.

Step 13: Mounting the Devices on/into the Packages

Figure 22:
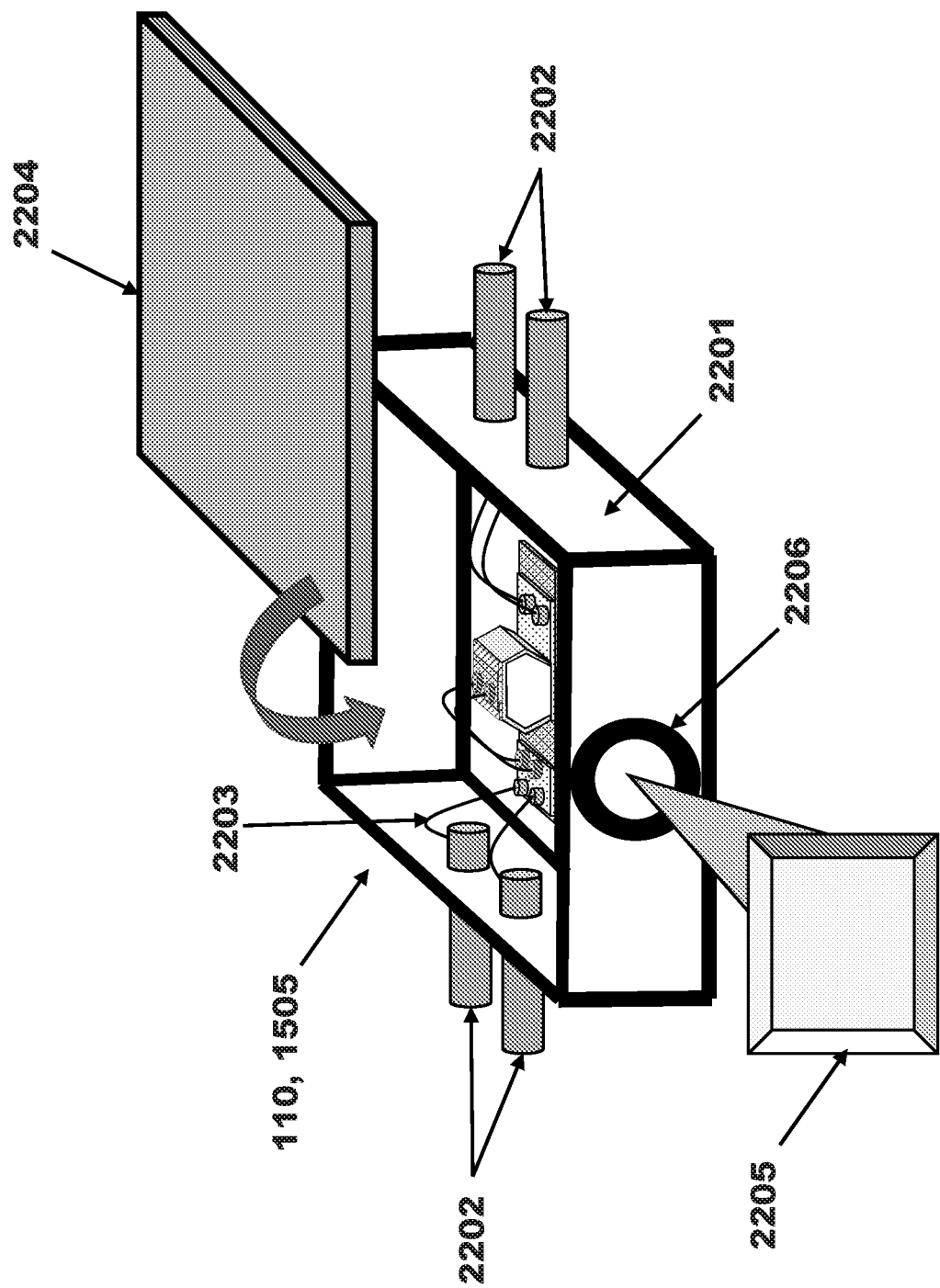
FIG. 22 illustrates a package for a device, including a heat sink plate, according to one embodiment of the present invention.

As shown in FIG. 22, the device 110 (including the heat sink plate 1505) may be mounted in a package 2201 using solder or another metal to bond the device 110 at the bottom of the package 2201. Pins 2202 of the package 2201 are connected to the device 110 by wires 2203. By doing this, current from an external power supply can be applied to the device 110.

This is more preferable than bonding between the package 2201 and the heat sink plate 1505 using a metal, such as Au—Au, Au—In, etc. This method requires a flatness at the surface of package 2201 and at the back side of the heat sink plate 1505. However, without the solder, this configuration accomplishes a high thermal conductivity and low temperature bonding, which are big advantages for the device process.

Thereafter, a lid 2204 may enclose the package 2201. Moreover, a phosphor 2205 can be set outside and/or inside the package 2201, with a window 2206 allow the light emission to exit the package 2201. By doing this, the package 2201 can be used as a light bulb or a head light of an automobile.

As set forth herein, these processes provide improved methods for obtaining a laser diode device 110. In addition, once the device 110 is removed from the substrate 101, the substrate 101 can be recycled a number of times. This accomplishes the goals of eco-friendly production and low-cost modules. These devices 110 may be utilized as lighting devices, such as light bulbs, data storage equipment, optical communications equipment, such as Li-Fi, etc.

It is difficult to package with a plurality of different types of laser devices 110 in one package 2201. However, this method can overcome this issue, due to being able to perform an aging test without the packaging. Therefore, it is easy to mount the different types of devices 110 in one package 2201.

Fabricating an LED Device

In the case of fabricating an LED device, the same process may be used until Step 3. This discussion explains briefly how to make two types of LEDs. A type 1 LED has two electrodes (a p-electrode and an n-electrode) on one side of the chip, whereas a type 2 LED has electrodes on opposite sides of chip.

First, in the case of the type 1 LED, the p-electrode and n-electrode are formed in Step 3 on the top surface of the device. Then, from Step 4 to Step 8 is the same process. In Step 9, the removed chips are mounted on packages and heat sink plates. The backside surface of the chips, the package and the heat sink plate, are bonded using an Ag paste.

Second, in the case of the type 2 LED, almost the same process is used until Step 10, where an ITO electrode is formed on the p-GaN contact layer. In this case, the method of dividing the bar is same. Moreover, it is preferable that the layer bending region is eliminated.

Definitions of Terms

III-Nitride-Based Substrate

The III-nitride-based substrate 101 may comprise any type of III-nitride-based substrate, as long as a III-nitride-based substrate enables growth of III-nitride-based semiconductor layers 105, 106, 109 through a growth restrict mask 102, any GaN substrate 101 that is sliced on a {0001}, {11–22}, {1–100}, {20–21}, {20-2-1}, {10–11}, {10-1-1} plane, etc., or other plane, from a bulk GaN and AlN crystal can be used.

Hetero-Substrate

Moreover, the present invention can also use a hetero-substrate 201. For example, a GaN template 202 or other III-nitride-based semiconductor layer 202 may be grown on a hetero-substrate 201, such as sapphire, Si, GaAs, SiC, etc., prior to the growth restrict mask 102, The GaN template 202 or other III-nitride-based semiconductor layer 202 is typically grown on the hetero-substrate 201 to a thickness of about 2-6 μm, and then the growth restrict mask 102 is disposed on the GaN template 202 or other III-nitride-based semiconductor layer 202.

Growth Restrict Mask

The growth restrict mask 102 comprises a dielectric layer, such as $SiO_2$, SiN, SiON, $Al_2O_3$, AlN, AlON, $MgF$, $ZrO_2$, etc., or a refractory metal or precious metal, such as W, Mo, Ta, Nb, Rh, Ir, Ru, Os, Pt, etc. The growth restrict mask may be a laminate structure selected from the above materials. It may also be a multiple-stacking layer structure chosen from the above materials.

In one embodiment, the thickness of the growth restrict mask is about 0.05-3 μm. The width of the mask is preferably larger than 20 μm, and more preferably, the width is larger than 40 The growth restrict mask is deposited by sputter, electron beam evaporation, plasma-enhanced chemical vaper deposition (PECVD), ion beam deposition (IBM etc., but is not limited to those methods.

On an m-plane free standing GaN substrate 101, the growth restrict mask 102 shown in FIGS. 11(a) and 11(b) comprises a plurality of opening areas 103, which are arranged in a first direction parallel to the 11–20 direction of the substrate 101 and a second direction parallel to the 0001 direction of the substrate 101, periodically at intervals p1 and p2, respectively, extending in the second direction. The length a of the opening area 103 is, for example, 200 to 35000 μm; the width b is, for example, 2 to 180 μm; the interval p1 of the opening area 102 is, for example, 20 to 180 μm; and the interval p2 is, for example, 200 to 35000 μm. The width b of the opening area 103 is typically constant in the second direction, but may be changed in the second direction as necessary.

On a c-plane free standing GaN substrate 101, the opening areas 103 are arranged in a first direction parallel to the 11–20 direction of the substrate 101 and a second direction parallel to the 1–100 direction of the substrate 101.

On a semipolar (20–21) or (20-2-1) GaN substrate 101, the opening areas 103 are arranged in a direction parallel to [−1014] and [10–14], respectively.

Alternatively, a hetero-substrate 201 can be used. When a c-plane GaN template 202 is grown on a c-plane sapphire substrate 201, the opening area 103 is in the same direction as the c-plane free-standing GaN substrate; when an in-plane GaN template 202 is grown on an in-plane sapphire substrate 201, the opening area 103 is same direction as the m-plane free-standing GaN substrate 101. By doing this, an m-plane cleaving plane can be used for dividing the bar 501 of the device 110 with the c-plane GaN template 202, and a c-plane cleaving plane can be used for dividing the bar 501 of the device 110 with the m-plane GaN template 202; which is much preferable.

III-Nitride-Based Semiconductor Layers

The ELO GaN-based layers 105, the III-nitride semiconductor device layers 106 and the island-like III-nitride-based semiconductor layers 109 can include In, Al and/or B, as well as other impurities, such as Mg, Si, Zn, O, C, H, etc.

The III-nitride-based semiconductor device layers 106 generally comprise more than two layers, including at least one layer among an n-type layer, an undoped layer and a p-type layer. The III-nitride-based semiconductor device layers 106 specifically comprise a GaN layer, an AlGaN layer, an AlGaInN layer, an InGaN layer, etc. In the case where the device has a plurality of III-nitride-based semiconductor layers, the distance between the island-like III-nitride-based semiconductor layers 109 adjacent to each other is generally 30 μm or less, and preferably 10 μm or less, but is not limited to these figures. In the semiconductor device, a number of electrodes according to the types of the semiconductor device are disposed at predetermined positions.

Merits of Epitaxial Lateral Overgrowth

The crystallinity of the island-like III-nitride-based semiconductor layers 109 grown using epitaxial lateral overgrowth (ELO) upon the growth restrict mask 102 from a striped opening are 103 of the growth restrict mask 102 is very high.

Furthermore, two advantages may be obtained using a III-nitride-based substrate 101. One advantage is that a high-quality island-like III-nitride-based semiconductor layer 109 can be obtained, such as with a very low defects density, as compared to using a sapphire substrate 201.

Another advantage in using a similar or the same material for both the epilayers 105, 106, 109 and the substrate 101, is that it can reduce strain in the epilayers 105, 106, 109, Also, thanks to a similar or the same thermal expansion, the method can reduce the amount of bending of the substrate 101 during epitaxial growth. The effect, as above, is that the production yield can be high, in order to improve the uniformity of temperature.

The use of a hetero-substrate 201, such as sapphire (m-plane, c-plane), $LiAlO_2$, SiC, Si, etc., for the growth of the epilayers 105, 106, 109 is that these substrates 201 are low-cost substrates. This is an important advantage for mass production.

When it comes to the quality of the device 110, the use of a free standing III-nitride-based substrate 101 is more preferable, due to the above reasons. On the other hand, the use of a hetero-substrate 201 makes it easy to remove the III-nitride-based semiconductor layers 105, 106, 109, due to a weaker bonding strength at the cleaving point 807.

Also, when a plurality of island-like III-nitride-based semiconductor layers 109 are grown, these layers 109 are separated from each other, that is, are formed in isolation, so tensile stress or compressive stress generated in each of the island-like III-nitride-based semiconductor layers 109 is limited within the layers 109, and the effect of the tensile stress or compressive stress does not fall upon other III-nitride-based semiconductor layers.

Also, as the growth restrict mask 102 and the ELO GaN-based layers 105 are not bonded chemically, the stress in the ELO GaN-based layers 105 can be relaxed by a slide caused at the interface between the growth restrict mask 102 and the ELO GaN-based layers 105.

Also, the existence of gaps between each the island-like III-nitride-based semiconductor layers 109, as shown by no-growth region 104 in FIG. 1(*a*), results in the substrate 101 having rows of a plurality of island-like III-nitride-based semiconductor layers 109, which provides flexibility, and the substrate 101 is easily deformed when external force is applied and can be bent.

Therefore, even if a slight warpage, curvature, or deformation occurs in the substrate 101, this can be easily corrected by a small external force, which avoids the occurrence of cracks. As a result, the handling of substrates 101 by vacuum chucking is possible, which makes the manufacturing process of the semiconductor devices 110 more easily carried out.

As explained, island-like III-nitride-based semiconductor layers 109 made of high quality semiconductor crystal can be grown by suppressing the curvature of the substrate 101, and further, even when the III-nitride-based semiconductor layers 105, 106, 109 are very thick, occurrences of cracks, etc., can be suppressed, and thereby a large area semiconductor device 110 can be easily realized.

Flat Surface Region

The flat surface region 107 is between layer bending regions 108. Furthermore, the flat surface region 107 is in the region of the growth restrict mask 102.

Fabrication of the semiconductor device 110 is mainly performed on the flat surface region 107. The width of the flat surface region 107 is preferably at least 5 μm, and more preferably is 10 μm or more. The flat surface region 107 has a high uniformity of thickness for each of the semiconductor layers 105, 106, 109 in the flat surface region 107.

Layer Bending Region

Figure 23B:
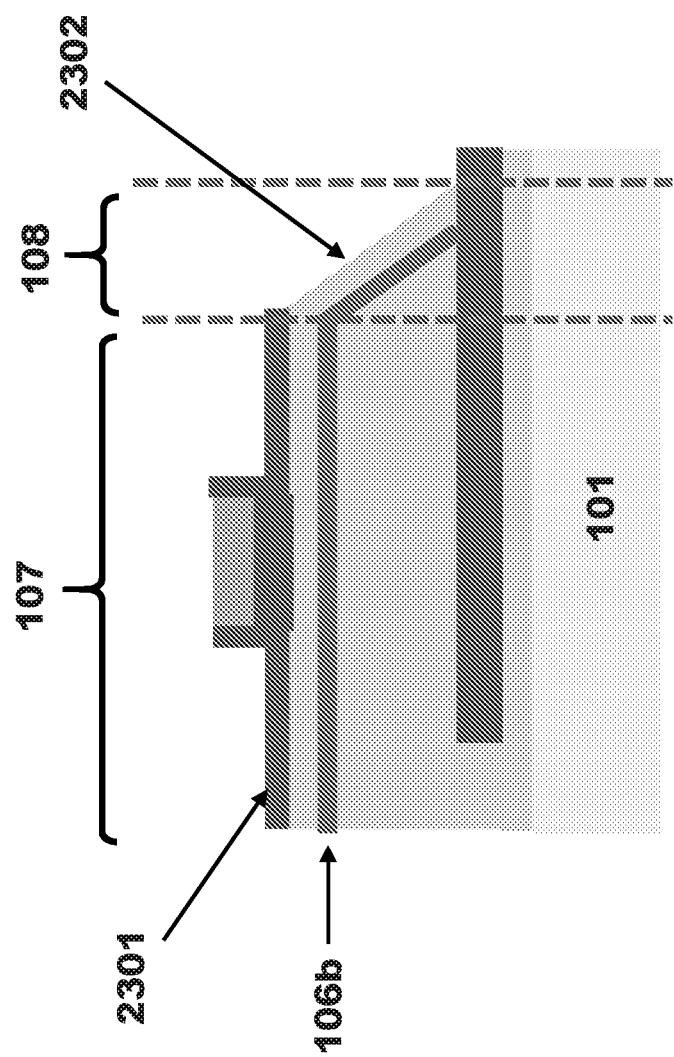

FIGS. 23(*a*) and 23(*h*) illustrate the layer bending regions 108. If a nonpolar or semipolar substrate 101 is used, there may be a first facet 2301 in the flat surface region 107, which is the main area for forming a ridge structure, and a second facet 2302, as well as a possible third facet 2303, in the layer bending region 108.

If the layer bending region 108 that includes the active layer 106*h* remains in the LED device 110, a portion of the emitted light from the active layer 106*b* is reabsorbed. As a result, it is preferable to remove at least a part of the active layer 106*b* in the layer bending region 108 by etching.

If the layer bending region 108 that includes an active layer 106*b* remains in the laser diode device 110, the laser mode may be affected by the layer bending region 108 due to a low refractive index (e.g., an InGaN layer). As a result, it is preferable to remove at least a part of the active layer 106*h* in the layer bending region 108 by etching.

Two etchings may be performed to remove the active layer 106*b*, wherein a first etching is performed to remove the active layer 106*b* in the region of the second facet 2302, before removing epi-layers 105, 106, 109 from the substrate 101, and a second etching is performed to remove the active layer 106*b* in a region of the third facet 2303, after removing the epi-layers 105, 106, 109 from the substrate 101.

The emitting region formed by the active layer 106*b* is a current injection region. In the case of a laser diode device 110, the emitting region is a ridge structure. In the case of an LED, the emitting region is the region for forming a p-contact electrode.

For both the LD and LED, the edge of the emitting region should be at least 1 μm or more from the edge of the layer bending region 108, and more preferably 5 μm.

From another point of view, an epitaxial layer of the flat surface region 107 except for the opening area 103 has a lesser defect density than an epitaxial layer of the opening area 103. Therefore, it is more preferable that the ridge stripe structure should be formed in the flat surface region 107 including on a wing region.

Semiconductor Device

The semiconductor device is, for example, a Schottky diode, a light-emitting diode, a semiconductor laser, a photodiode, a transistor, etc., but is not limited to these devices. This invention is particularly useful for micro-LEDs and laser diodes, such as edge-emitting lasers and vertical cavity surface-emitting lasers (VCSELs). This invention is especially useful for a semiconductor laser which has cleaved facets.

Polymer Film

The polymer film 801 is used in order to remove the island-like III-nitride-based semiconductor layers 109 from the III-nitride-based substrate 101 or the GaN template used with the hetero-substrate 201. In the present invention, dicing tape, including UV-sensitive dicing tape, which are commercially sold, can be used as the polymer film 801. For example, the structure of the polymer film 801 may comprise triple layers 802, 803, 804 or double layers 803, 804, as shown in in FIGS. 24(a) and 24(b), but is not limited to those examples. The base film 802 material, for example, having a thickness of about 80 μm, may be made of polyvinyl chloride (PVC), The backing film 804 material, for example, having a thickness of about 38 μm, may be made of polyethylene terephthalate (P.E.T.). The adhesive layer 803, for example, having a thickness of about 15 μm, may be made of acrylic UV-sensitive adhesive.

When the polymer film 801 is a UV-sensitive dicing tape and is exposed to UV light, the stickiness of the film 801 is drastically reduced. After removing the island-like IR-nitride-based semiconductor layers 109 from the substrate 101, the polymer film 801 is exposed by the UV light, which makes it is easy to remove.

Heat Sink Plate

As noted above, the removed bar 501 may be transferred to a heat sink plate 1505, which may be AN, SiC, Si, Cu, CuW, and the like. As shown in FIG. 15(e), the solder 1506 for bonding, which may be Au—Sn, Su—Ag—Cu, Ag paste, and the like, is disposed on the heat sink plate 1505. Then, an n-electrode 1504 or p-electrode 408 is bonded to the solder 1506, The devices 110 can also be flip-chip bonded to the heat sink plate 1505.

In the case of bonding LED devices 110 to the heat sink plate 1505, the size of the heat sink plate 1505 does not matter, and it can be designed as desired.

In the case of bonding laser diode devices 110 to the heat sink plate 1505, it is preferable that the length of the heat sink plate 1505 be the same or shorter than the length of the laser diode devices 110 for the facet 504 coating process, wherein the length of the laser diode devices 110 is almost the same as the length of the laser cavity. By doing this, it is easy to coat both facets 504 of the laser cavity. If the length of the heat sink plate 1505 is longer than laser cavity, then the heat sink plate 1505 may prevent uniform coating of the laser facets 504.

Long Width Heat Sink Plate

A long width for the heat sink plate 1505 makes the process of fabricating the laser device 110 more productive. As shown in FIG. 17, the heat sink plate 1505 is placed on a spacer plate 1701, and then both are stacked with other heat sink plates 1505 and spacer plates 1701 in the coating holder 1702 for coating a plurality of the devices 110 at the same time. Consequently, s single coating process can coat a large number of devices 110.

Heat Sink Plate with Trenches

It is preferable that the heat sink plate 1505 have trenches 1507 for dividing the devices 110 as shown in FIGS. 15(e) and 15(f), This structure is useful after the facet 504 coating process, where the heat sink plate 1505 is divided into one or more devices 110, for example, single devices 110 or an array of devices 110. After dividing the heat sink plate 1505, the devices 110 can be fabricated into packages or modules, such as lighting modules. The trenches 1507 in the heat sink plate 1505 guide the division into the devices 110. The trenches 1507 can be formed by a wet etching method and mechanically processed before the device 110 is mounted on the heat sink plate 1505. For example, if the heat sink plate 1505 is made of silicon, wet etching can be used to form the trenches 1507. Using the trenches 1507 in this manner, reduces the lead time of the process.

Heat Sink Plate with Solder

It is preferable that the length of the solder 1506 be shorter than the device 110 length on the heat sink plate 1505, as shown in FIG. 15(f). This prevents any wraparound of the solder 1506 to the facets 504, which could cause a deterioration of the device 110 characteristics. In particular, wraparound should be avoided for flip-chip mounting.

As shown in FIG. 18(b), after the coating process, the heat sink plate 1505 has wraparound areas, which are the areas surrounded by the dashed lines. The wraparound area has a width W of about 10-20 μm. The coating film will have coated these areas. It is also difficult to avoid coating the solder 1506 with the coating film. Generally, the coating film is selected from one or more dielectric materials, which is why this area does not have conductivity. This is a problem for both conductivity and adhesiveness when a wire 1802 is bonded to the solder 1506. Therefore, it is preferable that the wire 1802 be placed to avoid the wraparound area. At least, the place of wire bond 1802 should be about 25 μm away from the edge of the heat sink plate 1505.

ALTERNATIVE EMBODIMENTS

First Embodiment

A III-nitride-based semiconductor device 110 and a method for manufacturing thereof, according to a first embodiment are explained.

In the first embodiment, as shown in FIG. 1, a base substrate 101 is first provided, and a growth restrict mask 102 that has a plurality of striped opening areas 103 is formed on the substrate 101.

Figure 25A:
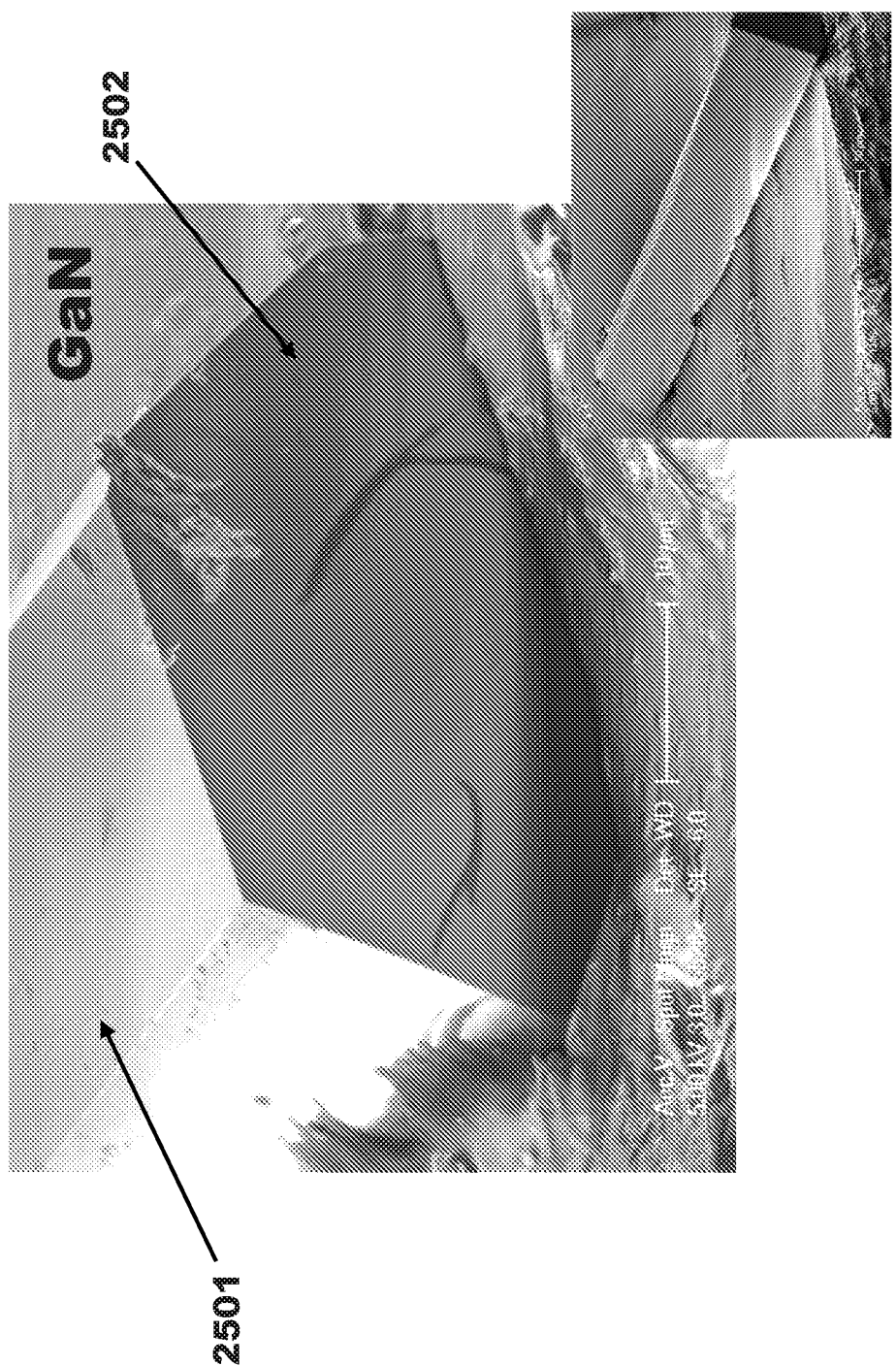
FIGS. 25(a), 25(b) and 25(c) are SEM images illustrating facets of various layers before and after cleaving.

In this embodiment, the base substrate 101 is an m-plane substrate 101 made of III-nitride-based semiconductor, which does not have a mis-cut orientation. As shown in FIG. 3(a), image (1) of FIG. 3(b), and image (1) of FIG. 3(c), the island-like III-nitride-based semiconductor layers 109 are largely uniform with a very smooth surface. Thereafter, as shown in FIGS. 25(a) and 9, the island-like III-nitride semiconductor layers 109 have been removed by using the method shown in FIGS. 8(a)-8(e).

Then, the island-like III-nitride semiconductor layers 109 are divided into devices 110 using a breaking method. FIG. 25(a) shows an m-plane (1–100) facet 2501 and a c-plane (0001) facet 2502 of the island-like III-nitride semiconductor layer 109 after cleaving, wherein the facets 2502 is atomically smooth because it has been made by cleaving.

It is believed that there are a number of reasons why these methods obtain better results. First, the island-like III-nitride-based semiconductor layers 109 are removed from the m-plane GaN substrate 101. The freestanding GaN substrate 101 has a lot of defects, such as dislocations and stacking faults. Those defects prevent the cleave direction from being straight; instead, the cleave direction was bent at the position where there is a detect.

However, in this invention, the island-like III-nitride semiconductor layers 109 are divided after removing the substrate 101. Therefore, the cleave is not affected by the substrate 101 having an in-plane distribution of fluctuations. Moreover, the island-like III-nitride semiconductor layers 109 are made by MOCVD, so they have an extremely high crystal quality. This is one reason why smooth facets are obtained.

Second, the width of the cleaving area and the height of the cleaving area are very narrow and short, Which causes a smooth facet to be easily obtained. The width is about 40-180 µm, and the height is about 10-180 µm. In the prior art, the width of the cleaving area is typically more than several centimeters, which is 100 times longer than the present invention.

The island-like semiconductor layers 109 can is processed by Steps 1-13 of the method as set forth above, in order to obtain a laser diode device 110.

Second Embodiment

Figure 25B:
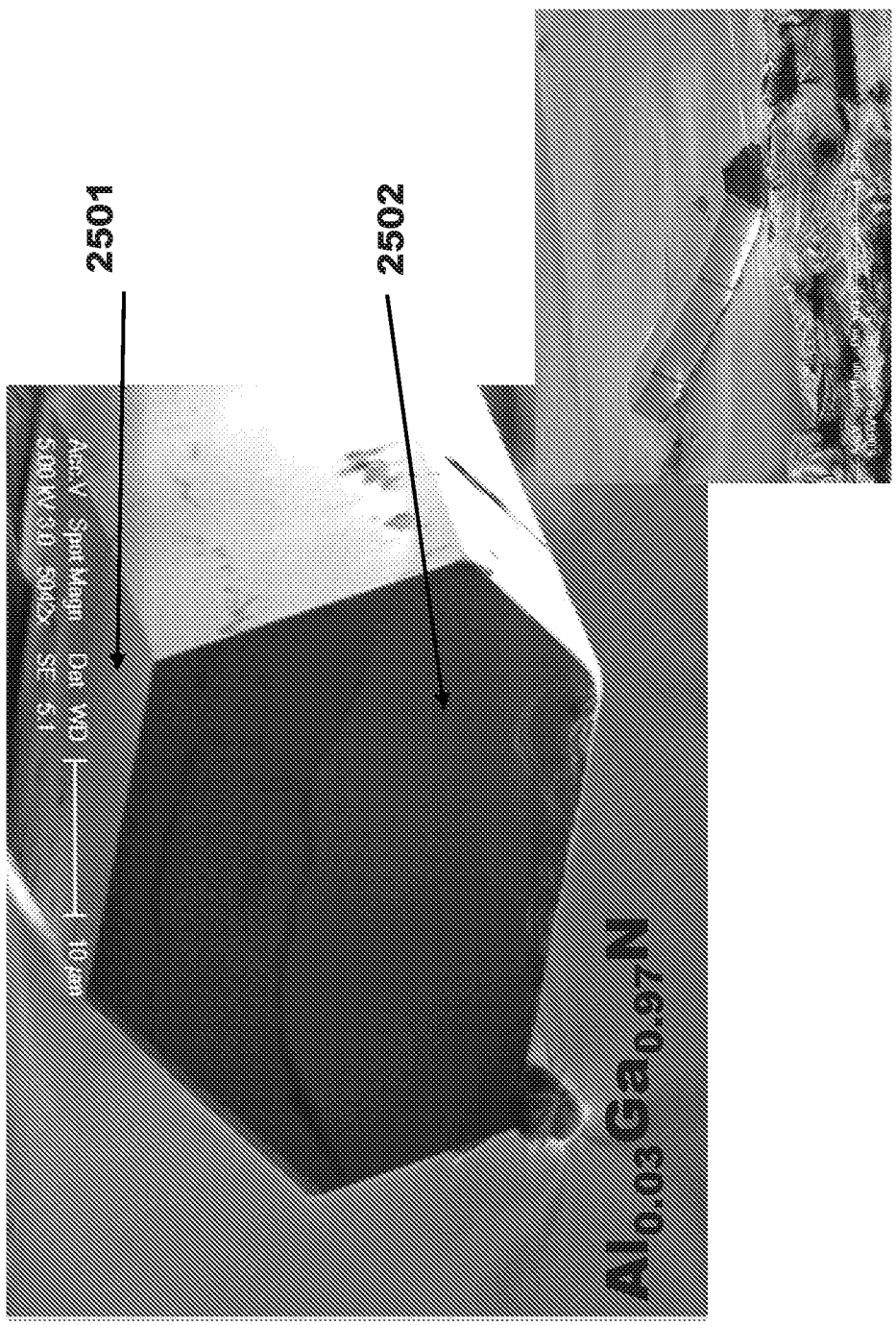

In a second embodiment, AlGaN layers are used as the island-like III-nitride-based semiconductor layers 109. The AlGaN layers may be grown as an ELO III-nitride layer 105 on various off angle substrates 101, with an Al composition set to be 0.03-0.05. As shown in FIG. 3(f), the AlGaN layers 109 can have a very smooth surface using the present invention. Using the present invention, the AlGaN layers 109 can be removed, as the island-like III-nitride-based semiconductor layers 109, from various Wangle substrates 101. As shown in FIG. 25(b), the AlGaN layers 109 provide a smooth facet 2502 to cleave the bar 501 of the device 110.

Third Embodiment

In a third embodiment, an ELO GaN-based layer 105 is grown on various off angle substrates 101. FIGS. 3(c) and 3(d) each include three SEM images with various off angles substrates 101 used with the island-like III-nitride semiconductor layers 109. The off-angle orientations range from 0 to ±15 degrees in FIG. 3(c) and 0 to −28 degrees in FIG. 3(d), from the m-plane towards the c-plane. The present invention can remove the bar 501 from various off angle substrates 101 without breaking the bars, as shown in FIG. 9, When using a semipolar substrate 101, as shown in FIGS. 5(a)-5(d), the dividing support region 502 can be utilized. This region helps the bar 501 to obtain a smooth facet 504.

Fourth Embodiment

Figure 25C:
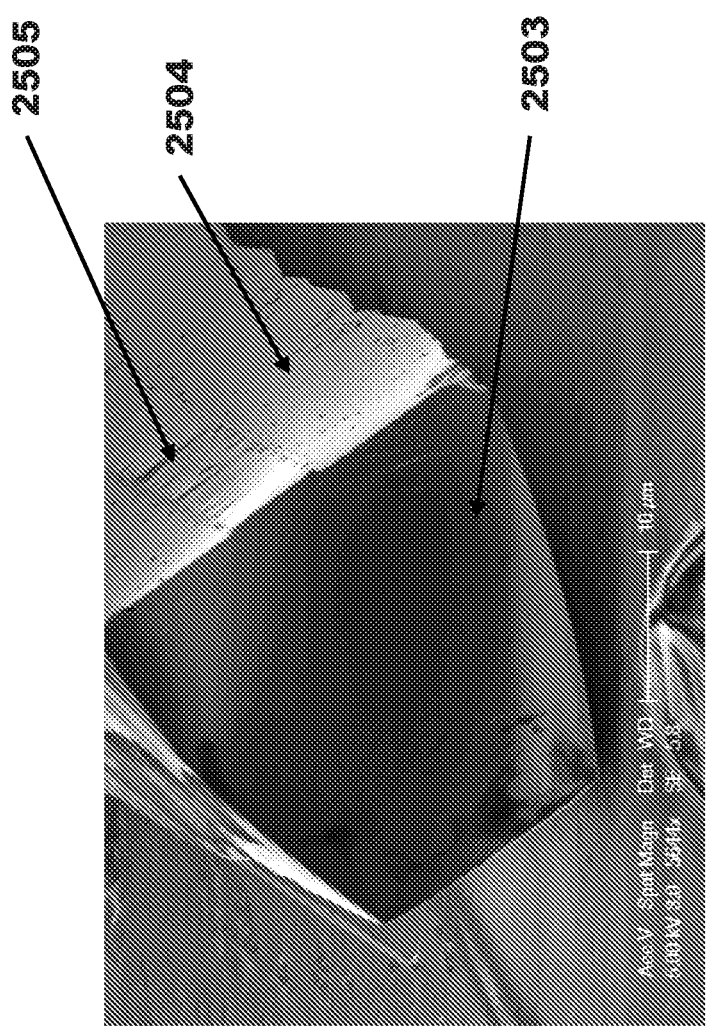

In a fourth embodiment, an ELO GaN-based layer 105 is grown on c-plane substrates 101 with two different nus-cut orientation. FIG. 3(e) shows SEM images of two different mis-cut orientation substrates 101 with island-like III-nitride-based semiconductor layers 109. As shown in FIG. 25(c), the island-like III-nitride semiconductor layers 109 have been removed using the method shown in FIGS. 8(a)-8(e).

Then, the island-like III-nitride semiconductor layers 109 are divided into devices 110 using the breaking method. FIG. 25(c) shows an m-plane facet 2503 of the island-like III-nitride semiconductor layers 109 after cleaving, as well as a backside surface 2504 and separate area 2505. The facet 2503 is atomically smooth because the facet 504 has been made by the cleaving method.

Fifth Embodiment

In a fifth embodiment, a sapphire substrate 201 is used as the hetero-substrate 201. FIG. 2 shows the structure of the island-like III-nitride-based semiconductor layers 109 on the hetero-substrate 201. This structure is almost the same as the first embodiment structure, except for using the sapphire substrate 201 and a buffer layer 202. The buffer layer 202 is generally used with III-nitride-based semiconductor layers 105, 106, 109 grown on a sapphire substrate 201. In this embodiment, the buffer layer 202 may include both the buffer layer 202, as well as an n-GaN layer or undoped GaN layer. The buffer layer 202 is grown at a low temperature of about 500-700° C. degrees. The n-GaN layer or undoped GaN layer is grown at a higher temperature of about 900-1200° C. degrees. The total thickness is about 1-3 µm. Then, the growth restrict mask 102 is disposed on the buffer layer 202 and n-GaN layer or undoped GaN layer. The rest of process to complete the device 110 is the same as the first embodiment.

On the other hand, it is not necessary to use the buffer layer 202. For example, the growth restrict mask 102 can be disposed on the hetero-substrate 201 directly. After that, the ELO GaN-based layer 105 and/or III-nitride-based semiconductor device layers 106 can be grown. In this case, the interface between the hetero-substrate 201 surface and the bottom surface of the ELO GaN-based layer 105 divides easily due to the hetero-interface, which includes a lot of defects.

Employing the present invention, an atomically smooth facet for resonance can be obtained, even using the hetero-substrate 201, because the facet 504 is formed after removing the epilayers 105, 106, 109 from the hetero-substrate 201. In this case, the type of substrate 201 does not affect the dividing support region 502. The use of the hetero substrate 201 has a large impact for mass production.

For example, the substrate 201 used can be a low cost and large size substrate 201, such as sapphire, GaAs and Si, as compared to a free standing GaN substrate 101. This results in low cost devices 110. Moreover, sapphire and GaAs substrates 201 are well known as low thermal conductivity materials, so device using these substrates 201 have thermal problems. However, using the present invention, since the device 110 is removed from the hetero-substrate 201, it can avoid these thermal problems.

Furthermore, in the case using the ELO growth method for removing the bar 501 of the device 110, this method can reduce drastically dislocation density and stacking faults density, which has become a critical issue in the case of using hetero-substrates 201.

Therefore, this invention can solve many of the problems resulting from the use of hetero-substrates 201.

Sixth Embodiment

In a sixth embodiment, the method of the fabricating the device 110 does not use the ELO growth method. As shown in FIGS. 26(a), 26(b), 26(c) and 26(d), this embodiment uses substrates 101 with growth surfaces comprising the {0001}, {11−22}, {1−100}, {20−21}, {20−2−1}, {10−11} or {10−1−1} planes, or other planes, from a bulk GaN and MN crystal.

Figure 26A:
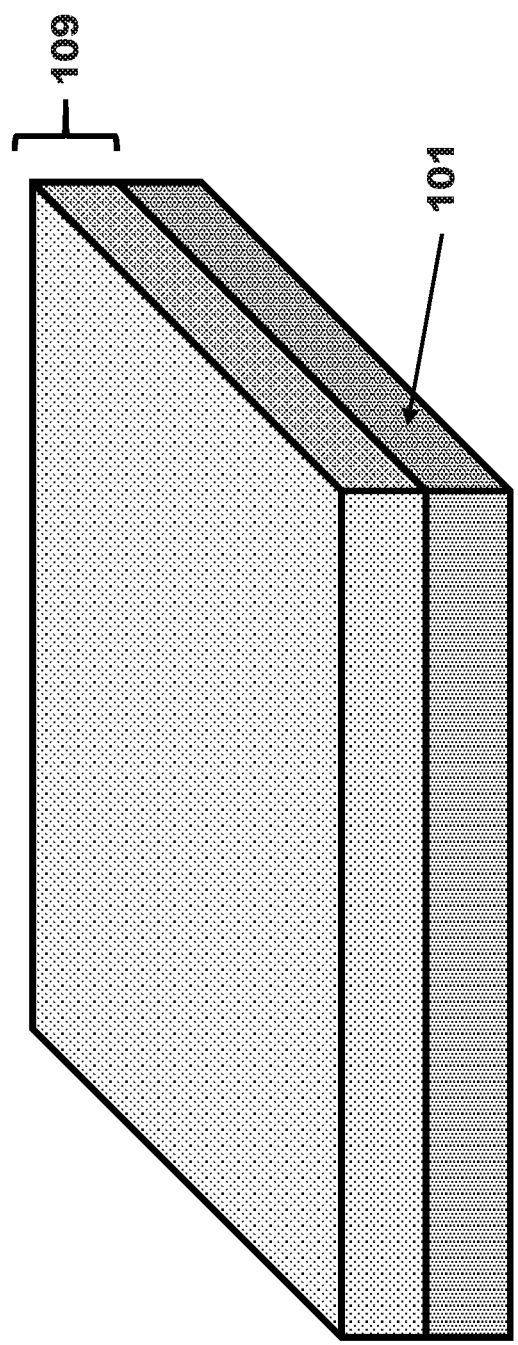
FIGS. 26(a), 26(b), 26(c) and 26(d) illustrate a method of fabricating a device that does not use an ELO growth method, according to one embodiment of the present invention.

First, as shown in FIG. 26(a), the island-like III-nitride semiconductor layers 109 are grown on the substrate 101.

Then the method of the first embodiment can be used to process the device 110, from Step 3.

Figure 26B:
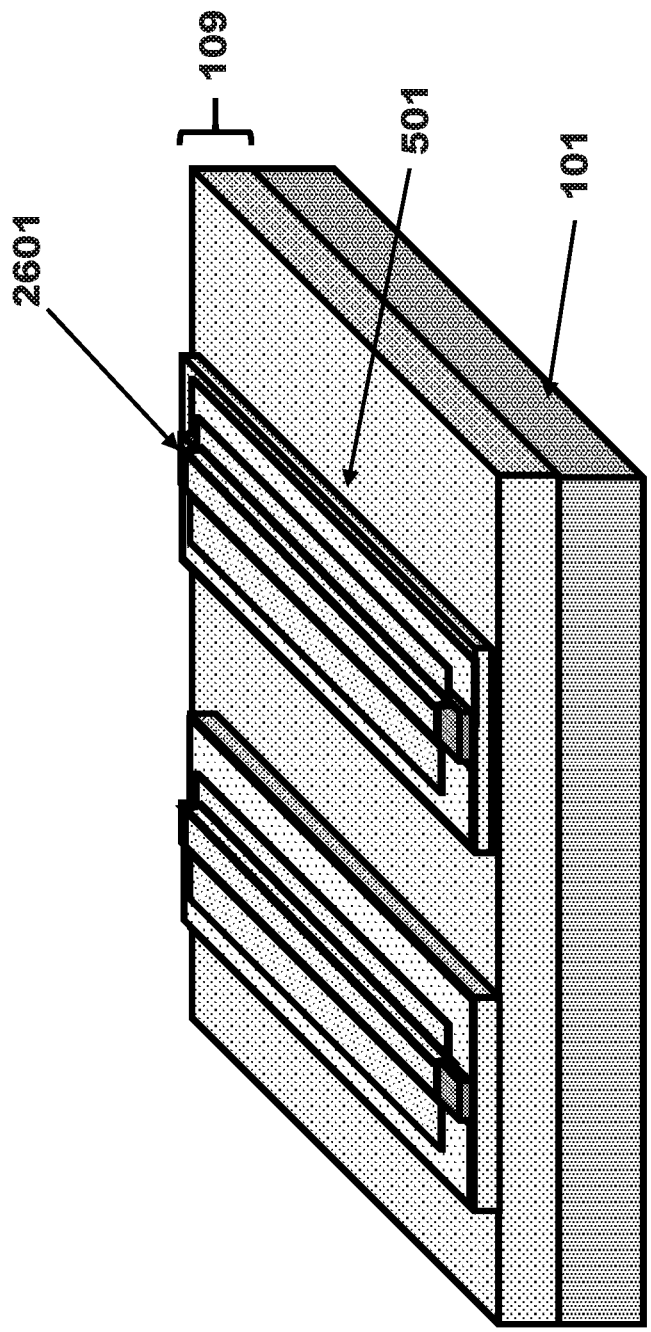

FIG. 26(b) shows how a ridge structure 2601 is disposed on the island-like III-nitride-based semiconductor layers 109 at pre-determined positions.

Figure 26C:
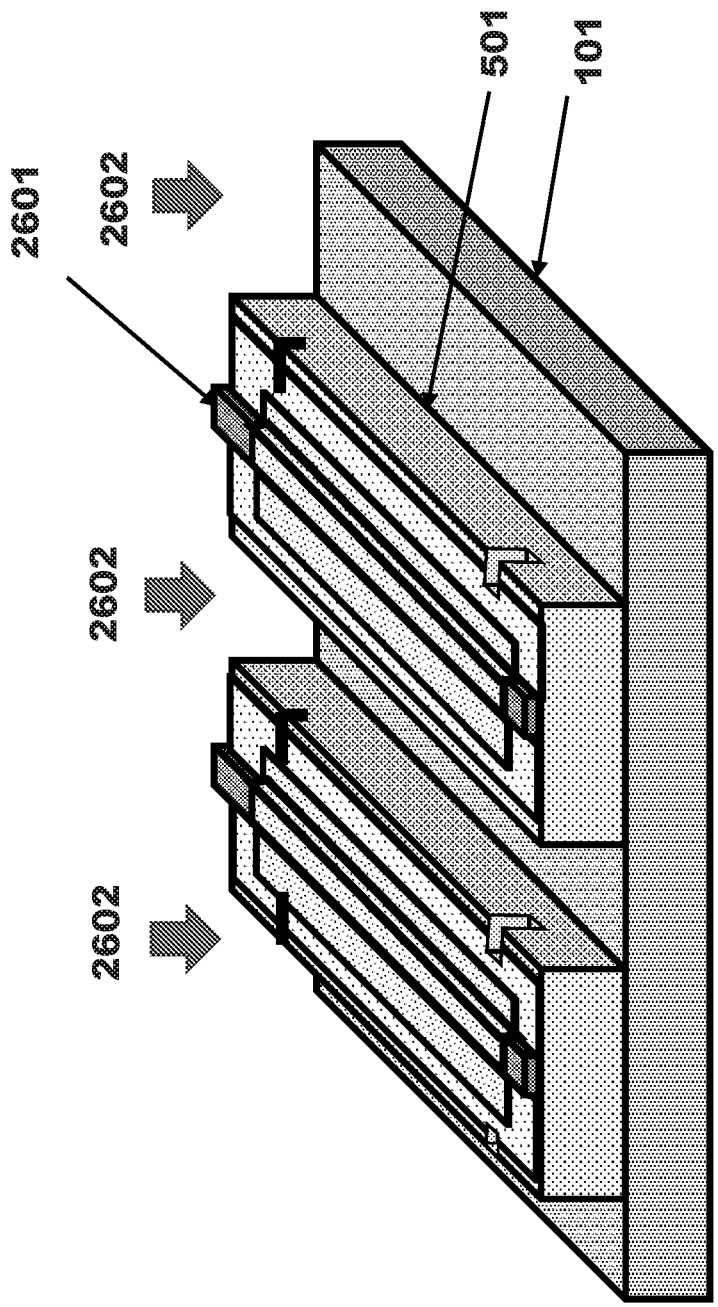
Figure 26D:
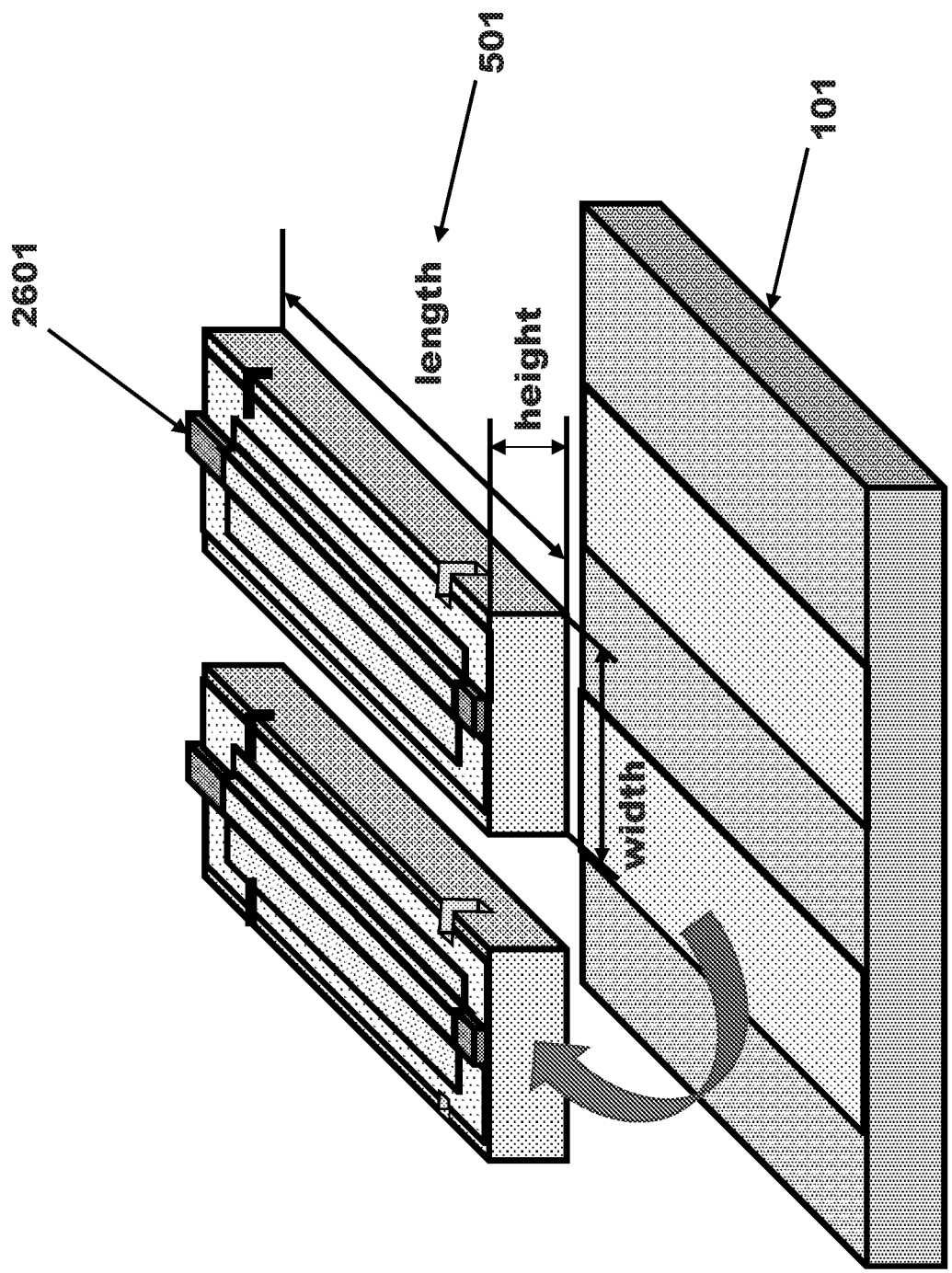

The bar 501 of the device 110 is then made using a dry etching method 2602, as shown in FIG. 26(c). At this point, the size of the bar 501 of the device 110 is set so as to be able to remove the bar 501 in Step 6. The size of the bar 501 of the device 110 is shown in FIG. 26(d), and may comprise the following, for example, the height of the bar 501 is 5 μm, length of the bar 501 is 1 mm, and the width of bar 501 is 30-50 μm. The size of the bar 501 of the device 110 can be optimized by the removing method and the device 110 size needed.

Step 5 through Step 13 are the same as the other embodiments.

Using this embodiment, the present invention can fabricate the devices 110 without the ELO method.

Moreover, this embodiment can use a hetero-substrate 201. In this case, it is preferable that the dry etching reaches below the hetero-substrate 201 surface. The interface between the hetero-substrate 201 interface and the buffer layer 202 has a weak bonding strength than other interfaces, which is why it is easy to remove the substrate 201.

Seventh Embodiment

In a seventh embodiment, an AlGaN layer can be utilized as a cleave assistance layer (CAL). It is preferable that the CAL has an Al composition over 3% and a thickness over 0.2 μm depending on the Al composition. For example, the CAL's Al composition and thickness may comprise 12% and 0.6 urn, 3% and 12 μm, etc.

There are several ways to include a CAL in the structure. One way is to include significant amount of Al into the ELO III-nitride layer 105, for example, more than 1% Al may be included while growing the ELO III-nitride layer 105. Alternatively, a CAL, may be embedded in the ELO III-nitride layer 105 or the CAL may comprise a layer 106 grown on top of the ELO III-nitride layer 105.

Figure 27A:
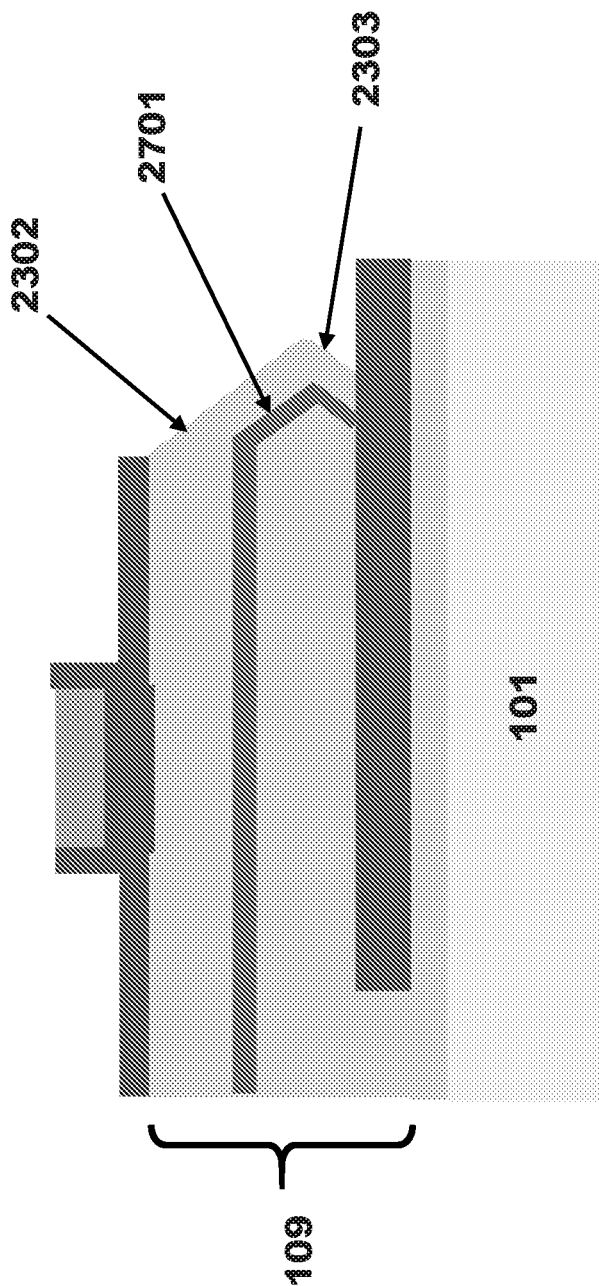
FIGS. 27(a) and 27(b) illustrate the use of a cleaving assistance layer (CAL), according to one embodiment of the present invention.
Figure 27B:
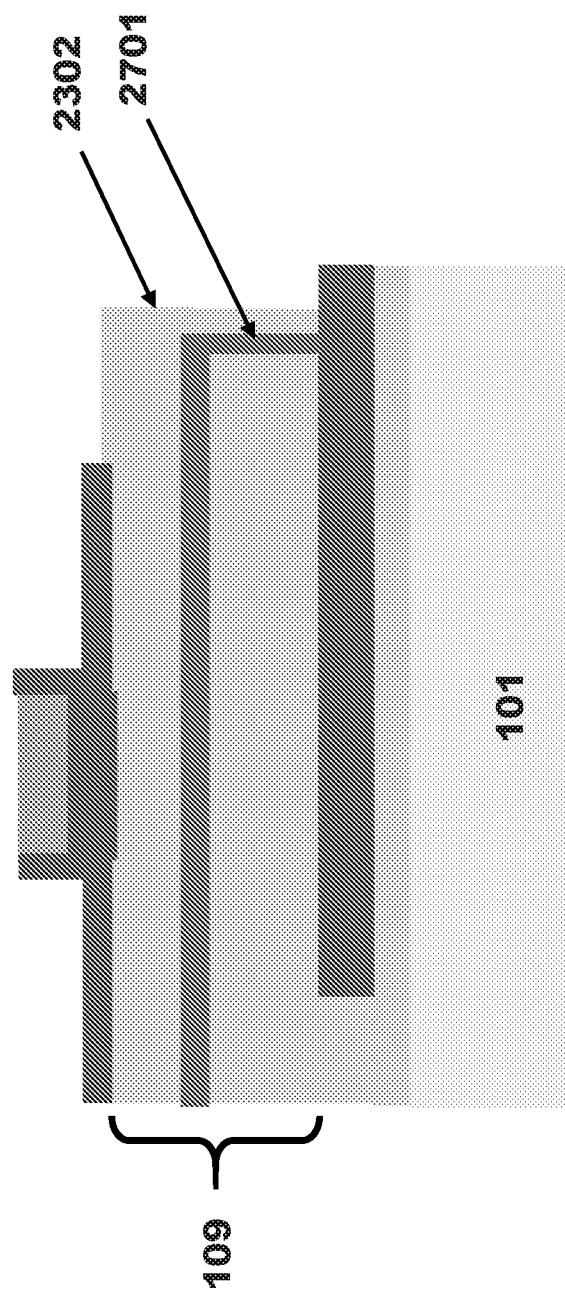

FIGS. 27(a) and 27(h) illustrate the use of the CAL 2701, which can be formed on or inside of the side facets 2302, 2303 of the island-like III-nitride-based semiconductor layers 109. Specifically, the CAL 2701 may comprise one or more of the epilayers 105, 106 that comprise the island-like ill-nitride-based semiconductor layers 109, in order to assist in cleaving.

Process Steps

Figure 28:
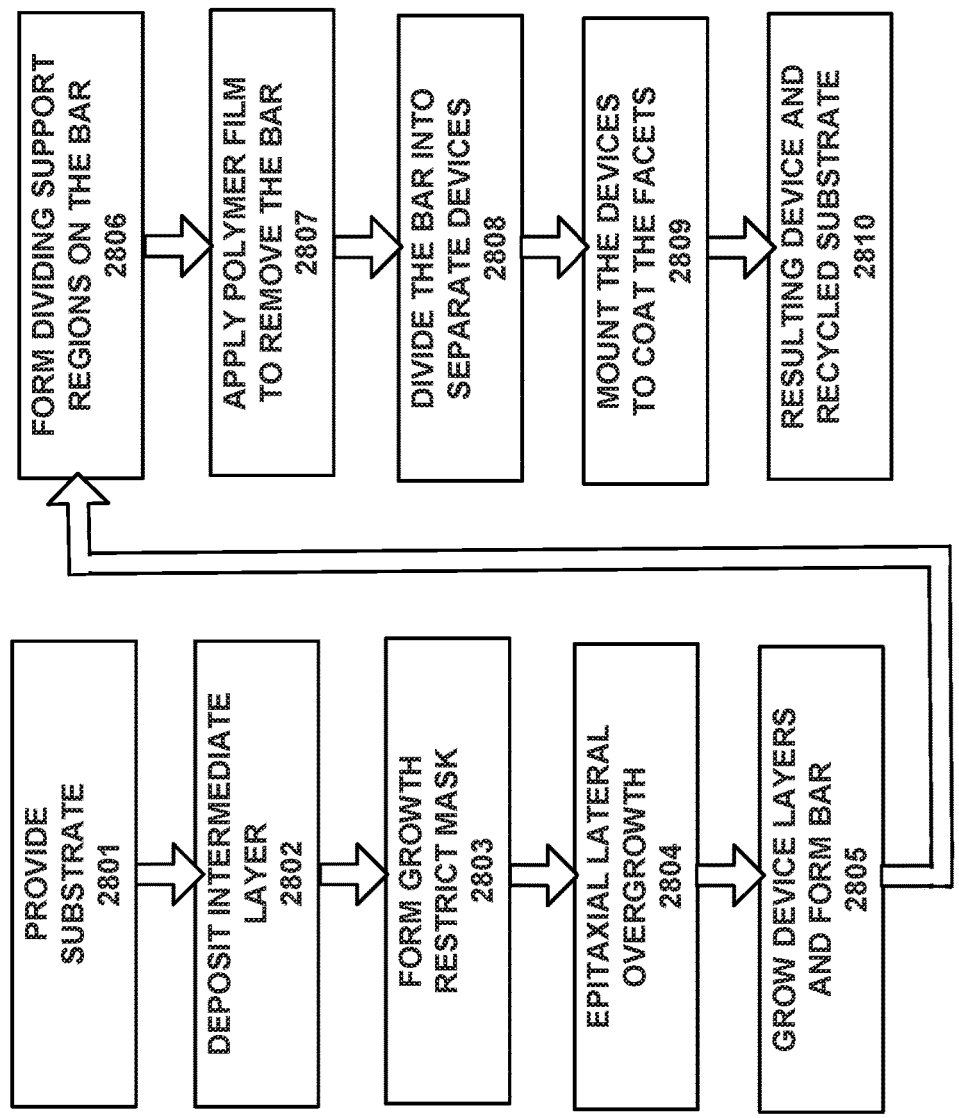
FIG. 28 is a flowchart that illustrates a method for dividing a bar of one or more devices.

FIG. 28 is a flowchart that illustrates a method for dividing a bar of one or more devices, wherein the bar is comprised of island-like III-nitride-based semiconductor layers grown on a substrate using a growth restrict mask; the island-like III-nitride-based semiconductor layers are removed from the substrate using an Epitaxial Lateral Overgrowth (ELO) method; and then the bar is divided into the one or more devices using a cleaving method.

Block 2801 represents the step of providing a base substrate 101. In one embodiment, the base substrate 101 is a III-nitride based substrate 101, such as a GaN-based substrate 101.

Block 2802 represents an optional step of depositing an intermediate layer on the substrate 101. In one embodiment, the intermediate layer is a III-nitride based layer, such as a GaN-based layer.

Block 2803 represents the step of forming a growth restrict mask 102 on or above the substrate 101, i.e., on the substrate 101 itself or on the intermediate layer. The growth restrict mask 102 is patterned to include a plurality of opening areas 103.

Block 2804 represents the step of growing one or more III-nitride based layers 105 on or above the growth restrict mask 102 using epitaxial lateral overgrowth (ELO), wherein the epitaxial lateral overgrowth of the III-nitride layers 105 extends in a direction parallel to the opening areas 103 of the growth restrict mask 102, and the epitaxial lateral overgrowth is stopped before the III-nitride layers 105 coalesce on the stripes 102a of the growth restrict mask 102. In one embodiment, the ELO III-nitride based layer 105 is an ELO GaN-based layer 105.

Block 2805 represents the step of forming a bar 501 by growing one or more additional III-nitride based semiconductor device layers 106 on the ELO III-nitride based layer 105. These additional III-nitride based semiconductor device layers 106, along with the ELO III-nitride based layer 105, create one or more of the island-like III-nitride based semiconductor layers 109.

Block 2806 represents the step of forming one or more dividing support regions 502 along the bar 501. The dividing support regions 502 may be formed on a first facet 505 and/or second facet 506 of the bar 501. In addition, the dividing support regions 502 may be formed on one side or both sides of the bar 501. The dividing support regions 502 are formed at periodic lengths, wherein each period is determined by the device's length, and each of the dividing support regions 502 comprises a scribed line. In addition, the dividing support regions 502 are created at a flat surface region 107 in a manner that avoids a current injection region 503.

Block 2807 represents the step of applying a polymer film 801 to the bar 501 to remove the bar 501 from the substrate 101 using a cleaving technique on a surface of the substrate 101, which includes mechanically separating or peeling the island-like III-nitride based semiconductor layers 109 from the substrate 101. The polymer film 801 is applied to the bar 501 by applying pressure to the film 801 and the substrate 101 using plates 806, The method may also include changing a temperature of the film 801 and the substrate 101, while the pressure is applied, thereby utilizing a difference in thermal coefficients between the film 801 and the substrate 101 for removing the bar 501 from the substrate 101.

Block 2808 represents the step of dividing the bar 501 into one or more devices 110 by cleaving at the dividing support regions 502 formed along the bar 501. This step may also include the creating of one or more facets 504 on each of the laser diode devices 110.

Block 2809 represents the step of mounting each of the devices 110 on a heat sink plate 1505 for coating one or more of the facets 504 of the devices 110 created by the cleaving. This step also includes separating the devices 110 by dividing the heat sink plate 1505 at trenches 1507 in the heat sink plate 1505. The heat sink plate 1505 may be divided before or after wire bonds 1801, 1802 are attached to the devices 110.

Block 2810 represents the resulting product of the method, namely, one or more III-nitride based semiconductor devices 110 fabricated according to this method, as well as a substrate 101 that has been removed from the devices 110 and is available for recycling and reuse.

Advantages and Benefits

The present invention provides a number of advantages and benefits:

Expensive III-nitride based substrates 101 can be reused after the substrates 101 are removed from the device 110 layers.

High quality layers 105, 106, 109 may be obtained using a substrate 101 of the same or similar materials, with a very low defect density.

Using the same or similar materials for both the substrate 101 and the layers 105, 106, 109 can reduce the strain in the layers 105, 106, 109.

Using materials with the same or similar thermal expansion for both the substrate 101 and the layers 105, 106, 109 can reduce bending of the substrate 101 during epitaxial growth.

Layers 105 grown by ELO are of high quality.

The ELO GaN-based layers 105 do not coalesce with each other, and internal strain is released, which helps to avoid any occurrences of cracks. For device layers 106 that are AlGaN layers, this is very useful, especially in the case of high Al content layers.

The island-like III-nitride based semiconductor layers 109 are formed in isolation, so tensile stress or compressive stress does not fall upon other island-like III-nitride based semiconductor layers 109.

Also, the growth restrict mask 102 and the ELO GaN-based layers 105 are not bonded chemically, so the stress in the ELO GaN-based layers 105 and additional device layers 106 can be relaxed by a slide caused at the interface between the growth restrict mask 102 and the ELO GaN-based layers 105.

The existence of the no-growth regions 104 between each of the island-like III-nitride based semiconductor layers 109 provides flexibility, and the substrate 101 is easily deformed when external force is applied and can be bent. Therefore, even if there occurs a slight warpage, curvature, or deformation in the substrate 101, this can be easily corrected by a small external force, to avoid the occurrence of cracks. As a result, the handling of the substrates 101 by vacuum chucking is possible, which makes the manufacturing process of the semiconductor devices more easily carried out.

The no-growth region 104 makes it is easy to dissolve a large area of the growth restrict mask 102.

Layers 105, 106, 109 of high quality semiconductor crystal can be grown by suppressing the curvature of the substrate 101, and further, even when the layers 105, 106, 109 are very thick, the occurrences of cracks, etc., can be suppressed, and thereby a large-area semiconductor device can be easily realized.

The fabrication method can also be easily adopted to large size wafers (>2 inches).

Modifications and Alternatives

A number of modifications and alternatives can be made without departing from the scope of the present invention.

For example, the present invention may be used with III-nitride substrates of other orientations. Specifically, the substrates may be basal nonpolar m-plane {1 0 -1 0} families; and semipolar plane families that have at least two nonzero h, i, or k Miller indices and a nonzero 1 Miller index, such as the {2 0 -2 -1} planes. Semipolar substrates of (20-2-1) are especially useful, because of the wide area of flattened ELO growth.

In another example, the present invention is described as being used to fabricate different opto-electronic device structures, such as a light-emitting diode (LED), laser diode (LD), Schottky barrier diode (SBD), or metal-oxide-semiconductor field-effect-transistor (MOSFET). The present invention may also be used to fabricate other opto-electronic devices, such as micro-LEDs, vertical cavity surface emitting lasers (VCSELs), edge-emitting laser diodes (EELDs), and solar cells.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of manufacturing a device, comprising:
preparing a bar comprising one or more III-nitride based semiconductor layers having a layer bending region on or above a substrate;
forming one or more dividing support regions at least in part of the layer bending region along the bar;
removing the bar from the substrate after forming the one or more dividing support regions; and
dividing the bar into one or more devices by cleaving at the dividing support regions formed along the bar after removing the bar from the substrate.

2. The method of claim 1, wherein the dividing support regions are formed on a first facet and/or second facet of the bar.

3. The method of claim 1, wherein the dividing support regions are formed on one side of the bar.

4. The method of claim 1, wherein the dividing support regions are formed on both sides of the bar.

5. The method of claim 1, wherein the dividing support regions are formed at periodic lengths, wherein each period is determined by the device's length.

6. The method of claim 1, wherein each of the dividing support regions comprises a scribed line.

7. The method of claim 1, wherein the dividing support regions are created at a flat surface region in a manner that avoids a current injection region.

8. The method of claim 1, wherein the film is applied to the bar by applying pressure to the film and the substrate using plates.

9. The method of claim 8, further comprising changing a temperature of the film and the substrate, while the pressure is applied.

10. The method of claim 9, further comprising utilizing a difference in thermal coefficients between the film and the substrate for removing the bar from the substrate.

11. The method of claim 1, wherein the cleaving further comprises creating one or more facets on each of the devices.

12. The method of claim 11, further comprising mounting each of the devices on a heat sink plate for coating one or more of the facets of the devices created by the cleaving.

13. The method of claim 12, further comprising separating the devices by dividing the heat sink plate at trenches in the heat sink plate.

14. The method of claim 13, wherein the heat sink plate is divided before or after wire bonds are attached to the devices.

15. A device fabricated by the method of claim 1.

16. A method of manufacturing a device, comprising:
preparing a bar comprised of a plurality of island-like III-nitride-based semiconductor layers on or above a substrate;
forming one or more dividing support regions at least in part of a layer bending region along the bar; and
removing the bar from the substrate and dividing the bar by cleaving into one or more devices at the dividing support regions.

17. The method of claim 16, further comprising forming the one or more dividing support regions before dividing the bar and cleaving into one or more devices at the dividing support regions to form facets for the devices.

18. The method of claim 17, further comprising mounting the devices on a heat sink plate before coating the facets.

19. A method of manufacturing a device, comprising:
preparing a bar comprised of island-like III-nitride-based semiconductor layers grown on or above a substrate using a growth restrict mask;
dividing the bar into one or more devices at one or more dividing support regions formed at least in part of a layer bending region of the island-like III-nitride-based semiconductor layers; and
removing the island-like III-nitride-based semiconductor layers of the devices from the substrate.

20. The method of claim 19, further comprising stopping growth of the island-like III-nitride-based semiconductor layers before they coalesce.

21. A method of manufacturing a device, comprising: growing one or more III-nitride-based semiconductor layers on or above a substrate using an epitaxial lateral overgrowth (ELO) technique, wherein the III-nitride-based semiconductor layers form one or more bars that are separated from each other on the substrate; removing the bars from the substrate without substantially including any of the substrate; and cleaving the removed bars to form one or more devices at one or more dividing support regions formed at least in part of a layer bending region of the III-nitride-based semiconductor layers wherein the one or more dividing support regions are formed along the bars before the bars are removed from the substrate.

22. The method of claim 21, wherein the dividing support regions are formed on first and/or second facets of the bar.

* * * * *